US012045951B2

(12) United States Patent
Hutchcroft et al.

(10) Patent No.: US 12,045,951 B2
(45) Date of Patent: Jul. 23, 2024

(54) AUTOMATED BUILDING INFORMATION DETERMINATION USING INTER-IMAGE ANALYSIS OF MULTIPLE BUILDING IMAGES

(71) Applicant: MFTB Holdco, Inc., Seattle, WA (US)

(72) Inventors: Will Adrian Hutchcroft, Seattle, WA (US); Yuguang Li, Seattle, WA (US); Zhiqiang Wan, Hope Valley, RI (US); Ivaylo Boyadzhiev, Seattle, WA (US)

(73) Assignee: MFTB Holdco, Inc., Seattle, WA (US)

( * ) Notice: Subject to any disclaimer, the term of this patent is extended or adjusted under 35 U.S.C. 154(b) by 405 days.

(21) Appl. No.: 17/564,054

(22) Filed: Dec. 28, 2021

(65) Prior Publication Data
US 2023/0206393 A1    Jun. 29, 2023

(51) Int. Cl.
*G06T 3/40*    (2024.01)
*G06F 30/13*    (2020.01)
(Continued)

(52) U.S. Cl.
CPC ............ *G06T 3/4038* (2013.01); *G06F 30/13* (2020.01); *G06N 3/08* (2013.01); *G06T 7/55* (2017.01); *G06T 7/73* (2017.01); *G06V 10/26* (2022.01)

(58) Field of Classification Search
CPC . G06T 3/4038; G06T 7/55; G06T 7/73; G06F 30/13; G06V 10/26; G06N 3/08
See application file for complete search history.

(56) References Cited

U.S. PATENT DOCUMENTS 5,140,352 A    8/1992  Moore et al.
6,031,540 A    2/2000  Golin et al.
(Continued)

FOREIGN PATENT DOCUMENTS

EP    2413097 A2    2/2012
EP    2505961 A2    10/2012
(Continued)

OTHER PUBLICATIONS

CubiCasa | From video to floor plan in under 5 minutes, retrieved on Mar. 26, 2019, from https://www.cubi.casa/, 6 pages.
(Continued)

*Primary Examiner* — David F Dunphy
(74) *Attorney, Agent, or Firm* — VLP Law Group LLP; James A. D. White

(57) ABSTRACT

Techniques are described for automated operations to analyze visual data from images acquired in multiple rooms of a building to generate multiple types of building information (e.g., to include a floor plan for the building), such as by using a trained neural network to jointly generate the multiple types of building information by combining visual data from pairs of the images, and for subsequently using the generated building information in one or more further automated manners, with the building information generation further performed in some cases without having or using information from any distance-measuring devices about distances from an image's acquisition location to walls or other objects in the surrounding room. The automated operations may include generating some types of building information with respect to each image pixel column, and other types of building information by combining data from both images of a pair.

22 Claims, 19 Drawing Sheets
(8 of 19 Drawing Sheet(s) Filed in Color)

(51) Int. Cl.
*G06N 3/08* (2023.01)
*G06T 3/4038* (2024.01)
*G06T 7/55* (2017.01)
*G06T 7/73* (2017.01)
*G06V 10/26* (2022.01)

(56) References Cited

U.S. PATENT DOCUMENTS

| | | |
|---|---|---|
| 6,141,034 A | 10/2000 | McCutchen |
| 6,317,166 B1 | 11/2001 | McCutchen |
| 6,320,584 B1 | 11/2001 | Golin et al. |
| 6,323,858 B1 | 11/2001 | Gilbert et al. |
| 6,337,683 B1 | 1/2002 | Gilbert et al. |
| 6,654,019 B2 | 11/2003 | Gilbert et al. |
| 6,683,608 B2 | 1/2004 | Golin et al. |
| 6,690,374 B2 | 2/2004 | Park et al. |
| 6,731,305 B1 | 5/2004 | Park et al. |
| 6,738,073 B2 | 5/2004 | Park et al. |
| 7,050,085 B1 | 5/2006 | Park et al. |
| 7,129,971 B2 | 10/2006 | McCutchen |
| 7,196,722 B2 | 3/2007 | White et al. |
| 7,525,567 B2 | 4/2009 | McCutchen |
| 7,620,909 B2 | 11/2009 | Park et al. |
| 7,627,235 B2 | 12/2009 | McCutchen et al. |
| 7,782,319 B2 | 8/2010 | Ghosh et al. |
| 7,791,638 B2 | 9/2010 | McCutchen |
| 7,909,241 B2 | 3/2011 | Stone et al. |
| 7,973,838 B2 | 7/2011 | McCutchen |
| 8,072,455 B2 | 12/2011 | Temesvari et al. |
| 8,094,182 B2 | 1/2012 | Park et al. |
| RE43,786 E | 11/2012 | Cooper |
| 8,463,020 B1 | 6/2013 | Schuckmann et al. |
| 8,517,256 B2 | 8/2013 | Stone et al. |
| 8,520,060 B2 | 8/2013 | Zomet et al. |
| 8,523,066 B2 | 9/2013 | Stone et al. |
| 8,523,067 B2 | 9/2013 | Stone et al. |
| 8,528,816 B2 | 9/2013 | Stone et al. |
| 8,540,153 B2 | 9/2013 | Stone et al. |
| 8,594,428 B2 | 11/2013 | Aharoni et al. |
| 8,654,180 B2 | 2/2014 | Zomet et al. |
| 8,666,815 B1 | 3/2014 | Chau |
| 8,699,005 B2 | 4/2014 | Likholyot |
| 8,705,892 B2 | 4/2014 | Aguilera et al. |
| RE44,924 E | 6/2014 | Cooper et al. |
| 8,854,684 B2 | 10/2014 | Zomet |
| 8,861,840 B2 | 10/2014 | Bell et al. |
| 8,861,841 B2 | 10/2014 | Bell et al. |
| 8,879,828 B2 | 11/2014 | Bell et al. |
| 8,953,871 B2 | 2/2015 | Zomet |
| 8,989,440 B2 | 3/2015 | Klusza et al. |
| 8,996,336 B2 | 3/2015 | Malka et al. |
| 9,021,947 B2 | 5/2015 | Landa |
| 9,026,947 B2 | 5/2015 | Lee et al. |
| 9,035,968 B2 | 5/2015 | Zomet |
| 9,041,796 B2 | 5/2015 | Malka et al. |
| 9,071,714 B2 | 6/2015 | Zomet |
| 9,129,438 B2 | 9/2015 | Aarts et al. |
| 9,151,608 B2 | 10/2015 | Malka et al. |
| 9,165,410 B1 | 10/2015 | Bell et al. |
| 9,171,405 B1 | 10/2015 | Bell et al. |
| 9,324,190 B2 | 4/2016 | Bell et al. |
| 9,361,717 B2 | 6/2016 | Zomet |
| 9,396,586 B2 | 7/2016 | Bell et al. |
| 9,438,759 B2 | 9/2016 | Zomet |
| 9,438,775 B2 | 9/2016 | Powers et al. |
| 9,489,775 B1 | 11/2016 | Bell et al. |
| 9,495,783 B1 | 11/2016 | Samarasekera et al. |
| 9,576,401 B2 | 2/2017 | Zomet |
| 9,619,933 B2 | 4/2017 | Spinella-Marno et al. |
| 9,635,252 B2 | 4/2017 | Accardo et al. |
| 9,641,702 B2 | 5/2017 | Bin-Nun et al. |
| 9,760,994 B1 | 9/2017 | Bell et al. |
| 9,786,097 B2 | 10/2017 | Bell et al. |
| 9,787,904 B2 | 10/2017 | Birkler et al. |
| 9,836,885 B1 | 12/2017 | Eraker et al. |
| 9,852,351 B2 | 12/2017 | Aguilera Perez et al. |
| 9,953,111 B2 | 4/2018 | Bell et al. |
| 9,953,430 B1 | 4/2018 | Zakhor |
| 9,990,760 B2 | 6/2018 | Aguilera Perez et al. |
| 9,990,767 B1 | 6/2018 | Sheffield et al. |
| 10,026,224 B2 | 7/2018 | Bell et al. |
| 10,030,979 B2 | 7/2018 | Bjorke et al. |
| 10,055,876 B2 | 8/2018 | Ford et al. |
| 10,068,344 B2 | 9/2018 | Jovanovic et al. |
| 10,083,522 B2 | 9/2018 | Jovanovic et al. |
| 10,102,639 B2 | 10/2018 | Bell et al. |
| 10,102,673 B2 | 10/2018 | Eraker et al. |
| 10,120,397 B1 | 11/2018 | Zakhor et al. |
| 10,122,997 B1 | 11/2018 | Sheffield et al. |
| 10,127,718 B2 | 11/2018 | Zakhor et al. |
| 10,127,722 B2 | 11/2018 | Shakib et al. |
| 10,139,985 B2 | 11/2018 | Mildrew et al. |
| 10,163,261 B2 | 12/2018 | Bell et al. |
| 10,163,271 B1 | 12/2018 | Powers et al. |
| 10,181,215 B2 | 1/2019 | Sedeffow |
| 10,192,115 B1 | 1/2019 | Sheffield et al. |
| 10,204,185 B2 | 2/2019 | Mrowca et al. |
| 10,210,285 B2 | 2/2019 | Wong et al. |
| 10,235,797 B1 | 3/2019 | Sheffield et al. |
| 10,242,400 B1 | 3/2019 | Eraker et al. |
| 10,339,716 B1 | 7/2019 | Powers et al. |
| 10,366,531 B2 | 7/2019 | Sheffield |
| 10,375,306 B2 | 8/2019 | Shan et al. |
| 10,395,435 B2 | 8/2019 | Powers et al. |
| 10,530,997 B2 | 1/2020 | Shan et al. |
| 10,643,386 B2 | 5/2020 | Li et al. |
| 10,708,507 B1 | 7/2020 | Dawson et al. |
| 10,809,066 B2 | 10/2020 | Colburn et al. |
| 10,825,247 B1 | 11/2020 | Vincent et al. |
| 10,834,317 B2 | 11/2020 | Shan et al. |
| 11,057,561 B2 | 7/2021 | Shan et al. |
| 11,164,361 B2 | 11/2021 | Moulon et al. |
| 11,164,368 B2 | 11/2021 | Vincent et al. |
| 11,165,959 B2 | 11/2021 | Shan et al. |
| 11,217,019 B2 | 1/2022 | Li et al. |
| 11,238,652 B2 | 2/2022 | Impas et al. |
| 11,243,656 B2 | 2/2022 | Li et al. |
| 11,252,329 B1 | 2/2022 | Cier et al. |
| 11,284,006 B2 | 3/2022 | Dawson et al. |
| 11,405,549 B2 | 8/2022 | Cier et al. |
| 11,405,558 B2 | 8/2022 | Dawson et al. |
| 11,408,738 B2 | 8/2022 | Colburn et al. |
| 11,480,433 B2 | 10/2022 | Colburn et al. |
| 11,481,925 B1 | 10/2022 | Li et al. |
| 11,494,973 B2 | 11/2022 | Boyadzhiev et al. |
| 11,501,492 B1 | 11/2022 | Li et al. |
| 11,514,674 B2 | 11/2022 | Moulon et al. |
| 11,592,969 B2 | 2/2023 | Li et al. |
| 2006/0256109 A1 | 11/2006 | Acker et al. |
| 2010/0232709 A1 | 9/2010 | Zhang et al. |
| 2012/0075414 A1 | 3/2012 | Park et al. |
| 2012/0293613 A1 | 11/2012 | Powers et al. |
| 2013/0050407 A1 | 2/2013 | Brinda et al. |
| 2013/0342533 A1 | 12/2013 | Bell et al. |
| 2014/0043436 A1 | 2/2014 | Bell et al. |
| 2014/0044343 A1 | 2/2014 | Bell et al. |
| 2014/0044344 A1 | 2/2014 | Bell et al. |
| 2014/0125658 A1 | 5/2014 | Bell et al. |
| 2014/0125767 A1 | 5/2014 | Bell et al. |
| 2014/0125768 A1 | 5/2014 | Bell et al. |
| 2014/0125769 A1 | 5/2014 | Bell et al. |
| 2014/0125770 A1 | 5/2014 | Bell et al. |
| 2014/0236482 A1 | 8/2014 | Dorum et al. |
| 2014/0267631 A1 | 9/2014 | Powers et al. |
| 2014/0307100 A1 | 10/2014 | Myllykoski et al. |
| 2014/0320674 A1 | 10/2014 | Kuang |
| 2015/0116691 A1 | 4/2015 | Likholyot |
| 2015/0189165 A1 | 7/2015 | Milosevski et al. |
| 2015/0262421 A1 | 9/2015 | Bell et al. |
| 2015/0269785 A1 | 9/2015 | Bell et al. |
| 2015/0302636 A1 | 10/2015 | Arnoldus et al. |
| 2015/0310596 A1 | 10/2015 | Sheridan et al. |
| 2015/0332464 A1 | 11/2015 | O'Keefe et al. |
| 2016/0055268 A1 | 2/2016 | Bell et al. |

(56) References Cited

U.S. PATENT DOCUMENTS

| | | |
|---|---|---|
| 2016/0134860 A1 | 5/2016 | Jovanovic et al. |
| 2016/0140676 A1 | 5/2016 | Fritze et al. |
| 2016/0217225 A1 | 7/2016 | Bell et al. |
| 2016/0260250 A1 | 9/2016 | Jovanovic et al. |
| 2016/0286119 A1 | 9/2016 | Rondinelli |
| 2016/0300385 A1 | 10/2016 | Bell et al. |
| 2016/0353018 A1* | 12/2016 | Anderson ............. G06T 3/4038 |
| 2017/0034430 A1 | 2/2017 | Fu et al. |
| 2017/0067739 A1 | 3/2017 | Siercks et al. |
| 2017/0194768 A1 | 7/2017 | Powers et al. |
| 2017/0195654 A1 | 7/2017 | Powers et al. |
| 2017/0263050 A1 | 9/2017 | Ha et al. |
| 2017/0324941 A1 | 11/2017 | Birkler |
| 2017/0330273 A1 | 11/2017 | Holt et al. |
| 2017/0337737 A1 | 11/2017 | Edwards et al. |
| 2018/0007340 A1 | 1/2018 | Stachowski |
| 2018/0025536 A1 | 1/2018 | Bell et al. |
| 2018/0075168 A1 | 3/2018 | Tiwari et al. |
| 2018/0139431 A1 | 5/2018 | Simek et al. |
| 2018/0143023 A1 | 5/2018 | Bjorke et al. |
| 2018/0143756 A1 | 5/2018 | Mildrew et al. |
| 2018/0144487 A1 | 5/2018 | Bell et al. |
| 2018/0144535 A1 | 5/2018 | Ford et al. |
| 2018/0144547 A1 | 5/2018 | Shakib et al. |
| 2018/0144555 A1 | 5/2018 | Ford et al. |
| 2018/0146121 A1 | 5/2018 | Hensler et al. |
| 2018/0146193 A1 | 5/2018 | Safreed et al. |
| 2018/0146212 A1 | 5/2018 | Hensler et al. |
| 2018/0165871 A1 | 6/2018 | Mrowca |
| 2018/0203955 A1 | 7/2018 | Bell et al. |
| 2018/0241985 A1 | 8/2018 | O'Keefe et al. |
| 2018/0293793 A1 | 10/2018 | Bell et al. |
| 2018/0300936 A1 | 10/2018 | Ford et al. |
| 2018/0306588 A1 | 10/2018 | Bjorke et al. |
| 2018/0348854 A1 | 12/2018 | Powers et al. |
| 2018/0365496 A1 | 12/2018 | Hovden et al. |
| 2019/0012833 A1 | 1/2019 | Eraker et al. |
| 2019/0026956 A1 | 1/2019 | Gausebeck et al. |
| 2019/0026957 A1 | 1/2019 | Gausebeck |
| 2019/0026958 A1 | 1/2019 | Gausebeck et al. |
| 2019/0035165 A1 | 1/2019 | Gausebeck |
| 2019/0041972 A1 | 2/2019 | Bae |
| 2019/0050137 A1 | 2/2019 | Mildrew et al. |
| 2019/0051050 A1 | 2/2019 | Bell et al. |
| 2019/0051054 A1 | 2/2019 | Jovanovic et al. |
| 2019/0087067 A1 | 3/2019 | Hovden et al. |
| 2019/0122422 A1 | 4/2019 | Sheffield et al. |
| 2019/0164335 A1 | 5/2019 | Sheffield et al. |
| 2019/0180104 A1 | 6/2019 | Sheffield et al. |
| 2019/0251645 A1 | 8/2019 | Winans |
| 2019/0287164 A1 | 9/2019 | Eraker et al. |
| 2020/0336675 A1 | 10/2020 | Dawson et al. |
| 2020/0389602 A1* | 12/2020 | Dawson ................. H04N 23/64 |
| 2020/0408532 A1 | 12/2020 | Colburn et al. |
| 2021/0044760 A1 | 2/2021 | Dawson et al. |
| 2021/0183080 A1 | 6/2021 | Hoiem et al. |
| 2021/0279957 A1 | 9/2021 | Eder et al. |
| 2021/0377442 A1 | 12/2021 | Boyadzhiev et al. |
| 2021/0385378 A1 | 12/2021 | Cier et al. |
| 2022/0003555 A1 | 1/2022 | Colburn et al. |
| 2022/0028156 A1 | 1/2022 | Boyadzhiev et al. |
| 2022/0028159 A1 | 1/2022 | Vincent et al. |
| 2022/0076019 A1 | 3/2022 | Moulon et al. |
| 2022/0092227 A1 | 3/2022 | Yin et al. |
| 2022/0114291 A1 | 4/2022 | Li et al. |
| 2022/0164493 A1 | 5/2022 | Li et al. |
| 2022/0189122 A1 | 6/2022 | Li et al. |

FOREIGN PATENT DOCUMENTS

| | | |
|---|---|---|
| EP | 2506170 A2 | 10/2012 |
| KR | 101770648 B1 | 8/2017 |
| KR | 101930796 B1 | 12/2018 |
| WO | 2005091894 A2 | 10/2005 |
| WO | 2016154306 A1 | 9/2016 |
| WO | 2018204279 A1 | 11/2018 |
| WO | WO 2019/014620 * | 1/2019 ............. G06F 17/50 |
| WO | 2019083832 A1 | 5/2019 |
| WO | 2019104049 A1 | 5/2019 |
| WO | 2019118599 A2 | 6/2019 |

OTHER PUBLICATIONS

CubiCasa FAQ & Manual, retrieved on Mar. 26, 2019, from https://www.cubi.casa/faq/, 5 pages.

Cupix Home, retrieved on Mar. 26, 2019, from https://www.cupix.com/, 1 page.

Cupix—FAQ, retrieved on Mar. 26, 2019, from https://www.cupix.com/faq.html, 3 pages.

IGUIDE: 3D Virtual Tours, retrieved on Mar. 26, 2019, from https://goiguide.com/, 6 pages.

immoviewer.com | Automated Video Creation & Simple Affordable 3D 360 Tours, retrieved on Mar. 26, 2019, from https://www.immoviewer.com/, 5 pages.

MagicPlan | #1 Floor Plan App, Construction & Surveying Samples, retrieved on Mar. 26, 2019, from https://www.magicplan.app/, 9 pages.

EyeSpy360 Virtual Tours | Virtual Tour with any 360 camera, retrieved on Mar. 27, 2019, from https://www.eyespy360.com/en-us/, 15 pages.

Indoor Reality, retrieved on Mar. 27, 2019, from https://www.indoorreality.com/, 9 pages.

InsideMaps, retrieved on Mar. 27, 2019, from https://www.insidemaps.com/, 7 pages.

IStaging | Augmented & Virtual Reality Platform for Business, retrieved on Mar. 27, 2019, from https://www.istaging.com/en/, 7 pages.

Metareal, retrieved on Mar. 27, 2019, from https://www.metareal.com/, 4 pages.

PLNAR—The AR 3D Measuring / Modeling Platform, retrieved on Mar. 27, 2019, from https://www.plnar.co, 6 pages.

YouVR Global, retrieved on Mar. 27, 2019, from https://global.youvr.io/, 9 pages.

GeoCV, retrieved on Mar. 28, 2019, from https://geocv.com/, 4 pages.

Biersdorfer, J.D., "How to Make a 3-D Model of Your Home Renovation Vision," in The New York Times, Feb. 13, 2019, retrieved Mar. 28, 2019, 6 pages.

Chen et al. "Rise of the indoor crowd: Reconstruction of building interior view via mobile crowdsourcing." In: Proceedings of the 13th ACM Conference on Embedded Networked Sensor Systems. Nov. 4, 2015, 13 pages.

Immersive 3D for the Real World, retrieved from https://matterport.com/, on Mar. 27, 2017, 5 pages.

Learn About Our Complete 3D System, retrieved from https://matterport.com/how-it-works/, on Mar. 27, 2017, 6 pages.

Surefield FAQ, retrieved from https://surefield.com/faq, on Mar. 27, 2017, 1 page.

Why Surefield, retrieved from https://surefield.com/why-surefield, on Mar. 27, 2017, 7 pages.

Schneider, V., "Create immersive photo experiences with Google Photo Sphere," retrieved from http://geojournalism.org/2015/02/create-immersive-photo-experiences-with-google-photo-sphere/, on Mar. 27, 2017, 7 pages.

Tango (platform), Wikipedia, retrieved from https://en.wikipedia.org/wiki/Tango_(platform), on Jun. 12, 2018, 5 pages.

Zou et al. "LayoutNet: Reconstructing the 3D Room Layout from a Single RGB Image" in arXiv:1803.08999, submitted Mar. 23, 2018, 9 pages.

Lee et al. "RoomNet: End-to-End Room Layout Estimation" in arXiv:1703.00241v2, submitted Aug. 7, 2017, 10 pages.

Time-of-flight camera, Wikipedia, retrieved from https://en.wikipedia.org/wiki/Time-of-flight_camera, on Aug. 30, 2018, 8 pages.

Magicplan—Android Apps on Go . . . , retrieved from https://play.google.com/store/apps/details?id=com.sensopia.magicplan, on Feb. 21, 2018, 5 pages.

(56) References Cited

OTHER PUBLICATIONS

Pintore et al., "AtlantaNet: Inferring the 3D Indoor Layout from a Single 360 Image beyond the Manhattan World Assumption", ECCV 2020, 16 pages.
Cowles, Jeremy, "Differentiable Rendering", Aug. 19, 2018, accessed Dec. 7, 2020 at https://towardsdatascience.com/differentiable-rendering-d00a4b0f14be, 3 pages.
Yang et al., "DuLa-Net: A Dual-Projection Network for Estimating Room Layouts from a Single RGB Panorama", in arXiv:1811.11977[cs.v2], submitted Apr. 2, 2019, 14 pages.
Sun et al., "HoHoNet: 360 Indoor Holistic Understanding with Latent Horizontal Features", in arXiv:2011.11498[cs.v2], submitted Nov. 24, 2020, 15 pages.
Nguyen-Phuoc et al., "RenderNet: A deep convolutional network for differentiable rendering from 3D shapes", in arXiv:1806.06575[cs.v3], submitted Apr. 1, 2019, 17 pages.
Convolutional neural network, Wikipedia, retrieved from https://en.wikipedia.org/wiki/Convolutional_neural_network, on Dec. 7, 2020, 25 pages.
Hamilton et al., "Inductive Representation Learning on Large Graphs", in 31st Conference on Neural Information Processing Systems (NIPS 2017), 2017, 19 pages.
Kipf et al., "Variational Graph Auto-Encoders", in arXiv:1611.07308v1 [stat.ML], submitted Nov. 21, 2016, 3 pages.
Cao et al., "MolGAN: An Implicit Generative Model for Small Molecular Graphs", in arXiv:1805.11973v1 [stat.ML], submitted May 30, 2018, 11 pages.
Chen et al., "Intelligent Home 3D: Automatic 3D-House Design from Linguistic Descriptions Only", in arXiv:2003.00397v1 [cs.CV], submitted Mar. 1, 2020, 14 pages.
Cucurull et al., "Context-Aware Visual Compatibility Prediction", in arXiv:1902.03646v2 [cs.CV], submitted Feb. 12, 2019, 10 pages.
Fan et al., "Labeled Graph Generative Adversarial Networks", in arXiv:1906.03220v1 [cs.LG], submitted Jun. 7, 2019, 14 pages.
Gong et al., "Exploiting Edge Features in Graph Neural Networks", in arXiv:1809.02709v2 [cs.LG], submitted Jan. 28, 2019, 10 pages.
Genghis Goodman, "A Machine Learning Approach to Artificial Floorplan Generation", University of Kentucky Theses and Dissertations-Computer Science, 2019, accessible at https://uknowledge.uky.edu/cs_etds/89, 40 pages.
Grover et al., "node2vec: Scalable Feature Learning for Networks", in arXiv:1607.00653v1 [cs.SI], submitted Jul. 3, 2016, 10 pages.
Nauata et al., "House-GAN: Relational Generative Adversarial Networks for Graph-constrained House Layout Generation", in arXiv:2003.06988v1 [cs.CV], submitted Mar. 16, 2020, 17 pages.
Kang et al., "A Review of Techniques for 3D Reconstruction of Indoor Environments", in ISPRS International Journal of Geo-Information 2020, May 19, 2020, 31 pages.
Kipf et al., "Semi-Supervised Classification With Graph Convolutional Networks", in arXiv:1609.02907v4 [cs.LG], submitted Feb. 22, 2017, 14 pages.
Li et al., "Graph Matching Networks for Learning the Similarity of Graph Structured Objects", in Proceedings of the 36th International Conference on Machine Learning (PMLR 97), 2019, 18 pages.
Liu et al., "Hyperbolic Graph Neural Networks", in 33rd Conference on Neural Information Processing Systems (NeurIPS 2019), 2019, 12 pages.
Merrell et al., "Computer-Generated Residential Building Layouts", in ACM Transactions on Graphics, Dec. 2010, 13 pages.

\* cited by examiner

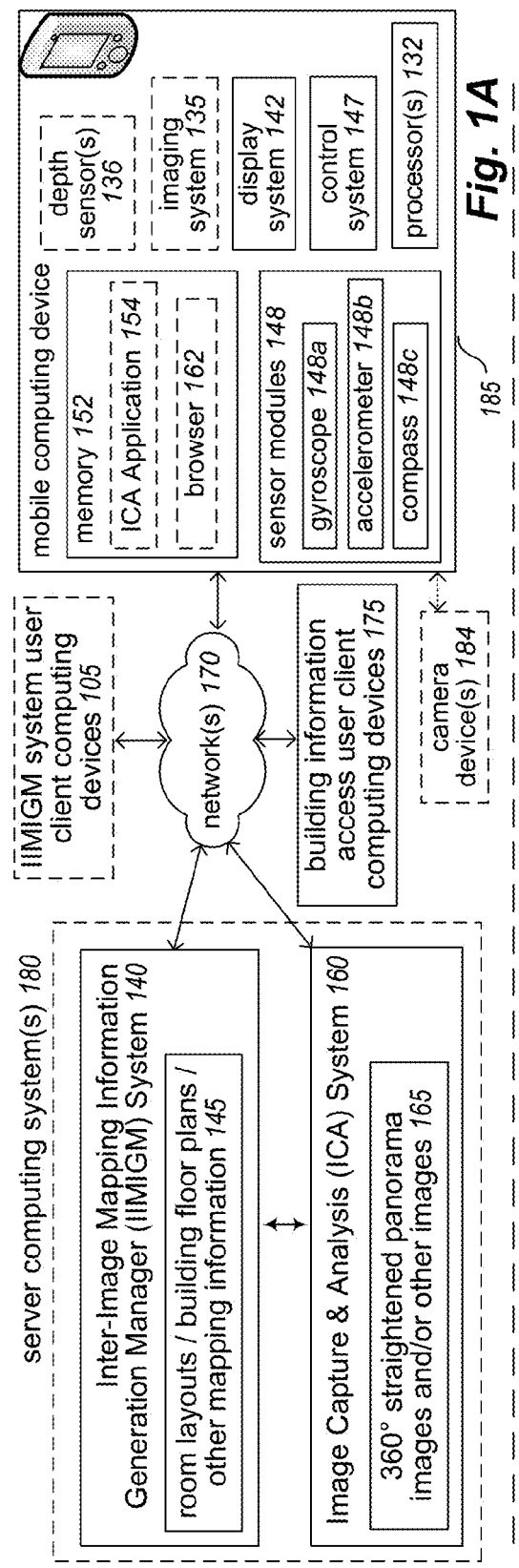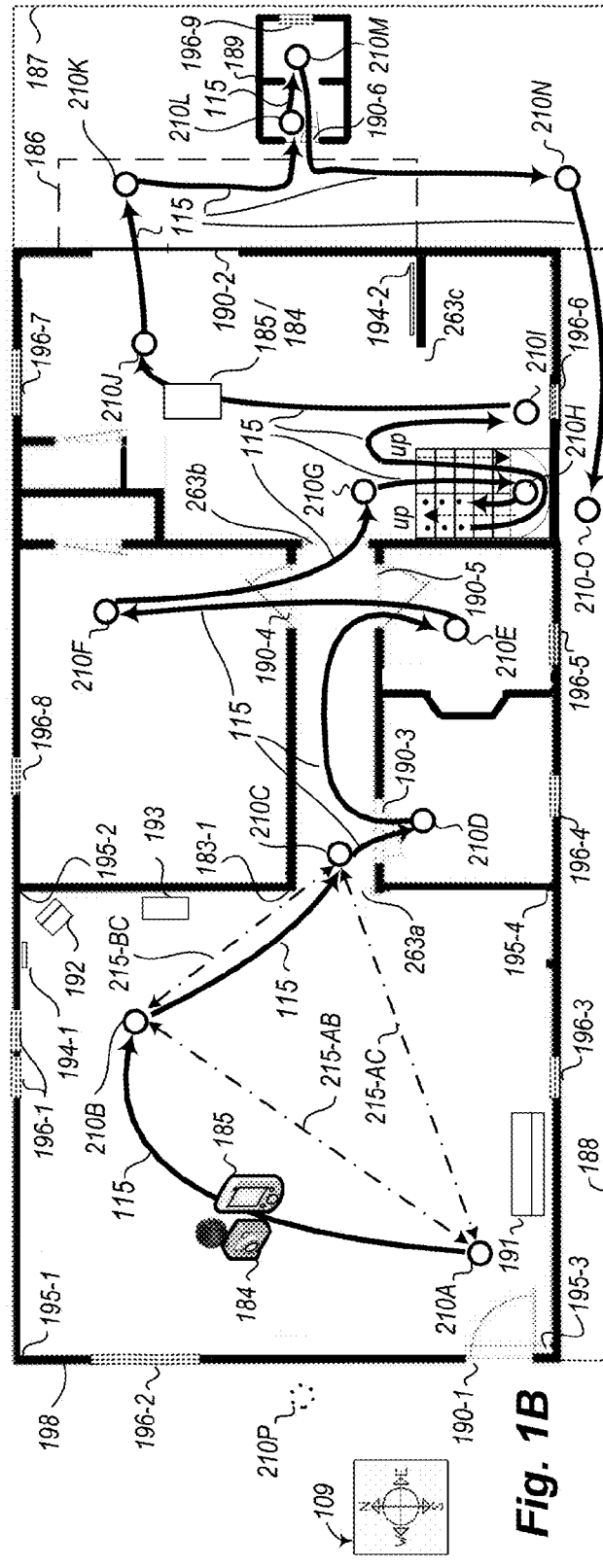
Fig. 1A
Fig. 1B

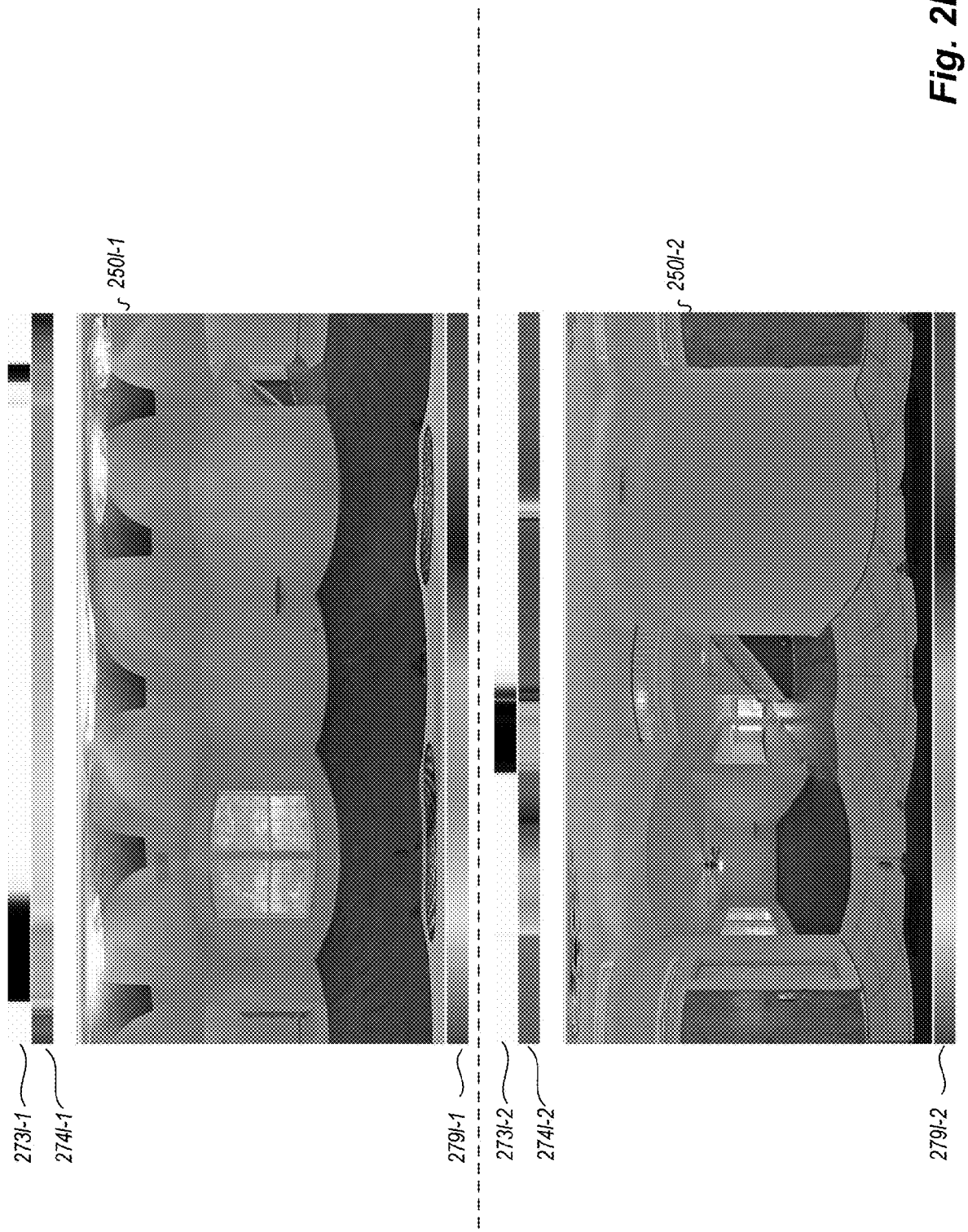

AUTOMATED BUILDING INFORMATION DETERMINATION USING INTER-IMAGE ANALYSIS OF MULTIPLE BUILDING IMAGES

TECHNICAL FIELD

The following disclosure relates generally to techniques for automatically analyzing visual data of images acquired for a building to determine and use building information of multiple types based on analysis of visual data of combinations of multiple images, such as using visual overlap between pairs of images to determine information that includes inter-image pose and co-visibility and structural element locations and to generate a resulting floor plan for the building, and for subsequently using the generated floor plan in one or more manners such as to improve navigation of the building.

BACKGROUND

In various fields and circumstances, such as architectural analysis, property inspection, real estate acquisition and development, remodeling and improvement services, general contracting, automated navigation and other circumstances, it may be desirable to view information about the interior of a house, office, or other building without having to physically travel to and enter the building, including to determine actual as-built information about the building rather than design information from before the building is constructed. However, it can be difficult to effectively capture, represent and use such building interior information, including to display visual information captured within building interiors to users at remote locations (e.g., to enable a user to fully understand the layout and other details of the interior, including to control the display in a user-selected manner). In addition, while a floor plan of a building may provide some information about layout and other details of a building interior, such use of floor plans has some drawbacks in certain situations, including that floor plans can be difficult to construct and maintain, to accurately scale and populate with information about room interiors, to visualize and otherwise use, etc.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

FIGS. 1A-1B are diagrams depicting an exemplary building interior environment and computing system(s) for use in embodiments of the present disclosure, including to generate and present information representing areas of the building.

FIGS. 2A-2M illustrate examples of automated operations for analyzing visual data of images acquired in multiple rooms of a building, such as based at least in part on analyzing visual data of pairs of images, and optionally combining data from the analysis of multiple image pairs for use in generating and providing information about a floor plan for the building.

DETAILED DESCRIPTION

Figure 2A:
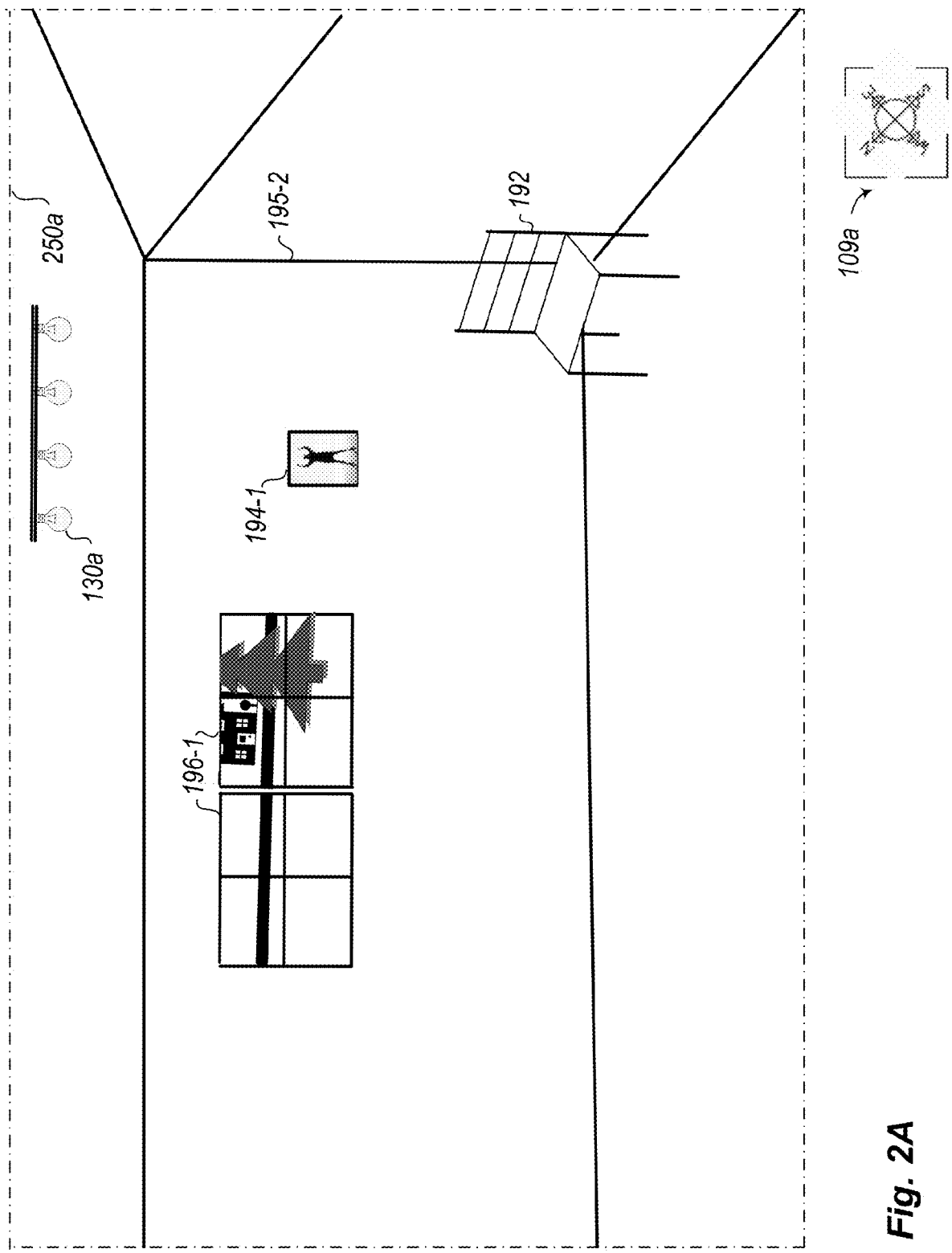

The present disclosure describes techniques for using computing devices to perform automated operations related to analyzing visual data from images acquired in multiple rooms of a building to generate multiple types of building information (e.g., to include a floor plan for the building), such as by using a trained neural network to jointly generate the multiple types of building information by combining visual data from pairs of the images, and for subsequently using the generated building information in one or more further automated manners. The images may, for example, include panorama images (e.g., in an equirectangular projection format) and/or other types of images (e.g., in a rectilinear perspective or orthographic format) that are acquired at acquisition locations in or around a multi-room building (e.g., a house, office, etc.), referred to generally herein at times as 'target images'—in addition, in at least some such embodiments, the automated building information generation is further performed without having or using information from any depth sensors or other distance-measuring devices about distances from a target image's acquisition location to walls or other objects in the surrounding building (e.g., by instead using only visual data of the images, such as RGB pixel data), while in other embodiments at least some depth information may be acquired and used. The generated floor plan for a building (including determined room shapes or other structural layouts of individual rooms within the building) and/or other types of generated building information may be further used in various manners in various embodiments, including for controlling navigation of mobile devices (e.g., autonomous vehicles), for display or other presentation over one or more computer networks on one or more client devices in corresponding GUIs (graphical user interfaces), etc. Additional details are included below regarding the automated analysis of visual data from images acquired in multiple rooms of a building to generate and use multiple types of building information (e.g., a floor plan information and/or other types of generated building information), and some or all of the techniques described herein may be performed via automated operations of an Inter-Image Mapping Information Generation Manager ("IIMIGM") system in at least some embodiments, as discussed further below.

As noted above, automated operations of an IIMIGM system may include analyzing visual data from multiple target images acquired at a multi-room building, such as multiple panorama images acquired at multiple acquisition locations in the multiple rooms and optionally other areas of the building—in at least some embodiments, such panorama images each includes 360° of horizontal visual coverage around a vertical axis and visual coverage of some or all of the floor and/or ceiling in one or more rooms (e.g., 180° or more of vertical visual coverage), and each may in some situations be presented using an equirectangular projection (with vertical lines and other vertical information shown as straight lines in the projection, and with horizontal lines and other horizontal information in an acquired surrounding environment being shown in the projection in a curved manner if they are above or below a horizontal midpoint of the image, with an amount of curvature increasing as a distance from the horizontal centerline increases). In addition, such panorama images or other images may be in a 'straightened' format when they are analyzed in at least some embodiments, such that a column of pixels in such a straightened image corresponds to a vertical slice of information in a surrounding environment (e.g., a vertical plane), whether based on being acquired in such a straightened format (e.g., using a camera device having a vertical axis that is perfectly aligned with such vertical information in the surrounding environment or a direction of gravity) and/or being processed to modify the original visual data in the image to be in the straightened format (e.g., using information about a variation of the camera device from such a vertical axis; by using vertical information in the surrounding environment, such as an inter-wall border or door frame side; etc.). The image acquisition device(s) that acquires target images may, for example, be one or more mobile computing devices that each includes one or more cameras or other imaging systems (optionally including one or more fisheye lenses for use in acquiring panorama images), and optionally includes additional hardware sensors to acquire non-visual data, such as one or more inertial measurement unit (or "IMU") sensors that acquire data reflecting the motion of the device, and/or may be one or more camera devices that each lacks computing capabilities and is optionally associated with a nearby mobile computing device.

As noted above, automated operations of an IIMIGM system may include generating multiple types of building information for a multi-room building based on analyzing visual data from multiple target images acquired at the building, with such building information also referred to as "mapping information" for the building at times herein, and with the generating of the multiple building information types being based at least in part on pairwise analysis of the multiple target images. For example, in at least some embodiments, a trained neural network may be used to analyze pairs of images and jointly determine multiple types of building information from the visual data of the two images of a pair, such as to perform an analysis of each of the image pixel columns of two straightened images to predict or otherwise determine some or all of the following: co-visibility information (e.g., whether the visual data of the image pixel column being analyzed is also visible in the other image of the pair, such as for both images to show a same vertical slice of a surrounding environment); image angular correspondence information (e.g., if the visual data of the image pixel column being analyzed is also visible in the other image of the pair, the one or more image pixel columns of the other image of the pair that contains visual data for the same vertical slice of the surrounding environment); wall-floor and/or wall-ceiling border information (e.g., if at least a portion of a wall and a boundary of that wall with a floor and/or a ceiling is present in the image pixel column being analyzed, one or more image pixel rows in that image pixel column that correspond to the wall-floor and/or wall-ceiling boundary); positions of structural wall elements and/or other structural elements (e.g., if at least a portion of one or more structural elements are present in the image pixel column being analyzed, one or more image pixel rows in that image pixel column that correspond to each of the structural elements); etc. Identified structural elements may have various forms in various embodiments, such as structural elements that are part of walls and/or ceilings and/or floors (e.g., windows and/or sky-lights; passages into and/or out of the room, such as doorways and other openings in walls, stairways, hallways, etc.; borders between adjacent walls; borders between walls and a floor; borders between walls and a ceiling; borders between a floor and a ceiling; corners (or solid geometry vertices) where at least three surfaces or planes meet; a fireplace; a sunken and/or elevated portion of a floor; an indented or extruding portion of a ceiling; etc.), optionally other fixed structural elements (e.g., countertops, bath tubs, sinks, islands, fireplaces, etc.). In addition, in at least some embodiments, some or all of the determined per-pixel column types of building information may be generated using probabilities or other likelihood values (e.g., an x % probability that an image pixel column's visual data is co-visible in the other image) and/or with a measure of uncertainty (e.g., based on a standard deviation for a predicted normal or non-normal probability distribution corresponding to a determined type of building information for an image pixel column, and optionally with a value selected from the probability distribution being used for the likely value for that building information type, such as a mean or median or mode).

In addition, the generating of the multiple types of building information based on automated operations of the IIMIGM system to perform pairwise analysis of visual data from multiple target images acquired at a building may further include, in at least some embodiments as part of analyzing a pair of images, using a combination of the visual data of the two images to determine additional types of building information, such as one or more of the following: locations of the structural elements (e.g., using bounding boxes and/or pixel masks for the two images); a 2D and/or 3D room shape or other structural layout for at least a portion of one or more rooms visible in the images (e.g., by combining information from the images about wall-floor and/or wall-ceiling boundaries, optionally with the locations of structural elements shown as part of the structural layout and/or with the acquisition locations of the images); inter-image directions and acquisition locations (in combination, referred to at times herein as inter-image "pose" information) and optionally a distance between the acquisition locations of the two images, such as in a relative and/or absolute manner (e.g., identifying one or more image pixel columns in each of the images that contain visual data of the other image's acquisition location or otherwise point toward that other acquisition location; identifying the acquisition locations of the images within the structural layout(s) of some or all of the one or more rooms visible in the images or otherwise at determined points; etc.); etc. As with the types of building information determined using per-pixel column analysis, some or all of the determined additional types of building information may be generated in at least some embodiments using probabilities or other likelihood values (e.g., a probability mask for the location of a structural element) and/or with a measure of uncertainty (e.g., using a predicted normal or non-normal probability distribution corresponding to a determined type of building information).

The generating of the multiple types of building information based on automated operations of the IIMIGM system from analysis of visual data from multiple target images acquired at a building may further include, in at least some embodiments, combining information from multiple image pairs to determine one or more further types of building information, such as one or more of the following: a partial or complete floor plan of the building; a group of 'linked' target images, such as based on inter-image directions between some or all pairs of images of the group, and optionally for use as a virtual tour of the building by using displayed user-selectable links shown on one or more of the displayed images of the group to cause display of a corresponding next image corresponding to the selected link; etc. As part of the generation of some or all such further types of building information, the automated operations of the IIMIGM system may include combining inter-image pose information from multiple pairs of images for some or all of target images, such as to cluster together the acquisition locations of those target images and determine global alignments of those acquisition locations (e.g., determining the acquisition locations of those some or all target images in a global common coordinate system, whether in a relative or absolute manner), and using the images' globally aligned acquisition locations and associated structural layout information to form a 2D and/or 3D floor plan (whether partial or complete, such as based on which target images are acquired and/or included in the common coordinate system).

In some embodiments, the IIMIGM system may further use additional data acquired during or near the acquisition of some or all target images (e.g., IMU motion data of an image acquisition device and/or accompanying mobile computing device, depth data to surrounding structural elements, etc.), while in other embodiments no such additional data may be used. In at least some such embodiments, the determined structural layout information from a pair of target images may be 2D structural information (e.g., indications of positions of walls relative to each other, optionally with additional information added such as locations of structural wall elements), while in other embodiments the determined structural layout information may include a partial or complete 3D structure for visible room(s) or other building area(s)— such a 3D structure from a pair of target images may correspond to an estimated partial or full room shape for each of one or more rooms visible in the visual data of the target images of the pair, such as, for example, a 3D point cloud (with a plurality of 3D data points corresponding to locations on the walls and optionally the floor and/or ceiling) and/or disconnected partial planar surfaces (corresponding to portions of the walls and optionally the floor and/or ceiling) and/or wireframe structural lines (e.g., to show one or more of borders between walls, borders between walls and ceiling, borders between walls and floor, outlines of doorways and/or other inter-room wall openings, outlines of windows, etc.). In addition, in embodiments in which such room shapes are generated, they may be further used as part of one or more additional operations, such as when generating a floor plan (e.g., to generate a 3D model floor plan using 3D room shapes, to generate a 2D floor plan by fitting 3D room shapes together and then removing height information, etc.), and/or when determining local alignment information (e.g., by aligning the 3D room shapes generated from two panorama images of a pair, such as using locations of inter-room passages and/or room shapes), and/or when performing global alignment information from determined local information for pairs of panorama images or other images. In at least some such embodiments, the determination of structural layout information for a pair of target images may further determine, within the determined layout(s) of the room(s) or other area(s), each of the target image's pose (the acquisition location of the target image, such as in three dimensions or degrees of freedom, and sometimes represented in a three-dimensional grid as an X, Y, Z tuple, and the orientation of the target image, such as in three additional dimensions or degrees of freedom, and sometimes represented as a three-dimensional rotational tuple or other directional vector), which is also referred to at times herein as an 'acquisition pose' or an 'acquisition position' of the target image. In addition, in at least some such embodiments, information about determined structural elements of rooms and other building areas may be used to fit structural layouts together, such as to match doorways and other wall openings between two rooms, to use windows for exterior walls that do not have another room on the other side (unless visual data available through a window between two rooms shows matches for images acquired in those two rooms) and that optionally have a matching external area on the other side. In some embodiments, local alignment information may be determined for, rather than a pair of images, one or more sub-groups each having two or more images (e.g., at least three images), and the group of inter-connected target images used to determine the global alignment information may include multiple such image sub-groups. Additional details are included below regarding the analysis of visual data of target images for a building to determine multiple types of building information for the building.

In addition, automated operations of the IIMIGM system and/or of one or more associated systems may further include using one or more types of determined building information for a building for one or more uses in one or more embodiments. Non-exclusive examples of such uses may include one or more of the following: displaying or otherwise presenting or providing information about a generated floor plan for the building and/or other generated mapping information for the building (e.g., a group of inter-linked images) to enable navigation of the building, such as physical navigation of the building by a vehicle or other device that moves under its own power (e.g., automated navigation by the device, user-assisted navigation by the device, etc.), physical navigation of the building by one or more users, virtual navigation of the building by one or more users, etc.; using one or more indicated target images to identify other images that have a threshold or other indicated amount of visual overlap with the indicated target image(s) and/or that otherwise satisfy one or more matching criteria (e.g., based on a quantity and/or percentage of an indicated target image's pixel columns that are co-visible with another identified image, using identified structural wall elements and/or generated structural layouts and/or determined inter-image pose information between an indicated target image and an other identified image, etc.), such as by searching other target images for the building, and/or by searching other images for a plurality of buildings (e.g., in situations in which the building(s) associated with the one or more indicated target image(s) are not known), and optionally for use in search results to a query that indicates the one or more target images; to provide feedback during an image acquisition session for a building, such as for one or more most recently acquired target images (e.g., in a real-time or near-real-time manner after the most recent image acquisition, such as within one or more seconds or minutes or fractions of a second) or other indicated target images for the building and with respect to other images acquired for the building (e.g., other images acquired during the image acquisition session), such as feedback based on an amount of visual overlap between the indicated target image(s) and one or more other identified images and/or based on one or more other feedback criteria (e.g., feedback to reflect whether there is sufficient coverage of the building and/or to direct acquisition of one or more additional images that have an indicated amount of visual overlap with other acquired images or that otherwise have indicated characteristics, such as based on a quantity and/or percentage of an indicated target image's pixel columns that are co-visible with another identified image, using identified structural wall elements and/or generated structural layouts and/or determined inter-image pose information between an indicated target image and an other identified image, etc.), etc. Additional details are included below regarding uses of building information of various types determined from analysis of visual data of target images for a building.

In addition, in some embodiments, the automated operations of the IIMIGM system include obtaining input information of one or more types from one or more users (e.g., system operator users of the IIMIGM system that assist in its operations, end users that obtain results of information from the IIMIGM system, etc.), such as to be incorporated into subsequent automated analyses in various manners, including to replace or supplement automatically generated information of the same type, to be used as constraints and/or prior probabilities during later automated analysis (e.g., by a trained neural network), etc. Furthermore, in some embodiments, the automated operations of the IIMIGM system further include obtaining and using additional types of information during its analysis activities, with non-exclusive examples of such additional types of information uses including the following: obtaining and using names or other tags for particular rooms or other building areas, such as for use in grouping target images whose acquisition locations are in such rooms or other areas; obtaining information to use as initial pose information for a target image (e.g., to be refined in subsequent automated determination of structural layout information from the target image); obtaining and using other image acquisition metadata to group target images or to otherwise assist in image analysis, such as to use image acquisition time information and/or order information to identify consecutive images that may be acquired in proximate acquisition locations; etc. Additional details are included below regarding other automated operations of the IIMIGM system in some embodiments and situations.

The described techniques provide various benefits in various embodiments, including to allow partial or complete floor plans of multi-room buildings and other structures to be automatically generated from target image(s) acquired for the building or other structure, including to provide more complete and accurate room shape information, and including in some embodiments without having or using information from depth sensors or other distance-measuring devices about distances from images' acquisition locations to walls or other objects in a surrounding building or other structure. Non-exclusive examples of additional such benefits of the described techniques include the following: the ability to identify other images that have at least a partial visual overlap with one or more indicated images, such as to provide corresponding search results; the ability to provide feedback during an image acquisition session about one or more indicated images that have been acquired (e.g., the most recently acquired image(s)) and/or about one or more additional images to be acquired, such as in a real-time or near-real-time manner with respect to acquisition of the indicated image(s); the ability to analyze the visual data of a target image to detect objects of interest in an enclosing room or other building area (e.g., structural wall elements, such as windows, doorways and other wall openings, etc.) and to determine locations of those detected objects in a determined layout for the enclosing room or other building area; the ability to analyze additional acquired data (e.g., movement data from one or more IMU sensors, visual data from one or more image sensors, etc.) to determine a travel path of an image acquisition device in multiple rooms, to identify wall openings (e.g., doorways, staircases, etc.) of the multiple rooms based at least in part on that additional data (and optionally on visual data of one or more target images acquired in the one or more rooms), and to optionally further use such information about identified wall openings as part of positioning together determined 2D room layouts and/or 3D room shapes of the multiple rooms; the ability to inter-connect multiple target images and display at least one of the target images with user-selectable visual indicators in the directions of other linked target images that when selected cause the display of a respective other one of the linked target images (e.g., as part of a virtual tour), such as by placing the various target images in a common coordinate system that shows at least their relative locations, or to otherwise determine at least directions between pairs of target images (e.g., based at least in part on an automated analysis of the visual contents of the target images in the pair, and optionally based on further movement data from the mobile computing device along a travel path between the target images), and to link the various target images using the determined inter-image directions; etc. Furthermore, the described automated techniques allow such room shape information to be determined more quickly than previously existing techniques, and in at least some embodiments with greater accuracy, including by using information acquired from the actual building environment (rather than from plans on how the building should theoretically be constructed), as well as enabling identifying changes to structural elements that occur after a building is initially constructed. Such described techniques further provide benefits in allowing improved automated navigation of a building by devices (e.g., semi-autonomous or fully-autonomous vehicles), based at least in part on the determined acquisition locations of images and/or the generated floor plan information (and optionally other generated mapping information), including to significantly reduce computing power and time used to attempt to otherwise learn a building's layout. In addition, in some embodiments, the described techniques may be used to provide an improved GUI in which a user may more accurately and quickly obtain information about a building's interior (e.g., for use in navigating that interior) and/or other associated areas, including in response to search requests, as part of providing personalized information to the user, as part of providing value estimates and/or other information about a building to a user, etc. Various other benefits are also provided by the described techniques, some of which are further described elsewhere herein.

For illustrative purposes, some embodiments are described below in which specific types of information are acquired, used and/or presented in specific ways for specific types of structures and by using specific types of devices—however, it will be understood that the described techniques may be used in other manners in other embodiments, and that the invention is thus not limited to the exemplary details provided. As one non-exclusive example, while floor plans may be generated for houses that do not include detailed measurements for particular rooms or for the overall houses, it will be appreciated that other types of floor plans or other mapping information may be similarly generated in other embodiments, including for buildings (or other structures or layouts) separate from houses (including to determine detailed measurements for particular rooms or for the overall buildings or for other structures or layouts), and/or for other types of environments in which different target images are acquired in different areas of the environment to generate a map for some or all of that environment (e.g., for roads, neighborhoods, cities, runways, etc.). As another non-exclusive example, while floor plans for houses or other buildings may be used for display to assist viewers in navigating the buildings, generated mapping information may be used in other manners in other embodiments. As yet another non-exclusive example, while some embodiments discuss obtaining and using data from one or more types of image acquisition devices (e.g., a mobile computing device and/or a separate camera device), in other embodiments the one or more devices used may have other forms, such as to use a mobile device that acquires some or all of the additional data but does not provide its own computing capabilities (e.g., an additional 'non-computing' mobile device), multiple separate mobile devices that each acquire some of the additional data (whether mobile computing devices and/or non-computing mobile devices), etc. In addition, the term "building" refers herein to any partially or fully enclosed structure, typically but not necessarily encompassing one or more rooms that visually or otherwise divide the interior space of the structure, and in some situations including one or more adjacent or otherwise associated external areas and/or external accessory structures—non-limiting examples of such buildings include houses, apartment buildings or individual apartments therein, condominiums, office buildings, commercial buildings or other wholesale and retail structures (e.g., shopping malls, department stores, warehouses, etc.), etc. The term "acquire" or "capture" as used herein with reference to a building interior, acquisition location, or other location (unless context clearly indicates otherwise) may refer to any recording, storage, or logging of media, sensor data, and/or other information related to spatial and/or visual characteristics and/or otherwise perceivable characteristics of the building interior or other location or subsets thereof, such as by a recording device or by another device that receives information from the recording device. As used herein, the term "panorama image" may refer to a visual representation that is based on, includes or is separable into multiple discrete component images originating from a substantially similar physical location in different directions and that depicts a larger field of view than any of the discrete component images depict individually, including images with a sufficiently wide-angle view from a physical location to include angles beyond that perceivable from a person's gaze in a single direction (e.g., greater than 120° or 150° or 180°, etc.). The term "sequence" of acquisition locations, as used herein, refers generally to two or more acquisition locations that are each visited at least once in a corresponding order, whether or not other non-acquisition locations are visited between them, and whether or not the visits to the acquisition locations occur during a single continuous period of time or at multiple different times, or by a single user and/or device or by multiple different users and/or devices. In addition, various details are provided in the drawings and text for exemplary purposes, but are not intended to limit the scope of the invention. For example, sizes and relative positions of elements in the drawings are not necessarily drawn to scale, with some details omitted and/or provided with greater prominence (e.g., via size and positioning) to enhance legibility and/or clarity. Furthermore, identical reference numbers may be used in the drawings to identify similar elements or acts.

FIG. 1A is an example block diagram of various devices and systems that may participate in the described techniques in some embodiments. In particular, target panorama images 165 are indicated in FIG. 1A that have been acquired by one or more mobile computing devices 185 with imaging systems and/or by one or more separate camera devices 184 (e.g., without onboard computing capabilities), such as with respect to one or more buildings or other structures and under control of an Interior Capture and Analysis ("ICA") system 160 executing in this example on one or more server computing systems 180—FIG. 1B shows one example of such panorama image acquisition locations 210 for part of a particular example house 198, as discussed further below, and additional details related to the automated operation of the ICA system are included elsewhere herein. In at least some embodiments, at least some of the ICA system may execute in part on mobile computing device 185 (e.g., as part of ICA application 154, whether in addition to or instead of ICA system 160 on the one or more server computing systems 180) to control acquisition of target images and optionally additional non-visual data by that mobile computing device and/or by one or more nearby (e.g., in the same room) optional separate camera devices 184 operating in conjunction with that mobile computing device, as discussed further with respect to FIG. 1B.

Figure 2B:
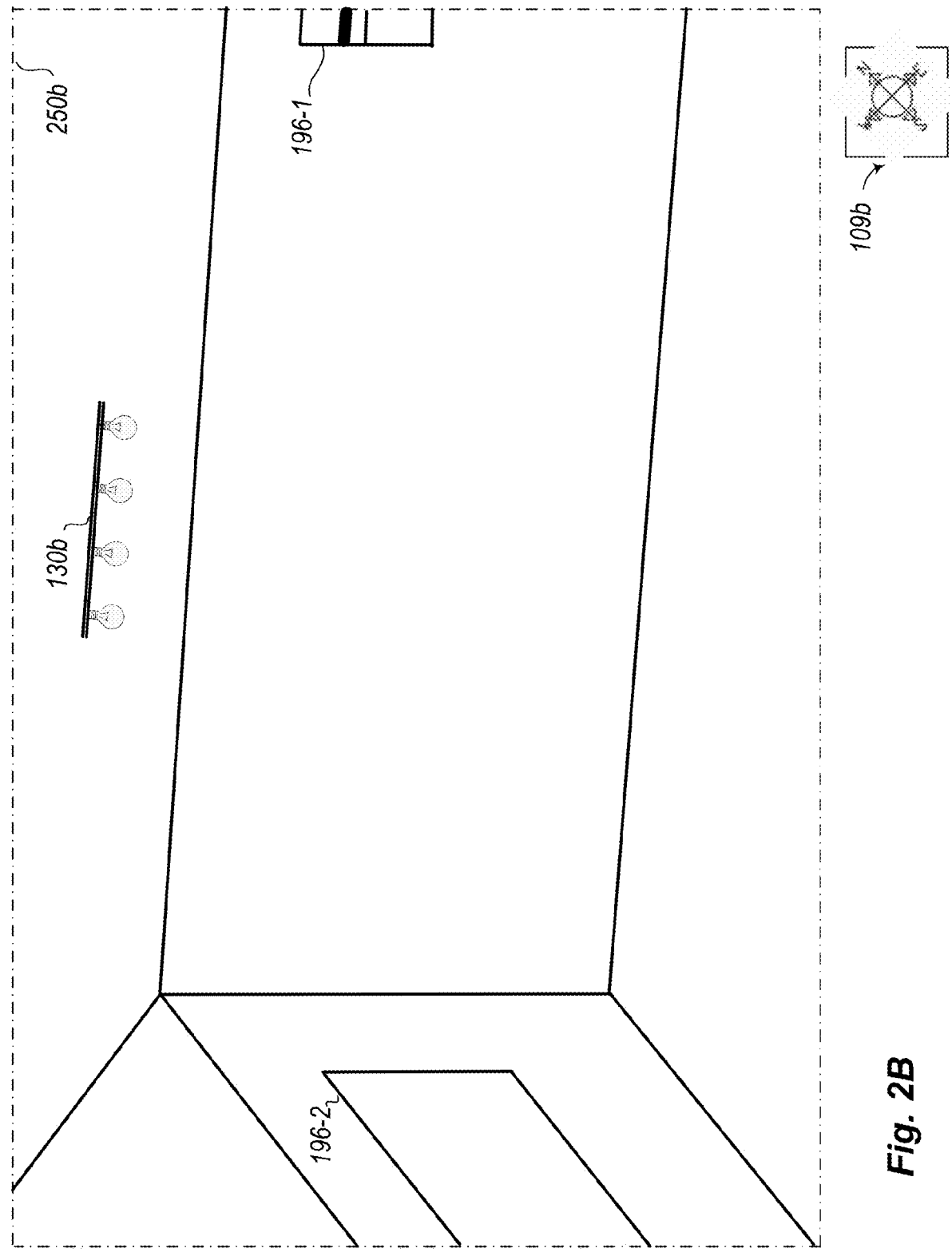
Figure 2C:
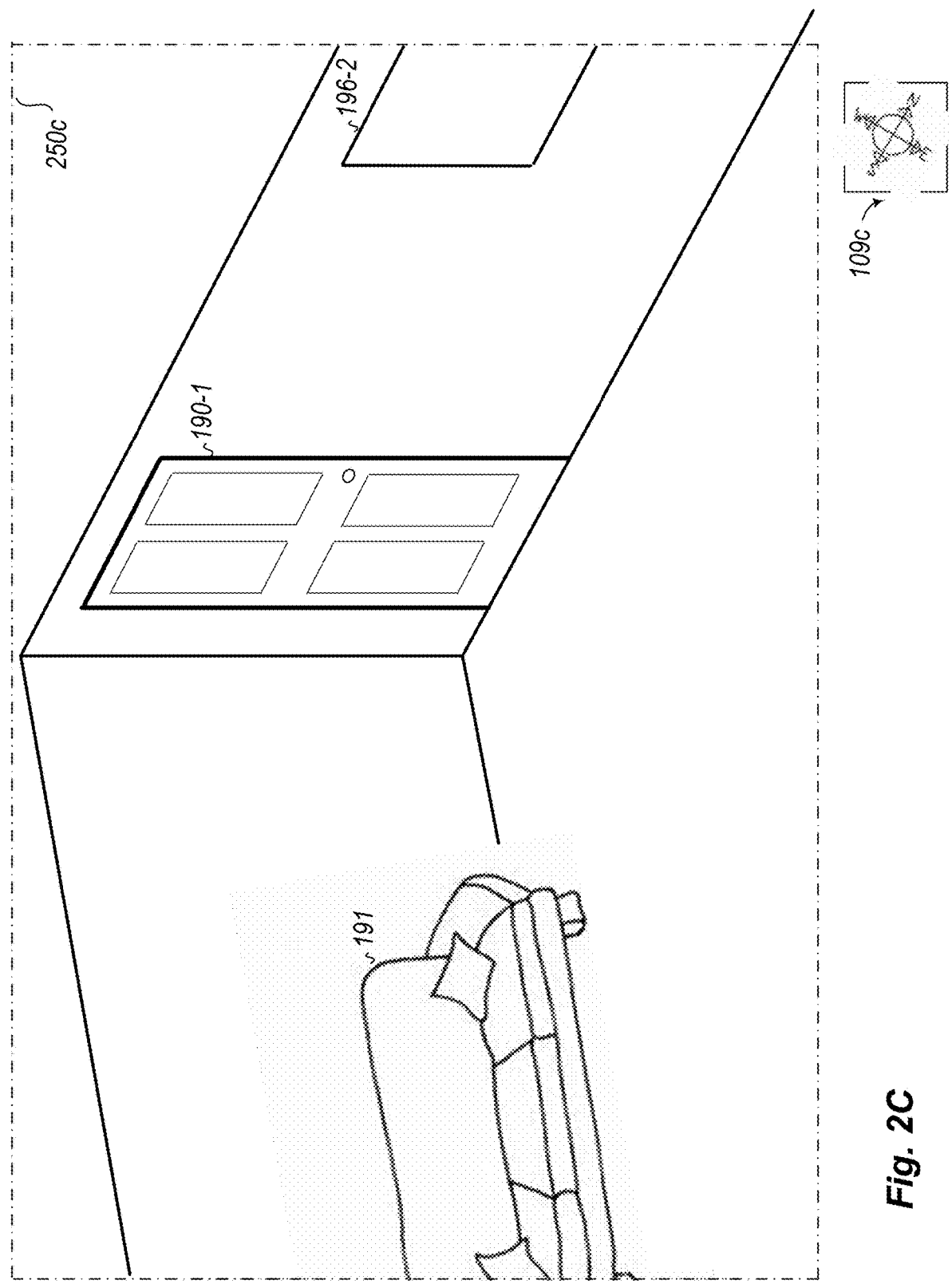
Figure 2D:
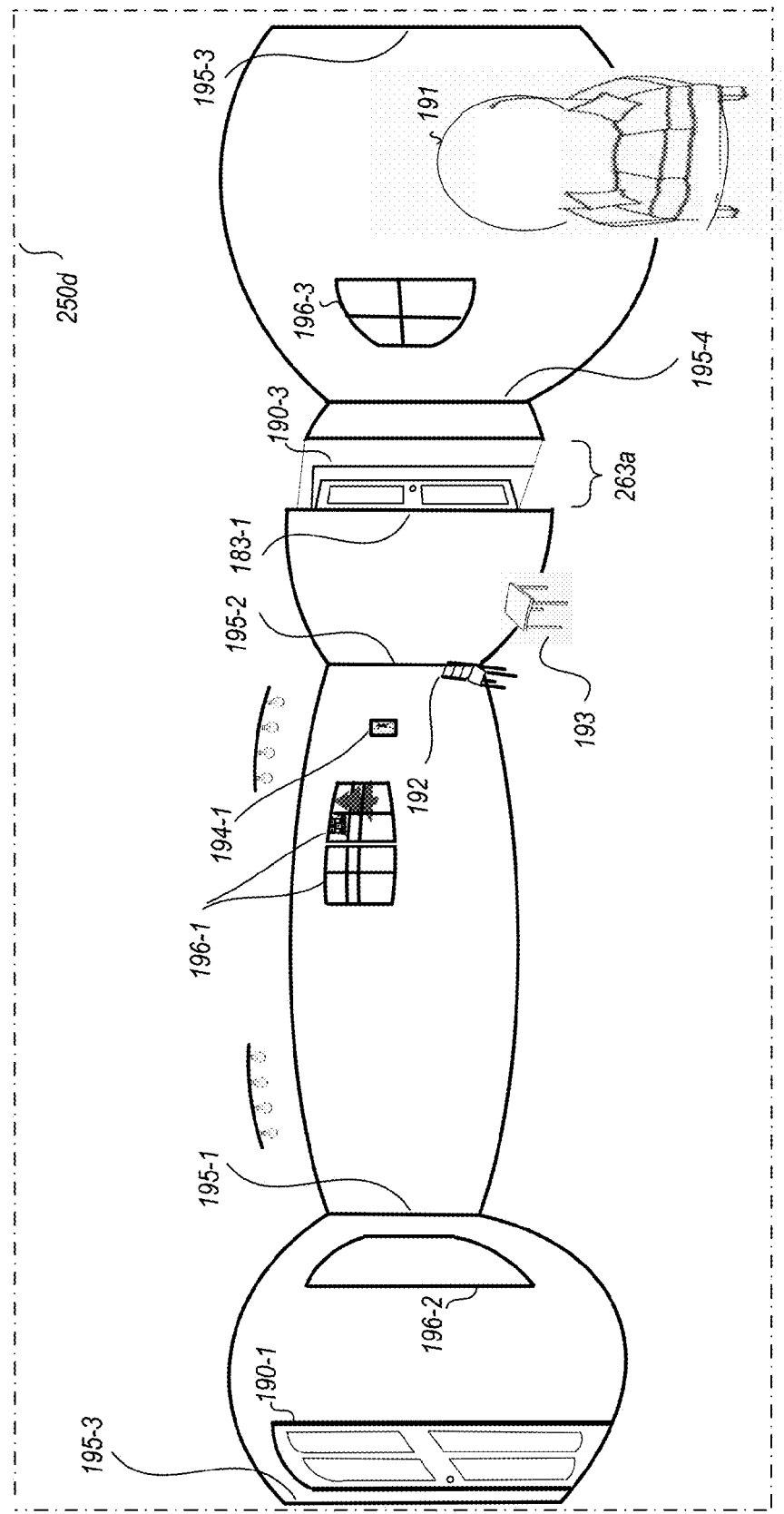
Figure 2E:
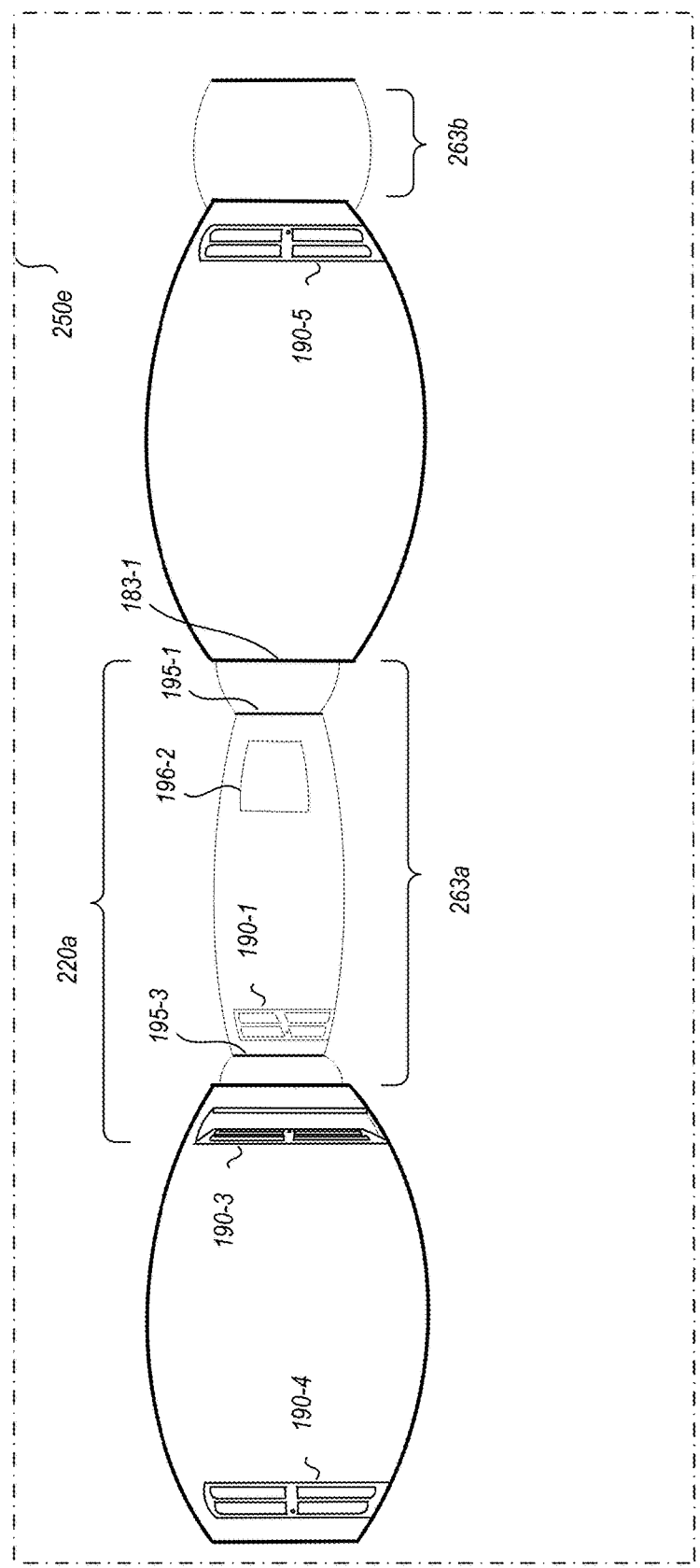
Figure 2F:
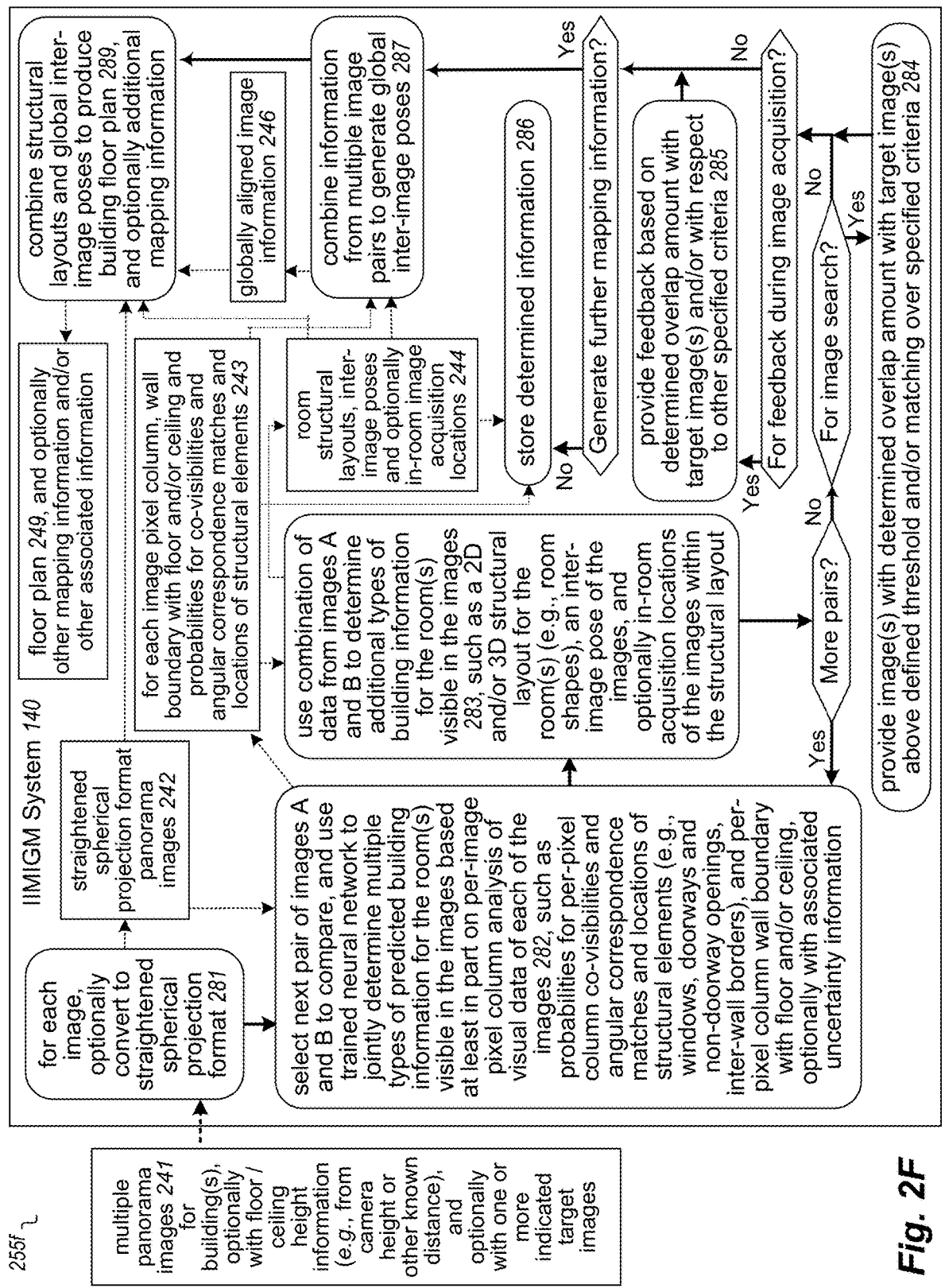
Figure 2G:
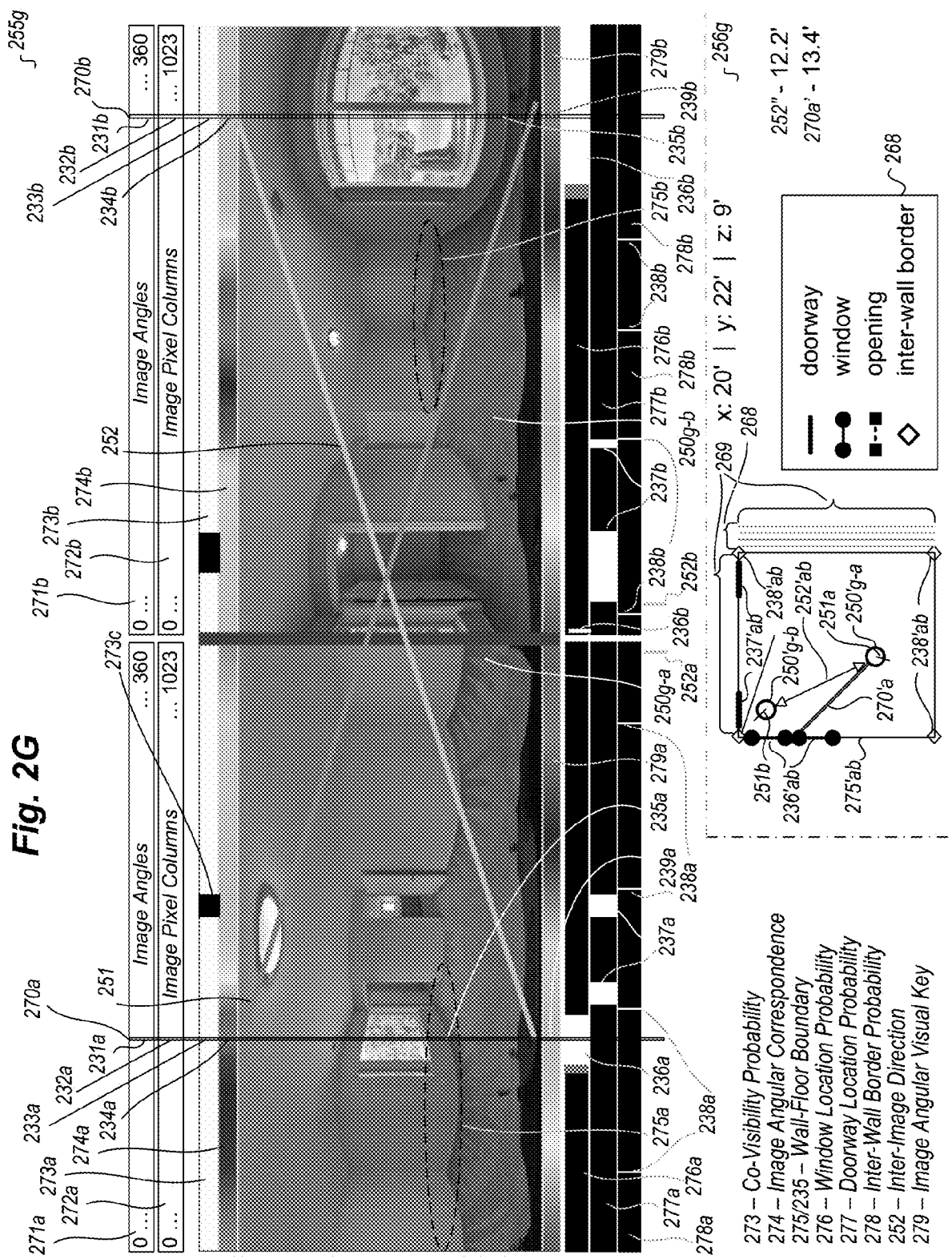
Figure 2H:
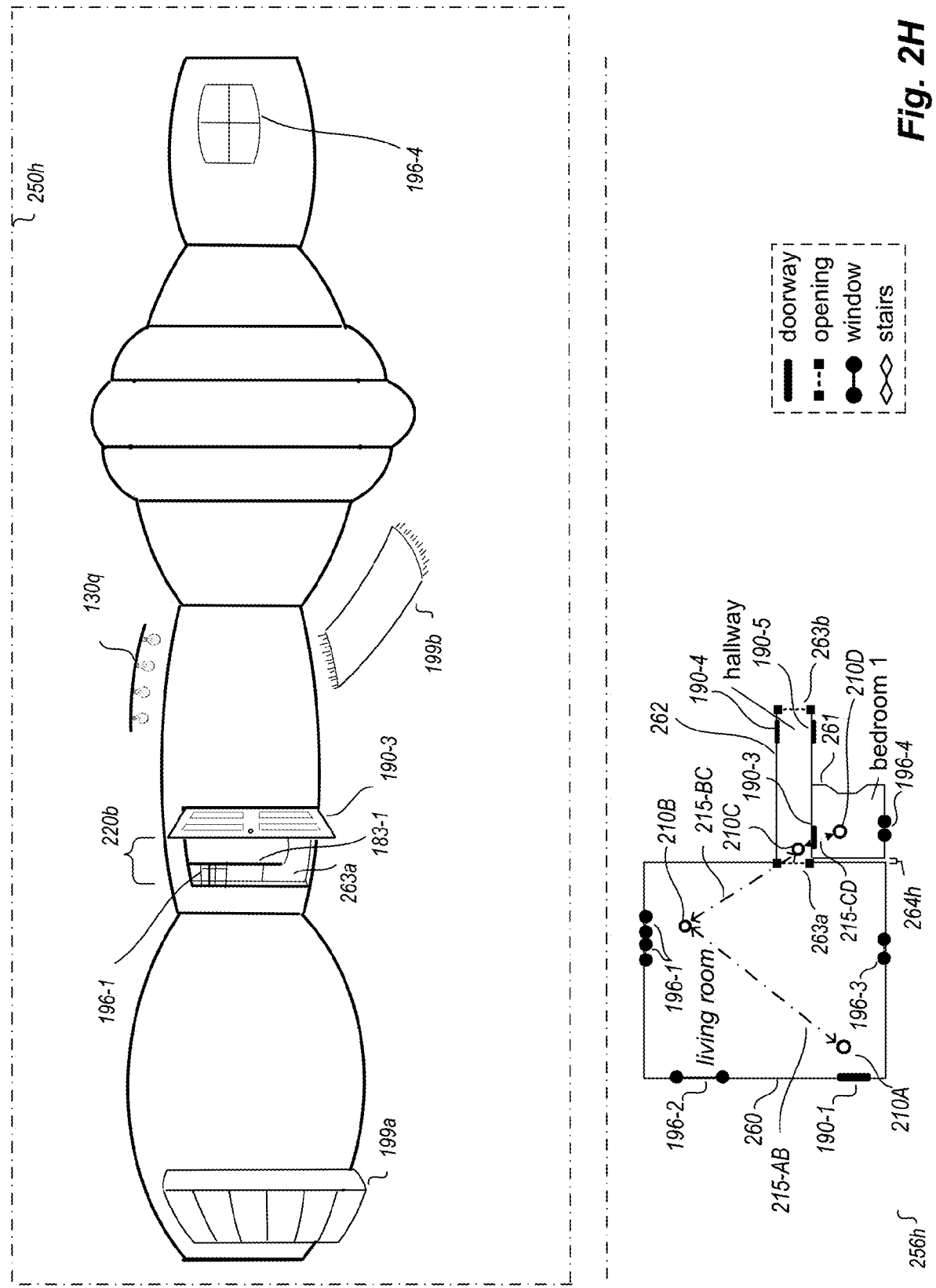
Figure 2I:
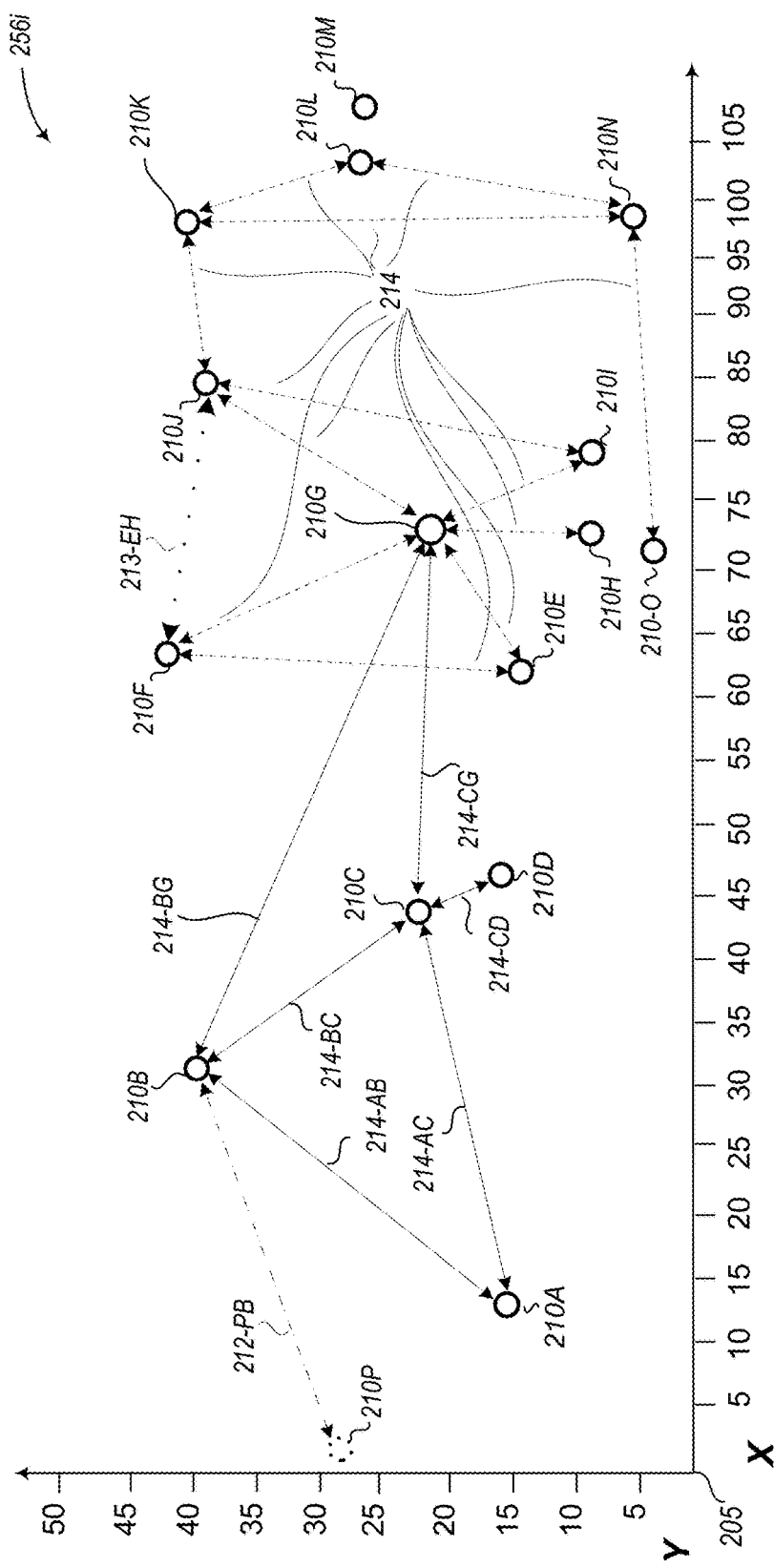
Figure 2J:
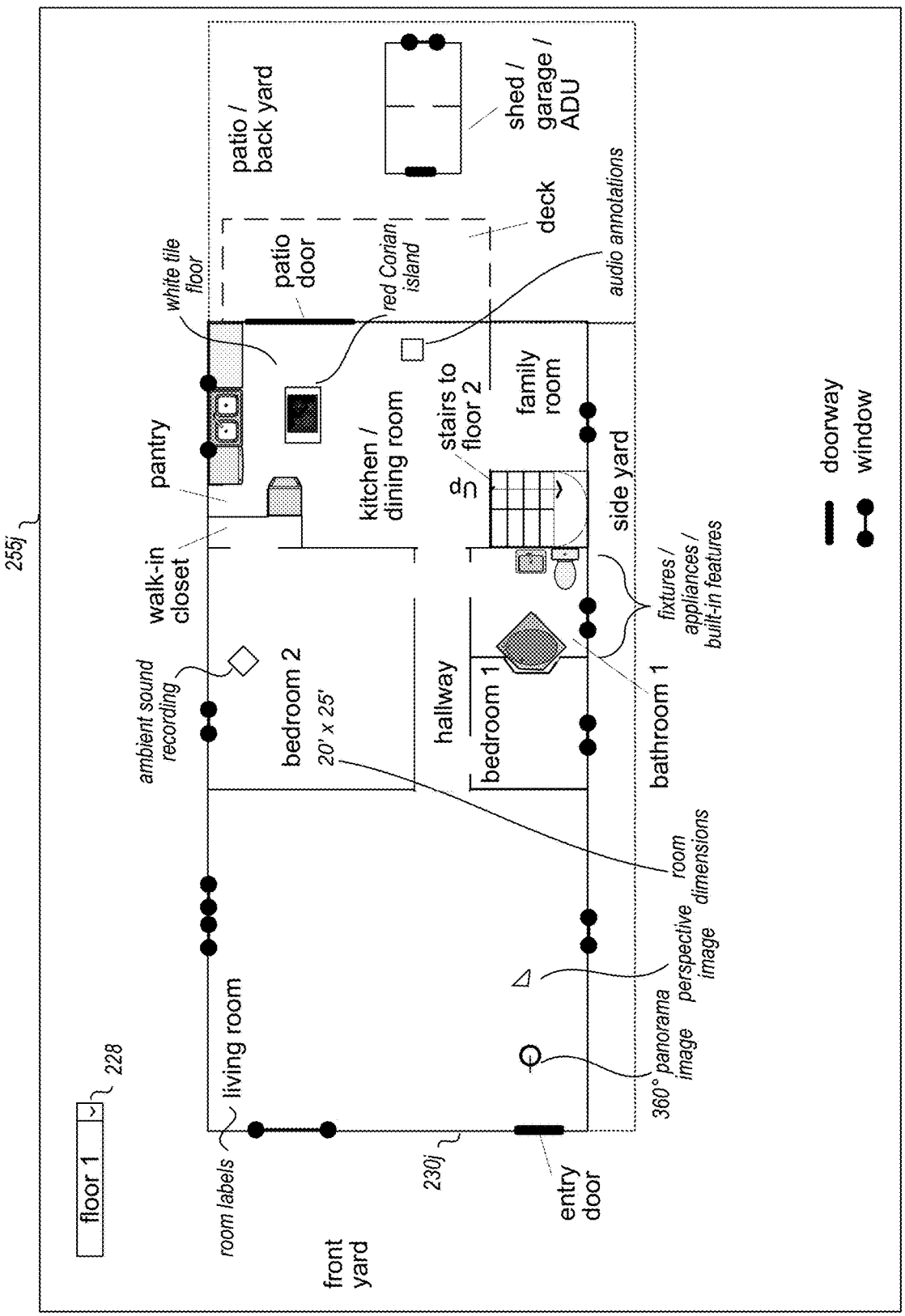
Figure 2K:
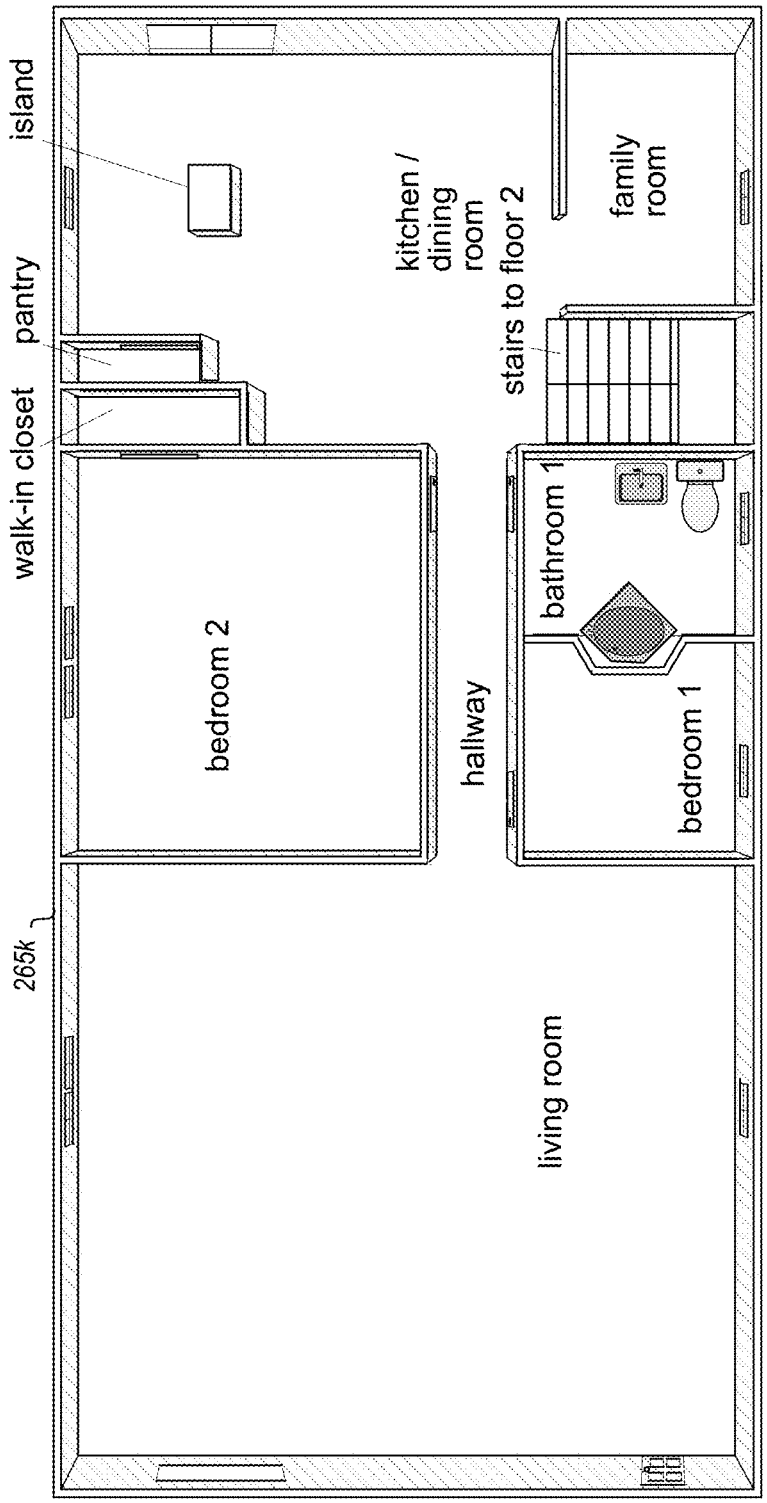

FIG. 1A further illustrates an IIMIGM (Inter-Image Mapping Information Generation Manager) system 140 that is executing on one or more server computing systems 180 to analyze visual data of acquired target images (e.g., panorama images 165) acquired in each of some or all building rooms or other building areas, and to use results of the analysis to further generate and provide building floor plans 145 and/or other mapping-related information (e.g., linked panorama images, 3D models, etc.) based on use of the target images and optionally associated metadata about their acquisition and linking—FIGS. 2J-2K show non-exclusive examples of such floor plans, as discussed further below, and additional details related to the automated operations of the IIMIGM system are included elsewhere herein. In some embodiments, the ICA system 160 and/or IIMIGM system 140 may execute on the same server computing system(s), such as if multiple or all of those systems are operated by a single entity or are otherwise executed in coordination with each other (e.g., with some or all functionality of those systems integrated together into a larger system), while in other embodiments the IIMIGM system may instead operate separately from the ICA system (e.g., without interacting with the ICA system), such as to obtain target images and/or optionally other information (e.g., other additional images, etc.) from one or more external sources and optionally store them locally (not shown) with the IIMIGM system for further analysis and use.

In at least some embodiments and situations, one or more system operator users (not shown) of IIMIGM client computing devices 105 may optionally further interact over the network(s) 170 with the IIMIGM system 140, such as to assist with some of the automated operations of the IIMIGM system and/or for subsequently using information determined and generated by the IIMIGM system in one or more further automated manners. One or more other end users (not shown) of one or more other client computing devices 175 may further interact over one or more computer networks 170 with the IIMIGM system 140 and optionally the ICA system 160, such as to obtain and use generated floor plans and/or other generated mapping information, and/or to optionally interact with such a generated floor plan and/or other generated mapping information, and/or to obtain and optionally interact with additional information such as one or more associated target images (e.g., to change between a floor plan view and a view of a particular target image at an acquisition location within or near the floor plan; to change the horizontal and/or vertical viewing direction from which a corresponding subset of a panorama image is displayed, such as to determine a portion of a panorama image to which a current user viewing direction is directed, etc.), and/or to obtain information about images matching one or more indicated target images. In addition, in at least some embodiments and situations, a mobile image acquisition device 185 may further interact with the IIMIGM system during an image acquisition session to obtain feedback about images that have been acquired and/or that should be acquired, as discussed in greater detail elsewhere herein. In addition, while not illustrated in FIGS. 1A-1B, a floor plan (or portion of it) may be linked to or otherwise associated with one or more other types of information, including for a floor plan of a multi-story or otherwise multi-level building to have multiple associated sub-floor plans for different stories or levels that are interlinked (e.g., via connecting stairway passages), for a two-dimensional ("2D") floor plan of a building to be linked to or otherwise associated with a three-dimensional ("3D") model floor plan of the building, etc. —in other embodiments, a floor plan of a multi-story or multi-level building may instead include information for all of the stories or other levels together and/or may display such information for all of the stories or other levels simultaneously. In addition, while not illustrated in FIG. 1A, in some embodiments the client computing devices 175 (or other devices, not shown) may receive and use generated floor plan information and/or other related information in additional manners, such as to control or assist automated navigation activities by those devices (e.g., by autonomous vehicles or other devices), whether instead of or in addition to display of the generated information.

In the computing environment of FIG. 1A, the network 170 may be one or more publicly accessible linked networks, possibly operated by various distinct parties, such as the Internet. In other implementations, the network 170 may have other forms. For example, the network 170 may instead be a private network, such as a corporate or university network that is wholly or partially inaccessible to non-privileged users. In still other implementations, the network 170 may include both private and public networks, with one or more of the private networks having access to and/or from one or more of the public networks. Furthermore, the network 170 may include various types of wired and/or wireless networks in various situations. In addition, the client computing devices 105 and 175 and server computing systems 180 may include various hardware components and stored information, as discussed in greater detail below with respect to FIG. 3.

In the example of FIG. 1A, ICA system 160 may perform automated operations involved in generating multiple target panorama images (e.g., each a 360 degree panorama around a vertical axis) at multiple associated acquisition locations (e.g., in multiple rooms or other areas within a building or other structure and optionally around some or all of the exterior of the building or other structure), such as for use in generating and providing a representation of the building (including its interior) or other structure. In some embodiments, further automated operations of the ICA system may further include analyzing information to determine relative positions/directions between each of two or more acquisition locations, creating inter-panorama positional/directional links in the panoramas to each of one or more other panoramas based on such determined positions/directions, and then providing information to display or otherwise present multiple linked panorama images for the various acquisition locations within the building, while in other embodiments some or all such further automated operations may instead be performed by the IIMIGM system. Additional details related to embodiments of a system providing at least some such functionality of an ICA system are included in U.S. Non-Provisional patent application Ser. No. 16/693,286, filed Nov. 23, 2019 and entitled "Connecting And Using Building Data Acquired From Mobile Devices" (which includes disclosure of an example BICA system that is generally directed to obtaining and using panorama images from within one or more buildings or other structures); in U.S. Non-Provisional patent application Ser. No. 16/236,187, filed Dec. 28, 2018 and entitled "Automated Control Of Image Acquisition Via Use Of Acquisition Device Sensors" (which includes disclosure of an example ICA system that is generally directed to obtaining and using panorama images from within one or more buildings or other structures); in U.S. Non-Provisional patent application Ser. No. 16/190,162, filed Nov. 14, 2018 and entitled "Automated Mapping Information Generation From Inter-Connected Images"; in U.S. Non-Provisional patent application Ser. No. 17/080,604, filed Oct. 26, 2020 and entitled "Generating Floor Maps For Buildings From Automated Analysis Of Visual Data Of The Buildings' Interiors"; in U.S. Provisional Patent Application No. 63/035,619, filed Jun. 5, 2020 and entitled "Automated Generation On Mobile Devices Of Panorama Images For Buildings Locations And Subsequent Use"; and in U.S. Non-Provisional patent application Ser. No. 17/459,820, filed Aug. 27, 2021 and entitled "Automated Mapping Information Generation From Analysis Of Building Photos"; each of which is incorporated herein by reference in its entirety.

FIG. 1B depicts a block diagram of an exemplary building environment in which panorama images may be acquired, linked and used to generate and provide a corresponding building floor plan, as well as for use in presenting the panorama images to users and/or for other uses as discussed herein. In particular, FIG. 1B includes a building 198 with an interior that was acquired at least in part via multiple target panorama images, such as by a user (not shown) carrying one or more mobile computing devices 185 with image acquisition capabilities and/or one or more separate camera devices 184 through the building interior to a sequence of multiple acquisition locations 210 to acquire the target images and optionally additional non-visual data for the multiple acquisition locations 210. An embodiment of the ICA system (e.g., ICA system 160 on server computing system(s) 180; a copy of some or all of the ICA system executing on the user's mobile device, such as ICA application system 154 executing in memory 152 on device 185; etc.) may automatically perform or assist in the acquiring of the data representing the building interior. The mobile computing device 185 of the user may include various hardware components, such as one or more sensors 148 (e.g., a gyroscope 148*a*, an accelerometer 148*b*, a compass 148*c*, etc., such as part of one or more IMUs, or inertial measurement units, of the mobile device; an altimeter; light detector; etc.), one or more hardware processors 132, memory 152, a display 142, optionally one or more cameras or other imaging systems 135, optionally a GPS receiver, and optionally other components that are not shown (e.g., additional non-volatile storage; transmission capabilities to interact with other devices over the network(s) 170 and/or via direct device-to-device communication, such as with an associated camera device 184 or a remote server computing system 180; one or more external lights; a microphone, etc.)—however, in some embodiments, the mobile device may not have access to or use hardware equipment to measure the depth of objects in the building relative to a location of the mobile device (such that relationships between different panorama images and their acquisition locations may be determined in part or in whole based on analysis of the visual data of the images, and optionally in some such embodiments by further using information from other of the listed hardware components (e.g., IMU sensors 148), but without using any data from any such depth sensors), while in other embodiments the mobile device may have one or more distance-measuring sensors 136 (e.g., using lidar or other laser rangefinding techniques, structured light, synthetic aperture radar or other types of radar, etc.) used to measure depth to surrounding walls and other surrounding objects for one or more images' acquisition locations (e.g., in combination with determined building information from analysis of visual data of the image(s), such as determined inter-image pose information for one or more pairs of panorama images relative to structural layout information that may correspond to a room or other building area). While not illustrated for the sake of brevity, the one or more camera devices 184 may similarly each include at least one or more image sensors and storage on which to store acquired target images and transmission capabilities to transmit the acquired target images to other devices (e.g., an associated mobile computing device 185, a remote server computing system 180, etc.), optionally along with one or more lenses and lights and other physical components (e.g., some or all of the other components shown for the mobile computing device). While directional indicator 109 is provided for viewer reference, the mobile device and/or ICA system may not use absolute directional information in at least some embodiments, such as to instead determine relative directions and distances between panorama images' acquisition locations 210 without use of actual geographical positions/directions.

In operation, the mobile computing device 185 and/or camera device 184 (hereinafter for the example of FIG. 1B, "one or more image acquisition devices") arrive at a first acquisition location within a first room of the building interior (e.g., acquisition location 210A in a living room of the house, such as after entering the house from an external doorway 190-1), and acquires visual data for a portion of the building interior that is visible from that acquisition location (e.g., some or all of the first room, and optionally small portions of one or more other adjacent or nearby rooms, such as through doors, halls, stairs or other connecting passages from the first room)—in this example embodiment, a first image may be acquired at acquisition location 210A and a second image may be acquired in acquisition location 210B within the same room (as discussed further with respect to example images shown in FIGS. 2A-2D) before proceeding to acquire further images at acquisition locations 210C and 210D (as discussed further with respect to an example image shown in FIGS. 2E and 2H). In at least some situations, the one or more image acquisition devices may be carried by or otherwise accompanied by one or more users, while in other embodiments and situations may be mounted on or carried by one or more self-powered devices that move through the building under their own power. In addition, the acquisition of the visual data from an acquisition location may be performed in various manners in various embodiments (e.g., by using one or more lenses that acquire all of the image data simultaneously, by an associated user turning his or her body in a circle while holding the one or more image acquisition devices stationary relative to the user's body, by an automated device on which the one or more image acquisition devices are mounted or carried rotating the one or more image acquisition devices, etc.), and may include recording a video at the acquisition location and/or taking a succession of one or more images at the acquisition location, including to acquire visual information depicting a number of objects or other elements (e.g., structural details) that may be visible in images (e.g., video frames) acquired from or near the acquisition location. In the example of FIG. 1B, such objects or other elements include various elements that are structurally part of the walls (or "wall elements"), such as the doorways 190 and their doors (e.g., with swinging and/or sliding doors), windows 196, inter-wall borders (e.g., corners or edges) 195 (including corner 195-1 in the northwest corner of the building 198, corner 195-2 in the northeast corner of the first room, corner 195-3 in the southwest corner of the building 198, and corner 195-4 in the southeast corner of the first room), other corners or inter-wall borders 183 (e.g., corner/border 183-1 at the northern side of the wall opening between the living room and the hallway to the east), etc. —in addition, such objects or other elements in the example of FIG. 1B may further include other elements within the rooms, such as furniture 191-193 (e.g., a couch 191; chair 192; table 193; etc.), pictures or paintings or televisions or other objects 194 (such as 194-1 and 194-2) hung on walls, light fixtures, etc. The one or more image acquisition devices may optionally further acquire additional data (e.g., additional visual data using imaging system 135, additional motion data using sensor modules 148, optionally additional depth data using distance-measuring sensors 136, etc.) at or near the acquisition location, optionally while being rotated, as well as to further optionally acquire further such additional data while the one or more image acquisition devices move to and/or from acquisition locations. Actions of the image acquisition device(s) may in some embodiments be controlled or facilitated via use of program(s) executing on the mobile computing device 185 (e.g., via automated instructions to image acquisition device(s) or to another mobile device, not shown, that is carrying those devices through the building under its own power; via instructions to an associated user in the room; etc.), such as ICA application system 154 and/or optional browser 162, control system 147 to manage I/O (input/output) and/or communications and/or networking for the device 185 (e.g., to receive instructions from and present information to its user, such as part of an operating system, not shown, executing on the device), etc. The user may also optionally provide a textual or auditory identifier to be associated with an acquisition location, such as "entry" for acquisition location 210A or "living room" for acquisition location 210B, while in other embodiments the ICA system may automatically generate such identifiers (e.g., by automatically analyzing video and/or other recorded information for a building to perform a corresponding automated determination, such as by using machine learning) or the identifiers may not be used.

After visual data and optionally other information for the first acquisition location has been acquired, the image acquisition device(s) (and user, if present) may optionally proceed to a next acquisition location along a path 115 during the same image acquisition session (e.g., from acquisition location 210A to acquisition location 210B, etc.), optionally recording movement data during movement between the acquisition locations, such as video and/or other data from the hardware components (e.g., from one or more IMU sensors 148, from the imaging system 135, from the distance-measuring sensors 136, etc.). At the next acquisition location, the one or more image acquisition devices may similarly acquire one or more images from that acquisition location, and optionally additional data at or near that acquisition location. The process may repeat for some or all rooms of the building and optionally outside the building, as illustrated for acquisition locations 210A-210P, including in this example to acquire target panorama image(s) on an external deck or patio or balcony area 186, on a larger external back yard or patio area 187, in a separate side yard area 188, near or in an external additional accessory structure area 189 (e.g., a garage, shed, accessory dwelling unit, greenhouse, gazebo, car port, etc.) that may have one or more rooms, in a front yard outside the external doorway 190-1 (e.g., during a different image acquisition session than used to acquire some or all of the other target images), etc. Acquired video and/or other images for each acquisition location are further analyzed to generate a target panorama image for each of some or all of acquisition locations 210A-210P, including in some embodiments to stitch together multiple constituent images from an acquisition location to create a target panorama image for that acquisition location and/or to otherwise combine visual data in different images (e.g., objects and other elements, latent space features, etc.).

Additional details related to embodiments of generating and using linking information between panorama images, including using travel path information and/or elements or other features visible in multiple images, are included in U.S. Non-Provisional patent application Ser. No. 16/693,286, filed Nov. 23, 2019 and entitled "Connecting And Using Building Data Acquired From Mobile Devices" (which includes disclosure of an example BICA system that is generally directed to obtaining and using linking information to inter-connect multiple panorama images acquired within one or more buildings or other structures), in U.S. Non-Provisional patent application Ser. No. 17/080,604, filed Oct. 26, 2020 and entitled "Generating Floor Maps For Buildings From Automated Analysis Of Visual Data Of The Buildings' Interiors"; and in U.S. Provisional Patent Application No. 63/035,619, filed Jun. 5, 2020 and entitled "Automated Generation On Mobile Devices Of Panorama Images For Buildings Locations And Subsequent Use"; each of which is incorporated herein by reference in its entirety.

In addition to generating such target panorama images, further analysis may be performed in at least some embodiments by the IIMIGM system (e.g., concurrently with the image acquisition activities or subsequent to the image acquisition) to determine layouts (e.g., room shapes and optionally locations of identified structural elements and other objects) for each of the rooms (and optionally for other defined areas, such as a deck or other patio outside of the building or other external defined area), including to optionally determine acquisition position information for each target image, and to further determine a floor plan for the building and any associated surrounding area (e.g., a lot or parcel on which the building is situated) and/or other related mapping information for the building (e.g., a 3D model of the building and any associated surrounding area, an inter-connected group of linked target panorama images, etc.). The overlapping features visible in the panorama images may be used in some situations to 'link' at least some of those panorama images and their acquisition locations together (with some corresponding directional lines 215 between example acquisition locations 210A-210C being shown for the sake of illustration), such as using the described techniques. FIG. 2I illustrates additional details about corresponding inter-image links that may be determined and used by the IIMIGM system, including in some embodiments and situations to further link at least some acquisition locations whose associated target images have little-to-no visual overlap with any other target image and/or to use other determined alignments to link two acquisition locations whose images do not include any overlapping visual coverage.

Additional details related to embodiments of a system providing at least some such functionality of an IIMIGM system or related system for generating floor plans and associated information and/or presenting floor plans and associated information are included in U.S. Non-Provisional patent application Ser. No. 16/190,162, filed Nov. 14, 2018 and entitled "Automated Mapping Information Generation From Inter-Connected Images" (which includes disclosure of an example Floor Map Generation Manager, or FMGM, system that is generally directed to automated operations for generating and displaying a floor plan or other floor plan of a building using images acquired in and around the building); in U.S. Non-Provisional patent application Ser. No. 16/681,787, filed Nov. 12, 2019 and entitled "Presenting Integrated Building Information Using Three-Dimensional Building Models" (which includes disclosure of an example FMGM system that is generally directed to automated operations for displaying a floor plan or other floor plan of a building and associated information); in U.S. Non-Provisional patent application Ser. No. 16/841,581, filed Apr. 6, 2020 and entitled "Providing Simulated Lighting Information For Three-Dimensional Building Models" (which includes disclosure of an example FMGM system that is generally directed to automated operations for displaying a floor plan or other floor plan of a building and associated information); in U.S. Non-Provisional patent application Ser. No. 17/080,604, filed Oct. 26, 2020 and entitled "Generating floor plans For Buildings From Automated Analysis Of Visual Data Of The Buildings' Interiors" (which includes disclosure of an example VTFM system that is generally directed to automated operations for generating a floor plan or other floor plan of a building using visual data acquired in and around the building); and in U.S. Non-Provisional patent application Ser. No. 16/807,135, filed Mar. 2, 2020 and entitled "Automated Tools For Generating Mapping Information For Buildings" (which includes disclosure of an example MIGM system that is generally directed to automated operations for generating a floor plan or other floor plan of a building using images acquired in and around the building); and in U.S. Non-Provisional patent application Ser. No. 17/069,800, filed Oct. 13, 2020 and entitled "Automated Tools For Generating Building Mapping Information" (which includes disclosure of an example MIGM system that is generally directed to automated operations for generating mapping information for a building using images acquired in and around the building); each of which is incorporated herein by reference in its entirety. Moreover, further details related to embodiments of a system providing at least some such functionality of a system for using acquired images and/or generated floor plans are included in U.S. Non-Provisional patent application Ser. No. 17/185,793, filed Feb. 25, 2021 and entitled "Automated Usability Assessment Of Buildings Using Visual Data Of Captured In-Room Images" (which includes disclosure of an example Building Usability Assessment Manager, or BUAM, system generally directed to automated operations for analyzing visual data from images acquired in building rooms to assess room layout and other usability information for the rooms and optionally for the overall building, and subsequently using the assessed usability information in one or more further automated manners); each of which is incorporated herein by reference in its entirety.

Various details are provided with respect to FIGS. 1A-1B, but it will be appreciated that the provided details are non-exclusive examples included for illustrative purposes, and other embodiments may be performed in other manners without some or all such details.

As noted above, in at least some embodiments and situations, some or all of the images acquired for a building may be panorama images that are each acquired at one of multiple acquisition locations in or around the building, such as to generate a panorama image at each such acquisition location from one or more of a video acquired at that acquisition location (e.g., a 360° video taken from a smartphone or other mobile device held by a user turning at that acquisition location), or multiple images acquired in multiple directions from the acquisition location (e.g., from a smartphone or other mobile device held by a user turning at that acquisition location; from automated rotation of a device at that acquisition location, such as on a tripod at that acquisition location; etc.), or a simultaneous acquisition of all the image information for a particular acquisition location (e.g., using one or more fisheye lenses), etc. It will be appreciated that such a panorama image may in some situations be presented using an equirectangular projection (with vertical lines and other vertical information in an environment being shown as straight lines in the projection, and with horizontal lines and other horizontal information in the environment being shown in the projection in a curved manner if they are above or below a horizontal centerline of the image and with an amount of curvature increasing as a distance from the horizontal centerline increases) and provide up to 360° coverage around horizontal and/or vertical axes (e.g., 360° of coverage along a horizontal plane and around a vertical axis), while in other embodiments the acquired panorama images or other images may include less than 360° of vertical coverage (e.g., for images with a width exceeding a height by more than a typical aspect ratio, such as at or exceeding 21:9 or 16:9 or 3:2 or 7:5 or 4:3 or 5:4 or 1:1, including for so-called 'ultrawide' lenses and resulting ultrawide images). In addition, it will be appreciated that a user viewing such a panorama image (or other image with sufficient horizontal and/or vertical coverage that only a portion of the image is displayed at any given time) may be permitted to move the viewing direction within the panorama image to different orientations to cause different subset images of the panorama image to be rendered, and that such a panorama image may in some situations be stored and/or presented using an equirectangular projection (including, if the panorama image is represented using an equirectangular projection, and if a particular subset image of it is being rendered, to convert the image being rendered into a planar coordinate system before it is displayed, such as into a perspective image). Furthermore, acquisition metadata regarding the acquisition of such panorama images may be obtained and used in various manners, such as data acquired from IMU sensors or other sensors of a mobile device as it is carried by a user or otherwise moved between acquisition locations—non-exclusive examples of such acquisition metadata may include one or more of acquisition time; acquisition location, such as GPS coordinates or other indication of location; acquisition direction and/or orientation; relative or absolute order of acquisition for multiple images acquired for a building or that are otherwise associated; etc., and such acquisition metadata may further optionally be used as part of determining the images' acquisition locations in at least some embodiments and situations, as discussed further below. Additional details are included below regarding automated operations of device(s) implementing an Image Capture and Analysis (ICA) system involved in acquiring images and optionally acquisition metadata, including with respect to FIGS. 1A-1B, 2A-2E and 4 and elsewhere herein.

As is also noted above, a building floor plan having associated room layout or shape information for some or all rooms of the building may be generated in at least some embodiments, and further used in one or more manners, such as in the subsequent automated determination of an additional image's acquisition location within the building. A building floor plan with associated room shape information may have various forms in various embodiments, such as a 2D (two-dimensional) floor map of the building (e.g., an orthographic top view or other overhead view of a schematic floor map that does not include or display height information) and/or a 3D (three-dimensional) or 2.5D (two and a half-dimensional) floor map model of the building that does display height information. In addition, layouts and/or shapes of rooms of a building may be automatically determined in various manners in various embodiments, including in some embodiments at a time before automated determination of a particular image's acquisition location within the building. For example, in at least some embodiments, an Inter-Image Mapping Information Generation Manager (IIMIGM) system may analyze various target images acquired in and around a building in order to automatically determine room shapes of the building's rooms (e.g., 3D room shapes, 2D room shapes, etc., such as to reflect the geometry of the surrounding structural elements of the building)—the analysis may include, for example, automated operations to 'register' the camera positions for the images in a common frame of refence so as to 'align' the images and to estimate 3D locations and shapes of objects in the room, such as by determining features visible in the content of such images (e.g., to determine the direction and/or orientation of the acquisition device when it took particular images, a path through the room traveled by the acquisition device, etc.) and/or by determining and aggregating information about planes for detected features and normal (orthogonal) directions to those planes to identify planar surfaces for likely locations of walls and other surfaces of the room and to connect the various likely wall locations (e.g., using one or more constraints, such as having 90° angles between walls and/or between walls and the floor, as part of the so-called 'Manhattan world assumption') and form an estimated partial room shape for the room. After determining the estimated partial room layouts and/or shapes of the rooms in the building, the automated operations may, in at least some embodiments, further include positioning the multiple room shapes together to form a floor plan and/or other related mapping information for the building, such as by connecting the various room shapes, optionally based at least in part on information about doorways and staircases and other inter-room wall openings identified in particular rooms, and optionally based at least in part on determined travel path information of a mobile computing device between rooms. Additional details are included below regarding automated operations of device(s) implementing an IIMIGM system involved in determining room shapes and combining room shapes to generate a floor plan, including with respect to FIGS. 1A-1B, 2E-2M and 5A-5B and elsewhere herein.

FIGS. 2A-2M illustrate examples of automated operations for analyzing visual data of images acquired in multiple rooms of a building to determine multiple types of building information (e.g., a floor plan for the building) based at least in part on using visual data of the images, and for generating and presenting information about the floor plan for the building, such as based on target images acquired within the building 198 of FIG. 1B.

In particular, FIG. 2A illustrates an example image 250a, such as a non-panorama perspective image acquired by one or more image acquisition devices in a northeasterly direction from acquisition location 210B in the living room of house 198 of FIG. 1B (or a northeasterly facing subset formatted in a rectilinear manner of a 360-degree panorama image taken from that acquisition location)—the directional indicator 109a is further displayed in this example to illustrate the northeasterly direction in which the image is taken. In the illustrated example, the displayed image includes several visible elements (e.g., light fixture 130a), furniture (e.g., chair 192), two windows 196-1, and a picture 194-1 hanging on the north wall of the living room. No passages into or out of the living room (e.g., doorways or other wall openings) are visible in this image. However, multiple room borders are visible in the image 250a, including horizontal borders between a visible portion of the north wall of the living room and the living room's ceiling and floor, horizontal borders between a visible portion of the east wall of the living room and the living room's ceiling and floor, and the inter-wall vertical border 195-2 between the north and east walls.

FIG. 2B continues the example of FIG. 2A, and illustrates an additional perspective image 250b acquired by the one or more image acquisition devices in a northwesterly direction from acquisition location 210B in the living room of house 198 of FIG. 1B (or a northwesterly facing subset formatted in a rectilinear manner of a 360-degree panorama image taken from that acquisition location)—directional indicator 109b is also displayed to illustrate a northwesterly direction in which the image is taken. In this example image, a small portion of one of the windows 196-1 continues to be visible, along with a portion of window 196-2 and a new lighting fixture 130b. In addition, horizontal and vertical room borders are visible in image 250b in a manner similar to that of FIG. 2A.

FIG. 2C continues the examples of FIGS. 2A-2B, and illustrates a third perspective image 250c acquired by the one or more image acquisition devices in a southwesterly direction in the living room of house 198 of FIG. 1B from acquisition location 210B (or a southwesterly facing subset formatted in a rectilinear manner of a 360-degree panorama image taken from that acquisition location)—directional indicator 109c is also displayed to illustrate a southwesterly direction in which the image is taken. In this example image, a portion of window 196-2 continues to be visible, as is a couch 191 and visual horizontal and vertical room borders in a manner similar to that of FIGS. 2A and 2B. This example image further illustrates a wall opening passage into/out of the living room, which in this example is doorway 190-1 to enter and leave the living room (which is an exterior door to the house's front yard, as shown in FIG. 1B). It will be appreciated various other perspective images may be acquired from acquisition location 210B and/or other acquisition locations.

FIG. 2D continues the examples of FIGS. 2A-2C, and illustrates further information for a portion of the house 198 of FIG. 1B, including the living room and limited portions of the hallway and a bedroom to the east of the living room (including doorway 190-3 between the hallway and the bedroom, visible through wall opening 263a between the living room and hallway, as well as structural wall elements of the living room that include the inter-wall borders 183-1 and 195-1 to 195-4, windows 196-1 to 196-3, etc.)—in particular, the information 250d illustrates a 360° target panorama image 250d acquired at acquisition location 210B, with the entire panorama image displayed using a straightened equirectangular projection format. As discussed with respect to FIGS. 1B and 2A-2C, in some embodiments, target panorama images may be acquired at various locations in the house interior, such as at location 210B in the living room, with corresponding visual contents of example target panorama image 250d subsequently used to determine a layout of at least the living room. In addition, in at least some embodiments, additional images may be acquired, such as if the one or more image acquisition devices (not shown) are acquiring video or one or more other sequences of continuous or near-continuous images as they move through the interior of the house.

FIG. 2E continues the examples of FIGS. 2A-2D, with FIG. 2E illustrating a further 360° target panorama image 250e acquired at acquisition location 210C, with the entire panorama image displayed using a straightened equirectangular projection format. As is shown, a portion of the living room is visible through wall opening 263a, including window 196-2, doorway 190-1, inter-wall borders 195-1 and 195-3, etc. In addition, the image 250e further illustrates additional portions of the hallway and dining room to the east of the hallway (through inter-wall opening 263b), as well as a small portion of the bedroom through doorway 190-3. In this example, portions of the rooms behind doorways 190-4 and 190-5 (a bathroom and second bedroom, respectively) are not visible due to the door in those doorways being closed.

FIG. 2F continues the examples of FIGS. 2A-2E, with FIG. 2F illustrating further information 255f that shows an example high-level overview of a flow of information processing during automated operations of the IIMIGM system in at least some embodiments. In particular, in the example of FIG. 2F, multiple panorama images 241 are first acquired for a building, such as to correspond to some or all of acquisition locations-210A-210P illustrated in FIG. 1B—some or all of the panorama images may, for example, be generated by an embodiment of the ICA system, or may instead be provided to the illustrated IIMIGM system 140 from one or more other sources.

In this example, after the multiple panorama images 241 are provided to the IIMIGM system, they are each optionally converted in step 281 to a straightened spherical projection format, such as if not already in that format, with the output of step 281 including the target images in straightened spherical projection format 242, which, after step 281 is completed, are further provided as input to step 282 as well as later step 287, although in other embodiments the steps 281 and 282 may instead be performed at least partially concurrently (such as for step 282 to begin the analysis of a first pair of images that have already been analyzed in step 281, while step 281 concurrently performs its processing for additional images).

After step 281 (or concurrently with step 281 once step 281 has analyzed at least two images), the operations of the IIMIGM system continue in step 282, which takes as input the target images in straightened spherical projection format 242, selects the next pair of images (referred to as images A and B for the sake of reference), beginning with a first pair, and uses a trained neural network to jointly determine multiple types of predicted building information for the room(s) visible in the images of the pair 282, based at least in part on per-image pixel column analysis of visual data of each of the images, and with the determined building information in this example including data 243 (e.g., probabilities for per-pixel column co-visibilities and angular correspondence matches and locations of structural elements, such as windows, doorways and non-doorway openings, inter-wall borders, etc., as well as per-pixel column wall boundary with the floor and/or the ceiling, optionally with associated uncertainty information), as discussed in greater detail elsewhere herein—in at least some such embodiments, the order in which pairs of images are considered may be random. After step 282, the operations of the IIMIGM system continue in step 283, where a combination of visual data of the two images of the pair is used to determine one or more additional types of building information for the room(s) visible in the images (e.g., a 2D and/or 3D structural layout for the room(s), inter-image pose information for the images, and in-room acquisition locations of the images within the structural layout, etc.), such as by using data 243 and generating corresponding output image pair information 244. The automated operations then continue to determine if there are more pairs of images to compare (e.g., until all pairs of images have been compared), and if so returns to step 282 to select a next pair of images to compare. Otherwise, the automated operations continue to determine whether the determined building information from the analysis of the visual data of the pairs of images is for use in identifying matching images for one or more indicated target images, and if so continues to step 284, where the data 243 and 244 for the various pairs of images is used to identify other images (if any) matching the indicated target image(s) according to one or more specified matching criteria, and to provide the identified other images. After step 284, or if it determined not to perform step 284, the routine continues to determine whether the determined building information from the analysis of the visual data of the pairs of images is for use in generating and providing feedback with respect to one or more indicated target images, and if so continues to step 285, where the data 243 and 244 for the various pairs of images is used to identify feedback based on visual overlap of the indicated target image(s) with other images according to one or more specified feedback criteria, and to provide the feedback. After step 285, or if it determined not to perform step 285, the routine continues to determine whether the determined building information from the analysis of the visual data of the pairs of images is for use in generating further mapping information (e.g., a floor plan) for the building(s) corresponding to the target images, and if not continues to step 286 to store the determined information 243 and 244 for later use, and otherwise continues to step 287 where the data 243 and 244 for the various pairs of images is combined to generate global inter-image pose information 246 for at least some of the target images (e.g., in a common coordinate system). In step 289, the automated operations then use the globally aligned panorama information 246 and the structural layout information 244 to generate a floor plan 249 for the building based on the visual data of the target images 241, optionally with indications on the floor plan of the acquisition locations of the target images 242 and/or of some or all of the other information determined in blocks 281-285.

FIGS. 2G-2M further illustrate examples of the various operations 281-289 discussed with respect to FIG. 2F. In particular, FIG. 2G continues the examples of FIGS. 2A-2F, and illustrates examples of various types of building information that is determined based on analysis of the visual data of two example panorama images 250g-a and 250g-b—while not illustrated with respect to the example panorama images 250d and 250e in FIGS. 2D and 2E, the same or similar types of information may be generated for that pair of images, as discussed further with respect to FIGS. 2H-2K. With respect to FIG. 2G, it includes information 255g that illustrates a pair of two example panorama images 250g-a and 250g-b in straightened equirectangular projection format, with various outputs 273-278 and 252 of the IIMIGM system being shown. In this example, each image has 360° of horizontal coverage, as illustrated by image angle information 271a and 271b for the images 250g-a and 250g-b, respectively, and the visual data of each of the images is separated into 512 pixel rows (not shown) and 1024 pixel columns, as illustrated by image pixel column information 272a and 272b, respectively—it will be appreciated that each image angle may correspond to one or more pixel columns.

Information 273 of FIG. 2G illustrates probabilistically predicted co-visibility data for the two images, including information 273a for image 250g-a and information 273b for image 250g-b. In this example, almost all of the visual data of each of the two images is co-visible with respect to the other image, such as based on the acquisition locations of the two images being in the same room and with at most minimal intervening obstructions or other occluding objects. For example, with respect to image 250g-a, most of the image pixel columns in information 273a are shown in white to indicate a 100% probability of co-visibility with image 250g-b, except for an area 273c shown in black to indicate a 0% probability of co-visibility for a small portion of the image 250g-a with visual data for a portion of another room through a doorway, and with the corresponding doorway in image 250g-b being shown at approximately a 90° angle from the acquisition location for that image such that the other room is not visible in image 250g-b. In other situations, the probability information for the co-visibility data may include intermediate values between 0% and 100%, in a manner analogous to that discussed below with respect to window location probabilities. In addition, information 274 of FIG. 2G illustrates probabilistically predicted image angular correspondence data for the two images, including information 274a for image 250g-a and information 274b for image 250g-b. In this example, to assist in illustrating matches in image angular correspondence data between the two images, a visual legend 279 is shown below each image (legend 279a for image 250g-a and legend 279b for image 250g-b) using a spectrum of colors (e.g., chosen randomly) to correspond to different image angles, and with the information in the image angular correspondence data for a first image of the pair using the pixel column legend color for the other second image of the pair to illustrate pixel columns in the first image that correspond to other pixel columns of the second image. For example, an image angular correspondence bar 252 is overlaid to show that example pixel column 270a of image 250g-a, which corresponds to just left of the middle of the window in the image, is given a color in the legend 279a of a mid-green shade 239a, with a corresponding image pixel column 270b of image 250g-b having been identified as including visual data for the same part of the surrounding room and thus having the same mid-green shade—it will be appreciated that since the image 250g-a has a smaller number of image pixel columns with visual data of the window than does image 250g-b, there are a larger number of image pixel columns in the image angular correspondence information 274b for image 250g-b that include the various shades of green corresponding to respective parts of the legend information 279a for image 250g-a. A second image angular correspondence bar 251 is similarly overlaid to illustrate one or more pixel columns of image 250g-a that have visual data whose color of a shade of magenta in the image angular correspondence data 274*a* corresponds to the same color 239*b* in the legend 279*b* for image 250*g-b*.

In addition, FIG. 2G further illustrates information 275 to correspond to a portion of the wall-floor boundary that is probabilistically predicted in each of the images and shown as a series of red arcs (including in this example to estimate the boundary for doorways and other areas in which a wall is not present or is not visible, such as behind the open doorway shown in image 250*g-b*), including information 275*a* for image 250*g-a* to show a portion of that image's wall-floor boundary, and information 275*b* for image 250*g-b* to show a portion of that image's wall-floor boundary. For example, with respect to image pixel column 270*a* in image 250*g-a*, an image pixel row 235*a* of image 250*g-a* is identified to correspond to the wall-floor boundary for that pixel column, and a image pixel row 235*b* of image 250*g-b* is similarly identified to correspond to the wall-floor boundary for image pixel column 270*b* of image 250*g-b*. Information 276, 277 and 278 is also shown to illustrate probabilistically predicted data for locations of windows, doorways, and non-doorway wall openings, respectively, including information 276*a*-278*a* of image 250*g-a* and information 276*b*-278*b* for image 250*g-b*. For example, with respect to window location probability information 276*a* for image 250*g-a*, information 236*a* illustrates the pixel columns of image 250*g-a* that are predicted to include visual data for the window, with the leftmost portion of the information 236*a* shown in gray to indicate a lower probability (e.g., due to the window shades partially obscuring the left end of the window) then the other portions of the information 236*a*—information 236*b* of window location probability data 276*b* for image 250*g-b* similarly shows the predicted window location information for that image. In a similar manner, the portions 237*a* of the doorway location probability information 277*a* of image 250*g-a* show the predicted locations of the two doorways visible in that image, and the corresponding portions 237*b* of the doorway location probability information 277*b* for image 250*g-b* show the predicted locations of the two doorways visible in that image. The portions 238*a* of the inter-wall border location probability information 278*a* of image 250*g-a* show the predicted locations of the four inter-wall borders visible in that image, and the corresponding portions 238*b* of the inter-wall border location probability information 278*b* of image 250*g-b* show the predicted locations of the four inter-wall borders visible in that image.

In addition to the per-image pixel column predicted types of building information 273-278, additional types of building information is determined based on a combination of the visual data of the two images, including structural layout information 275'*ab* based on the wall-floor boundary information 275 and inter-image pose information 252'*ab*, as illustrated as part of information 256*g* of FIG. 2G, and with pixel column indicators 252*a* and 252*b* shown for images 250*g-a* and 250*g-b*, respectively, to show the pixel column in each image that includes visual data in the direction of the other image. In this example, the structural layout information 275'*ab* is based on a combination of the boundary information 275*a* and 275*b* from images 250*g-a* and image 250*g-b*, respectively, and the inter-wall border probability information 278*a* and 278*b* from images 250*g-a* and image 250*g-b*, respectively, and is shown in the form of a two-dimensional room shape of the room in which the two images are acquired. Additional determined building information is shown on the structural layout 275'*ab*, including determined acquisition locations 250'*g-a* and 250'*g-b* for the images 250*g-a* and 250*g-b*, respectively, and indications of window locations 236'*ab*, doorway locations 237'*ab*, non-doorway wall opening locations 238'*ab* and inter-wall border locations 238'*ab*, with a corresponding legend 268 shown for reference. In this example, the two acquisition locations indicated on the structural layout further include indicators 251*a* and 251*b* to show the direction from that acquisition location to which the 0° portion of the image corresponds—in addition, for reference purposes, an indication of the direction 270'*a* is shown on the structural layout to indicate the pixel column 270*a* of image 250*g-a*. Each of the types of information labeled with an cab' in this example indicate a combination of data from the two images. In this example, scale information of various types is further determined for the room, including predicted values for room width length and height 269, a predicted value 252" for the distance between the two images' acquisition locations, and predicted distance value 270*a*' corresponding to the distance from image acquisition location 250'*g-a* to the wall shown in pixel column 270*a*. In addition, uncertainty information may exist with respect to any and/or all of the predicted types of building information, as illustrated in this example for the structural layout information 275'*ab* by uncertainty bands 268 corresponding to uncertainty about a location of a right side of the room—uncertainty information is not illustrated in this example for other types of determined building information or for other parts of the structural layout 275'*ab*. It will be appreciated that various other types of building information may be determined in other embodiments, and that building information types may be illustrated in other manners in other embodiments.

Figure 2M:
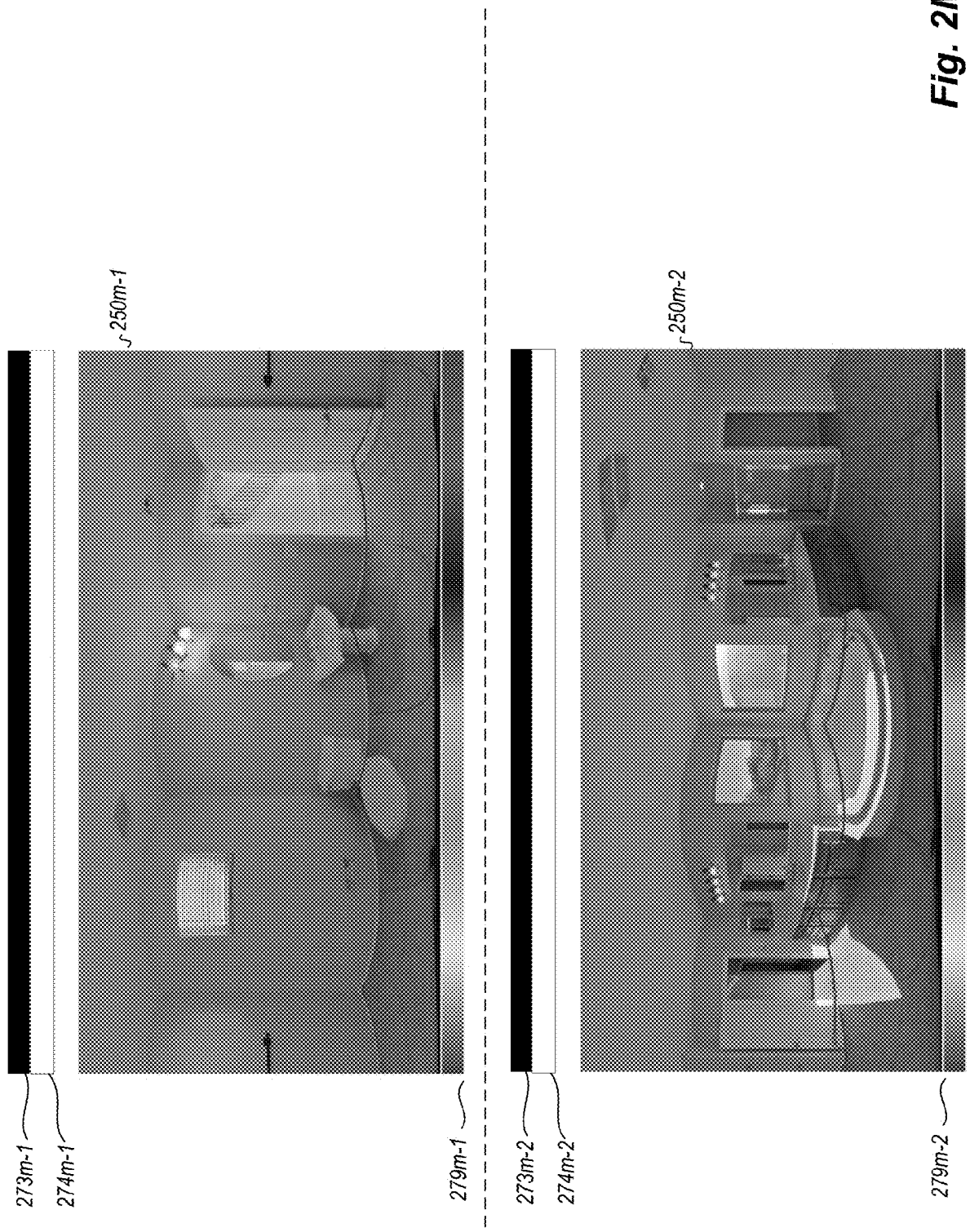

FIGS. 2L and 2M illustrate additional examples of pairwise analysis of visual data of two images in a manner similar to some of that of FIG. 2G, but with FIG. 2L corresponding to an example in which two images captured in different rooms have significant visual overlap (e.g., corresponding to over 80% of the image pixel columns having co-visibility with each other), and with FIG. 2M corresponding to an example having two images in different rooms but without any visual overlap. In particular, with respect to FIG. 2L, predicted co-visibility information 273*l-1* is shown for example image 250*l-1* and predicted co-visibility information 273*l-2* is shown for example image 250*l-2*, with most of the images' pixel columns being shown in white to indicate 100% predicted probability of co-visibility, and other pixel columns being shown in varying shades of gray or black to indicate varying predicted probabilities that are less than 100%. Similarly, color legend information 279*l-1* and 279*l-2* is shown for images 250*l-1* and 250*l-2*, respectively, with corresponding colors shown in the other image's predicted image angular correspondence information 274*l-1* and 274*l-2* for images 250*l-1* and 250*l-2*, respectively. In a similar manner in FIG. 2M, predicted co-visibility information 273*m-1* is shown for example image 250*m-1* and predicted co-visibility information 273*m-2* is shown for example image 250*m-2*, with most of the images' pixel columns being shown in white to indicate 100% predicted probability of co-visibility, and other pixel columns being shown in varying shades of gray or black to indicate varying predicted probabilities that are less than 100%. Similarly, color legend information 279*m-1* and 279*m-2* is shown for images 250*m-1* and 250*m-2*, respectively, with corresponding colors shown in the other image's predicted image angular correspondence information 274*m-1* and 274*m-2* for images 250*m-1* and 250*m-2*, respectively.

FIG. 2H continues the examples of FIGS. 2A-2G, and further illustrates information 256h that may result from pairwise alignment of the target panorama images 250d and 250e corresponding to acquisition locations 210B and 210C respectively, from pairwise alignment of the target panorama images 250e and 250h (shown in FIG. 2H) corresponding to acquisition locations 210C and 210D respectively, and from pairwise alignment of a target panorama image corresponding to acquisition location 210A (e.g., a panorama or non-panoramic image, not shown) and panorama image 250e corresponding to acquisition location 210B. In particular, as previously discussed with respect to images acquired at acquisition locations 210A-210C, pairwise analysis of those images may generate inter-image pose information that corresponds to link 215-AB (between acquisition locations 210A and 210B via pairwise analysis of the images acquired at those acquisition locations) and link 215-BC (between acquisition locations 210A and 210B via pairwise analysis of the images acquired at those acquisition locations), with those links displayed on a structural layout 260 corresponding to the living room that may be determined based at least in part on the pairwise analysis of the images acquired at acquisition locations 210A and 210B, with further indications on that structural layout of the positions of the windows 196-1 through 196-3, doorway 190-1 and wall opening 263a, as well as the acquisition locations 210A and 210B. The information 256h further illustrates a structural layout 262 corresponding to the hallway (e.g., based at least in part on a pairwise analysis of the target panorama images 250d and 250e corresponding to acquisition locations 210B and 210C), including the positions of doorways 190-3 through 1900-5 and the acquisition location 210C. Similarly, the information 256h further illustrates a structural layout 261 corresponding to the bedroom with doorway 190-3 (e.g., based at least in part on a pairwise analysis of the target panorama images 250e and 250h corresponding to acquisition locations 210C and 210D), including the positions of doorway 190-3, window 196-4 and the acquisition location 210D. The structural layouts for the three rooms are further fitted together in this example, such as based at least in part on positions and doorways and non-doorway wall openings. In this example embodiment, it is illustrated that walls of the living room and bedroom may not be fitted together perfectly with a resulting gap 264h, such as a gap that may be incorrect and result from an initial imperfect pairwise alignment from the limited visual overlap between panorama images 250e and 250h (e.g., to be later corrected during global alignment activities and/or generation of a final floor plan), or a gap that is correct and reflects a width of the wall between the living room and bedroom (i.e., the bedroom's western wall).

FIG. 2I continues the examples of FIGS. 2A-2H, and further illustrates information corresponding to step 287 of FIG. 2F, including information 256i that includes information resulting from aligning at least target panorama images 250d, 250e, 250g for acquisition locations 210B-210D and additional target images (not shown) for acquisition locations 210A and 210G together into a common coordinate system 205 (as shown using links 214-AB, 214-BC, 214-AC, 214-CD, 214-BG and 214-CG). FIG. 2I further illustrates that the automated operations of step 287 may include identifying other links 214 between the target panorama images for other acquisition locations 210E-210N, and may optionally include using other determined information to link two acquisition locations whose images do not include any overlapping visual coverage (e.g., link 213-EH shown between acquisition locations 210E and 210H) and/or further linking at least some acquisition locations whose associated target images have no visual overlap with any other target image (e.g., link 212-PB shown in FIG. 2I between acquisition locations 210P and 210B), such as based on a determination that the visual data of a target panorama image for acquisition location 210P corresponds to a front yard and includes a view of entry doorway 190-1 and that the entry doorway 190-1 of the living room shown in the target panorama image for acquisition location 210B is likely to lead to the front yard (such that the two doorways visible in the two panorama images correspond to the same doorway). In some embodiments, given relative measurements between pairs of acquisition locations of target panorama images, global inter-image pose information is generated for some or all of the target panorama images. For example, if a simple noise-free case existed, all of the measurements would agree with one another and could just be chained together, with a spanning tree of the resulting graph giving the global pose information by chaining transformations together. In actual cases with some measurements being noisy and incorrect, rotation averaging may be used to estimate rotations in a single common global coordinate system from pairwise relative rotations of the locally aligned pairwise information. As part of doing so, a series of cascaded cycle consistency checks may be used, including on translation directions in the common coordinate system frame if scale is known, to ensure that a cycle of three or more inter-connected acquisition locations (each having local pairwise alignment information) results in zero total translation in the cycle (e.g., with relative rotations in a cycle triplet of three acquisition locations should compose to the identity rotation). Additional details corresponding to example embodiments of generating such global alignment information are included in U.S. Provisional Patent Application No. 63/272,854, filed Oct. 28, 2021 and entitled "Automated Building Floor Plan Generation Using Visual Data Of Multiple Building Images"; which is incorporated herein by reference in its entirety.

FIGS. 2J-2K continue the examples of FIG. 2A-2I, and illustrate further mapping information that may be generated from the types of analyses discussed in FIGS. 2E-2I. In particular, FIG. 2J illustrates information 255j that includes an example floor plan 230j that may be constructed based on the described techniques, which in this example includes walls and indications of doorways and windows. In some embodiments, such a floor plan may have further information shown, such as about other features that are automatically detected by the analysis operations and/or that are subsequently added by one or more users. For example, floor plan 230j includes additional information of various types, such as may be automatically identified from analysis operations of visual data from images and/or from depth data, including one or more of the following types of information: room labels (e.g., "living room" for the living room), room dimensions, visual indications of fixtures or appliances or other built-in features, visual indications of positions of additional types of associated and linked information (e.g., of panorama images and/or perspective images acquired at specified acquisition positions, which an end user may select for further display; of audio annotations and/or sound recordings that an end user may select for further presentation; etc.), visual indications of doorways and windows, etc. —in other embodiments and situations, some or all such types of information may instead be provided by one or more IIMIGM system operator users and/or ICA system operator users. In addition, when the floor plan 230j is displayed to an end user, one or more user-selectable controls may be added to provide interactive functionality as part of a GUI (graphical user interface) screen 255j, such as to indicate a current floor that is displayed, to allow the end user to select a different floor to be displayed, etc., with a corresponding example user-selectable control 228 added to the GUI in this example—in addition, in some embodiments, a change in floors or other levels may also be made directly by user interactions with the displayed floor plan, such as via selection of a corresponding connecting passage (e.g., a stairway to a different floor), and other visual changes may be made directly from the displayed floor plan by selecting corresponding displayed user-selectable controls (e.g., to select a control corresponding to a particular image at a particular location, and to receive a display of that image, whether instead of or in addition to the previous display of the floor plan from which the image is selected). In other embodiments, information for some or all different floors may be displayed simultaneously, such as by displaying separate sub-floor plans for separate floors, or instead by integrating the room connection information for all rooms and floors into a single floor plan that is shown together at once. It will be appreciated that a variety of other types of information may be added in some embodiments, that some of the illustrated types of information may not be provided in some embodiments, and that visual indications of and user selections of linked and associated information may be displayed and selected in other manners in other embodiments. FIG. 2K continues the examples of FIGS. 2A-2J, and illustrates additional information 265k that may be generated from the automated analysis techniques disclosed herein and displayed (e.g., in a GUI similar to that of FIG. 2J), which in this example is a 2.5D or 3D model floor plan of the house. Such a model 265k may be additional mapping-related information that is generated based on the floor plan 230j, with additional information about height shown in order to illustrate visual locations in walls of features such as windows and doors, or instead by combined final estimated room shapes that are 3D shapes. While not illustrated in FIG. 2K, additional information may be added to the displayed walls in some embodiments, such as from acquired images (e.g., to render and illustrate actual paint, wallpaper or other surfaces from the house on the rendered model 265k), and/or may otherwise be used to add specified colors, textures or other visual information to walls and/or other surfaces, and/or other types of additional information shown in FIG. 2J (e.g., information about exterior areas and/or accessory structures) may be shown using such a rendered model.

Additional details related to embodiments of a system providing at least some such functionality of an IIMIGM system or related system for generating floor plans and associated information and/or presenting floor plans and associated information, and/or of a system providing at least some such functionality of an ILDM (Image Location Determination Manager) system for determining acquisition positions of images, are included in U.S. Non-Provisional patent application Ser. No. 16/190,162, filed Nov. 14, 2018 and entitled "Automated Mapping Information Generation From Inter-Connected Images" (which includes disclosure of an example Floor Map Generation Manager, or FMGM, system that is generally directed to automated operations for generating and displaying a floor map or other floor plan of a building using images acquired in and around the building); in U.S. Non-Provisional patent application Ser. No. 16/681, 787, filed Nov. 12, 2019 and entitled "Presenting Integrated Building Information Using Three-Dimensional Building Models" (which includes disclosure of an example FMGM system that is generally directed to automated operations for displaying a floor map or other floor plan of a building and associated information); in U.S. Non-Provisional patent application Ser. No. 16/841,581, filed Apr. 6, 2020 and entitled "Providing Simulated Lighting Information For Three-Dimensional Building Models" (which includes disclosure of an example FMGM system that is generally directed to automated operations for displaying a floor map or other floor plan of a building and associated information); in U.S. Non-Provisional patent application Ser. No. 17/080, 604, filed Oct. 26, 2020 and entitled "Generating Floor Maps For Buildings From Automated Analysis Of Visual Data Of The Buildings' Interiors" (which includes disclosure of an example Video-To-Floor Map, or VTFM, system that is generally directed to automated operations for generating a floor map or other floor plan of a building using video data acquired in and around the building); in U.S. Provisional Patent Application No. 63/035,619, filed Jun. 5, 2020 and entitled "Automated Generation On Mobile Devices Of Panorama Images For Buildings Locations And Subsequent Use"; in U.S. Non-Provisional patent application Ser. No. 17/069,800, filed Oct. 13, 2020 and entitled "Automated Tools For Generating Building Mapping Information"; in U.S. Non-Provisional patent application Ser. No. 16/807, 135, filed Mar. 2, 2020 and entitled "Automated Tools For Generating Mapping Information For Buildings" (which includes disclosure of an example MIGM system that is generally directed to automated operations for generating a floor map or other floor plan of a building using images acquired in and around the building); in U.S. Non-Provisional patent application Ser. No. 17/013,323, filed Sep. 4, 2020 and entitled "Automated Analysis Of Image Contents To Determine The Acquisition Location Of The Image" (which includes disclosure of an example Image Location Mapping Manager, or ILMM, system that is generally directed to automated operations for determining acquisition positions of images); in U.S. Non-Provisional patent application Ser. No. 17/150,958, filed Jan. 15, 2021 and entitled "Automated Determination Of Image Acquisition Locations In Building Interiors Using Multiple Data Capture Devices" (which includes disclosure of an example Image Location Determination Manager, or ILDM, system that is generally directed to automated operations for determining room shapes and acquisition positions of images); and in U.S. Provisional Patent Application No. 63/117,372, filed Nov. 23, 2020 and entitled "Automated Determination Of Image Acquisition Locations In Building Interiors Using Determined Room Shapes" (which includes disclosure of an example Mapping Information Generation Manager, or MIGM, system that is generally directed to automated operations for determining acquisition positions of images); each of which is incorporated herein by reference in its entirety. In addition, further details related to embodiments of a system providing at least some such functionality of a system for using acquired images and/or generated floor plans are included in U.S. Non-Provisional patent application Ser. No. 17/185,793, filed Feb. 25, 2021 and entitled "Automated Usability Assessment Of Buildings Using Visual Data Of Captured In-Room Images" (which includes disclosure of an example Building Usability Assessment Manager, or BUAM, system that is generally directed to automated operations for analyzing visual data from images captured in rooms of a building to assess room layout and other usability information for the building's rooms and optionally for the overall building, and to subsequently using the assessed usability information in one or more further automated manners); which is incorporated herein by reference in its entirety.

In one non-exclusive example embodiment, the IIMIGM system may perform automated operations to determine, for a pair of panorama images ("panoramas"), 1) whether or not the two panoramas see the same wall structure, 2) what visual correspondences exist, 3) the wall structure and wall features (e.g., doors/windows) visible to both panoramas, and 4) the position of one panorama with respect to the coordinate system of the other, such as by jointly estimating these quantities from a single trained neural network in order to improve the performance of each single task through mutually beneficial context, as well as to simplify and speed up the extraction of the necessary information.

As part of the automated operations of this example embodiment, the neural network accepts a pair of straightened spherical panoramic images (e.g., captured by a camera device in which the camera axis is aligned with the vertical axis), which may or may not share the same space (i.e., may or may not, share visual overlap)—if the image is straightened, and provided walls are also vertically aligned, the wall depth is then a single shared value for a given image column. The neural network then estimates multiple quantities for each column of each image. In other embodiments and/or situations, other types of images may be received as input, such as images of different projections with unknown field-of-view (FOV) angle (e.g., perspective images from a pinhole camera), a partial panoramic image with equirectangular image projection or cylindrical image projection, images with RGB pixel data and/or other data channels (e.g., depth, synthetic aperture radar, etc.).

Types of determined building information may include the following:

for each image pixel column in one panorama, the probability that the other panorama includes the image content in the pixel column;

for each image pixel column in one panorama, the line-of-sight angle in the other panorama that includes the same image content (if any, only valid if co-visible)—as one example, in a 512×1024-pixel equirectangular panoramic image, each of the 1024 image columns corresponds to a specific angle (angular band with mean value) in the total 360-degree spherical FOV, and the image angular correspondence information for each image pixel column in one panorama may include zero or one or more image pixel columns in the other panorama;

for each image pixel column in one panorama, the vertical line-of-sight angle from which the floor-wall boundary is visible. With a known camera height, and by intersecting the vertical line-of-sight with the floor plane, this is equivalent to the wall depth in a given image column;

for each image pixel column in a panorama, the probability that a door, window, or wall-wall border junction is visible in the pixel column; and in addition to these column-wise outputs indicated above, two additional quantities may be jointly estimated, including inter-image relative pose (e.g., a 2D translation vector, which may be factored into the product of a unit directional vector and a scale factor, and a 2D orientation (rotation) vector of the second panorama relative to the first); and a segmentation mask of combined visible geometry for both panoramas (e.g., by projecting the floor boundary contours indicated above for each panorama into the floor plane to produce visible floor segmentations from each perspective, which may then be jointly refined to produce a combined visible floor segmentation, from which a room layout polygon can be extracted).

In addition, regression targets of the IIMIGM system in this example embodiment (e.g., image correspondence angles, boundary contour angles, and relative pose), may be learned directly using mean-squared error (L2 norm), or mean absolute error (L1 norm) loss functions; however, in addition to the target value (the predicted mean), the trained neural network also predicts a standard deviation, with the predicted mean and standard deviation values then defining a normal probability distribution that in turn induces a negative log-likelihood loss function used to learn the regression targets, and with the learned standard deviation value able to be used as a measure of uncertainty (e.g., to indicate to what extent the network's prediction should be trusted). Further, this loss formulation allows the network to widen the standard deviation for difficult examples, and tighten the standard deviation for easy examples, which adjusts the importance of instance-specific error during training. This error adjusting scheme can provide a better signal to train the model.

As part of the automated operations of the IIMIGM system in this example embodiment, each image is passed through the same feature extractor, which applies multiple convolutional layers to extract features at multiple scales, which are then reshaped and concatenated to produce column-wise image features. The resultant features are then considered as two column-wise sequences and input to a transformer module for processing—such extracted features for an image may further be used as part of an image feature embedding vector to represent the image for later inter-image comparison (e.g., as part of a search for one or more other images that have a degree of match to a target image that satisfies a defined threshold), as discussed further below. As transformers process all sequence elements in parallel, without any inherent consideration of order, two embeddings are added to the image column feature sequences, as follows: positional embeddings (e.g., to encode sequence position, such as which image column a given sequence element corresponds to); and segment embeddings (e.g., to encode image membership, such as which image a given sequence element belongs to). The transformer encoder may include multiple blocks, each with a fixed layer structure. After adding the positional and segment embeddings to the column-wise image feature sequences, the sequences are concatenated length-wise and input to the first of the transformer encoder blocks. In each block, first a multi-headed layer of self attention is applied. The input sequence is mapped to Queries, Keys, and Values, and the scaled dot product attention, which is a function of the Queries and Keys, is used to create weights for an attention-weighted sum of the Values. In this way, for a given sequence position, the model can assess relevance of information at any other position in the input sequences; both intra and inter-image attention is applied. After the attention layer, a feedforward layer maps the results to the output. After both the attention and feed forward layers, the input sequence is added to the output sequence in the form of a skip connection, which allows information from the input to propagate directly unaffected to the output, and then a normalization is applied to the output to normalize the sample statistics. After the last transformer encoder block, a new sequence is output. From this sequence, either linear or convolutional layers can be used to predict the final column wise outputs, as well as the directly regressed relative pose, from the sequence that is produced by the transformer encoder. For joint estimation of the floor segmentation, first the floor boundary contour segmentations are produced. The floor segmentation of a first of the panoramas of a pair can then be projected based on the estimated pose to align with the other panorama's segmentation. The image features from both panoramas can then undergo a perspective projection to extract features from the floor and/or ceiling view. The first panorama image's image features can then be processed with a learned affine transformation conditioned on the estimated pose. Finally, the floor segmentations and the processed features can be concatenated, and a final joint floor segmentation produced via a block of convolutional layers.

In addition to direct pose regression learning as described above, the angular correspondence, co-visibility, and boundary contour can alternatively be used to derive the relative pose in a subsequent post-processing step. Together these three outputs emit point correspondences in the 2D floor plane, which can be used to optimize for relative pose rotation and translation through singular value decomposition, or through a RANSAC process. First, the process of deriving bi-directional point correspondences from the three column-wise outputs is as follows. For a given image pixel column in each panorama, the x,y coordinates (in the panorama's local coordinate system) of the wall boundary visible in this image column by projecting the boundary position from image coordinates to the floor plane using a known camera height. In combination, all image columns then produce a point cloud in the x,y plane, for each image. Where the predicted co-visibility is high, the predicted angular correspondences can then be used to match points in the point clouds of the two panoramas, resulting in two point clouds each in their local coordinate system, with point correspondences/matches between them. For each point, the trained neural network will generate an uncertainty score, which conveys the network's confidence in the prediction. The rotation and translation can then be directly solved for, using singular value decomposition-based rigid registration, or, can be used in a RANSAC routine. In singular value decomposition-based rigid registration, the uncertainty score can be used to weight the corresponding points. In other words, different points will have different importance in deriving the relative pose. In the iterative RANSAC process, at each iteration, two point pairs are randomly selected according to a probability. This probability is determined by the uncertainty scores of these two points. The points with low uncertainty score will have a high probability to be selected. From these two point correspondences a candidate rotation and translation can be derived. Once this R,t is applied to align the two panoramas' point clouds, a proximity-based point matching can be determined, and from this matching, the number of inliers and outliers can be determined to assess the pose goodness-of-fit. After multiple iterations, the matching from the candidate pose that resulted in the highest number of inliers can be used to do a final refinement to get the final RANSAC-based pose. Thus, three ways to extract relative pose are possible, as follows: direct pose regression as a model output; singular value decomposition (SVD)-based pose regression from point correspondences; and RANSAC-based pose regression from point correspondences.

Using joint prediction from a pair of images provides benefits with respect to attempts to do predictions from a single image, such as that occlusion and relative viewing position between camera and wall features in a single image may cause some wall features to have little-or-no field of view coverage from the single image, and are thus difficult to detect. Instead, by using image angular correspondence model output, column-wise matching between the panoramas of a pair exists, and based on the order of columns in one panorama, the column-wise feature corresponding to each image column in the other panorama can be resampled and reordered. After the column reorder, the re-shuffled features from one panorama will represent the similar image content as the other panorama at each column position, and the original column-wise feature from one panorama can be concatenated with reshuffled column-wise features of the other panorama at a per column level. A convolution layer and max pooling layer can then be used to eventually classify the types of each image column at one panorama (e.g., border, window, doorway, non-doorway wall opening, etc.) or to regress the per-column image depth at the one panorama, so as to fuse the information from 2 views together using image content from one panorama to enhance the prediction in the other panorama.

When run pair-wise on all target panoramas for a building, the co-visibility output can be used to cluster groups of panoramas as follows: for each pair, the resultant co-visibility can be aggregated into a score by taking the mean co-visible FOV fraction over the two images. This score then summarizes whether or not two panoramas share the same space, as well as the extent of the visual overlap. This pairwise information may then be used to aggregate panoramas into a connected component based on visual connectivity, e.g., if a given panorama has a co-visibility score greater than some threshold with any other panorama in an existing cluster, this panorama is then added into the cluster. By growing clusters in this way, connected component pose graphs are formed, with relative poses defined along edges between pairs of panoramas. Within each of these clusters, global coordinate systems can be derived by iteratively combining panoramas together in a greedy fashion based on the relative pose confidence, e.g., from the number of inliers computed on the registered point clouds, or from some learned confidence on the directly estimated pose or per-column wall depth/angular correspondence. As poor quality relative poses may result in poor global coordinates, outlier relative poses may be suppressed using e.g., cycle consistency by applying relative poses sequentially along connected triplets and checking rotational/positional agreement between start and end-point. Finally pose graph optimization may be applied to refine the global coordinate system accuracy, using the outlier-suppressed set of relative poses as constraints.

The outputs of the IIMIGM system of the example embodiments provide a variety of benefits and may be used in various manners. One example includes estimating the relative pose of one panorama to another, which may be considered to differ from prior approaches that perform image feature point matching in which a pose is conditioned on geometry—in contrast to such prior approaches, the IIMIGM system of the example embodiment may produce robust image content matching regardless of the amount of overlapping visual data between two images, as well as produce reliable feature matching for input images with mostly repetitive patterns or with a scarcity of salient features. Such prior approaches (e.g., image salient feature matching) have a higher level of requirement on the amount of similar contents between input images in order to produce robust matching features between two images. In addition, the structural features (e.g., for walls, inter-wall borders, and wall boundaries) predicted from combining visual data from two different acquisition locations may be higher quality compared to similar quantities that are attempted to be estimated with information from a single acquisition location alone. For example, if a first panorama of a pair has a better viewpoint of certain wall structure than the second panorama of the pair, the information provided by this first panorama can improve the quality of the geometry estimated from the second panorama. Thus, the visible wall geometry estimated from both acquisition locations can be combined and refined, either through projection to segmentation maps and processing through a series of convolutional layers, or via a post-processing step to integrate the information from each acquisition location, in order to generate a combined visible geometry, with wall features and layout, which can enable estimation of wall features and layout for larger spaces which may be only partially visible from any single acquisition location.

As one example use of outputs of the IIMIGM system, co-visibility data and/or image angular correspondence data can be used for guiding the acquisition of images (e.g., for use in generation of mapping information such as floor plans and/or virtual tours of linked images), such as to ensure that newly acquired images are visually overlapping with previously acquired images, to provide good transitions for generation of mapping information. For example, an ICA system and/or other image acquisition system can suggest missing connectivity between a newly captured image and existing images, or reject the newly acquired image. Furthermore, image angular correspondence data and inter-image pose data can determine an acquisition location of each image (e.g., within a surrounding structural layout) once a newly acquired image is obtained, and an image acquisition system can suggest one or more new acquisition locations at which to acquire one or more additional images that will improve the co-visibility among images. Thus, as a user acquires each new image, the IIMIGM system may determine co-visibility data and/or image angular correspondence data between the new image (or multiple new images) and the existing images to produce live acquisition feedback (e.g., in a real-time or near-real-time manner). To increase the speed of the image matching process, image embedding extraction and image embedding matching can be decoupled, such as to extract and store image feature embedding features for at least some images (e.g., that can be compared to quickly determine a degree of match between two images based on a degree of match between the two images' image feature embedding vectors), and with the image feature extraction performed only once per image even if the image is used for image matching as part of multiple different image pairs.

Various details have been provided with respect to FIGS. 2A-2M, but it will be appreciated that the provided details are non-exclusive examples included for illustrative purposes, and other embodiments may be performed in other manners without some or all such details.

Figure 3:
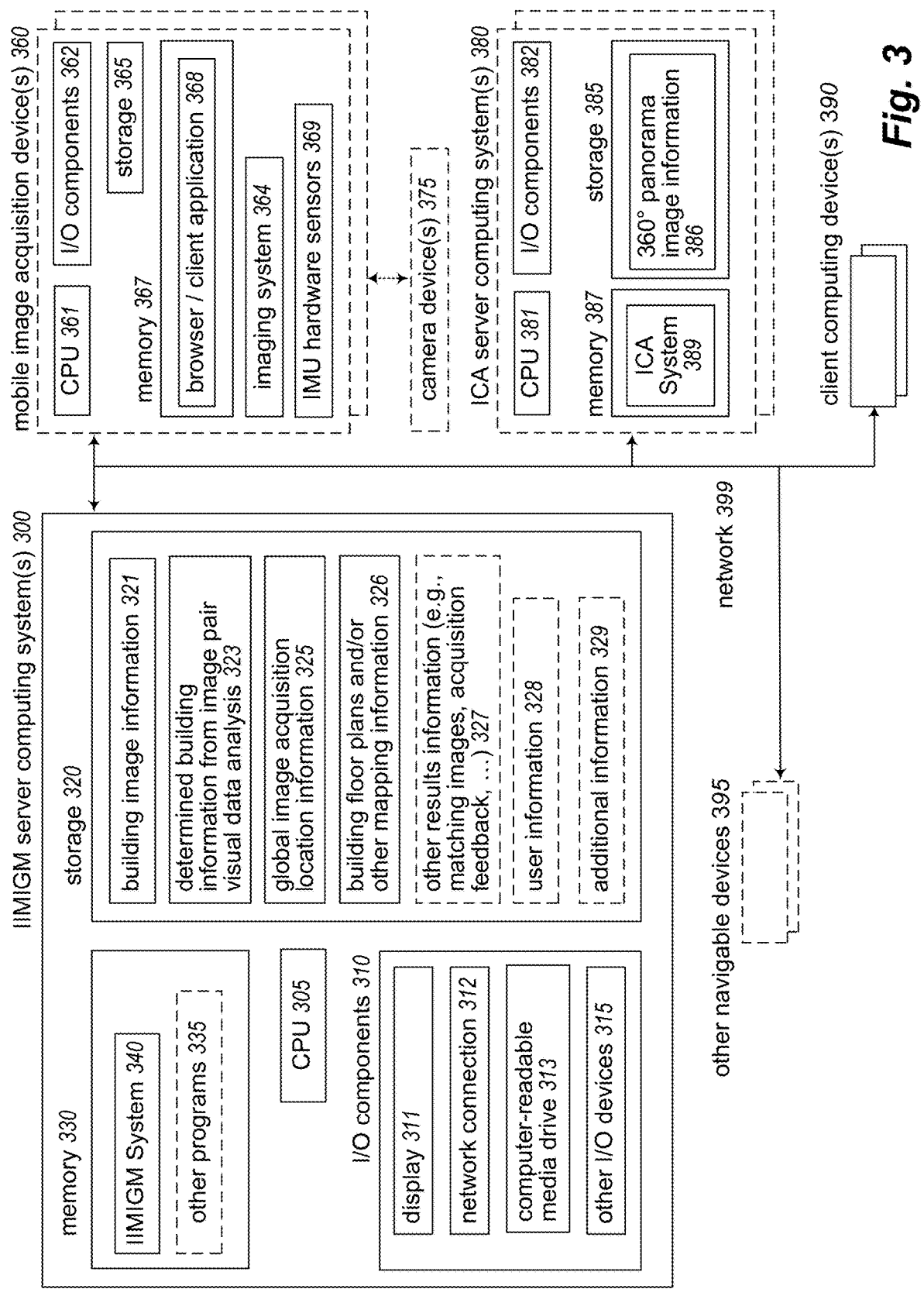
FIG. 3 is a block diagram illustrating computing systems suitable for executing embodiments of one or more systems that perform at least some of the techniques described in the present disclosure.

FIG. 3 is a block diagram illustrating an embodiment of one or more server computing systems 300 executing an implementation of an IIMIGM system 340, and one or more server computing systems 380 executing an implementation of an ICA system 389—the server computing system(s) and IIMIGM system may be implemented using a plurality of hardware components that form electronic circuits suitable for and configured to, when in combined operation, perform at least some of the techniques described herein. In the illustrated embodiment, each server computing system 300 includes one or more hardware central processing units ("CPU") or other hardware processors 305, various input/output ("I/O") components 310, storage 320, and memory 330, with the illustrated I/O components including a display 311, a network connection 312, a computer-readable media drive 313, and other I/O devices 315 (e.g., keyboards, mice or other pointing devices, microphones, speakers, GPS receivers, etc.). Each server computing system 380 may include hardware components similar to those of a server computing system 300, including one or more hardware CPU processors 381, various I/O components 382, storage 385 and memory 386, but with some of the details of server 300 being omitted in server 380 for the sake of brevity.

The server computing system(s) 300 and executing IIMIGM system 340 may communicate with other computing systems and devices via one or more networks 399 (e.g., the Internet, one or more cellular telephone networks, etc.), such as user client computing devices 390 (e.g., used to view floor plans, associated images and/or other related information), ICA server computing system(s) 380, one or more mobile computing devices 360 and optionally one or more camera devices 375 (e.g., for use as image acquisition devices), optionally other navigable devices 395 that receive and use floor plans and optionally other generated information for navigation purposes (e.g., for use by semi-autonomous or fully autonomous vehicles or other devices), and optionally other computing systems that are not shown (e.g., used to store and provide additional information related to buildings; used to acquire building interior data; used to store and provide information to client computing devices, such as additional supplemental information associated with images and their encompassing buildings or other surrounding environment; etc.). In some embodiments, some or all of the one or more camera devices 375 may directly communicate (e.g., wirelessly and/or via a cable or other physical connection, and optionally in a peer-to-peer manner) with one or more associated mobile computing devices 360 in their vicinity (e.g., to transmit acquired target images, to receive instructions to initiate a target image acquisition, etc.), whether in addition to or instead of performing communications via network 399, and with such associated mobile computing devices 360 able to provide acquired target images and optionally other acquired data that is received from one or more camera devices 375 over the network 399 to other computing systems and devices (e.g., server computing systems 380 and/or 300).

In the illustrated embodiment, an embodiment of the IIMIGM system 340 executes in memory 330 in order to perform at least some of the described techniques, such as by using the processor(s) 305 to execute software instructions of the system 340 in a manner that configures the processor(s) 305 and computing system(s) 300 to perform automated operations that implement those described techniques. The illustrated embodiment of the IIMIGM system may include one or more components, not shown, to each perform portions of the functionality of the IIMIGM system, and the memory may further optionally execute one or more other programs 335—as one example, one of the other programs 335 may include an executing copy of the ICA system in at least some embodiments (such as instead of or in addition to the ICA system 389 executing in memory 387 on the server computing system(s) 380) and/or may include an executing copy of a system for accessing building information (e.g., as discussed with respect to client computing devices 175 and the routine of FIG. 6). The IIMIGM system 340 may further, during its operation, store and/or retrieve various types of data on storage 320 (e.g., in one or more databases or other data structures), such as information 321 about target panorama images (e.g., acquired by one or more camera devices 375), information 323 about multiple types of determined building information from the target panorama images (e.g., locations of walls and other structural elements, locations of structural wall elements, image acquisition pose information, co-visibility information, image angular correspondence information, etc.), information 325 about globally aligned image acquisition location information, various types of floor plan information and other building mapping information 326 (e.g., generated and saved 2D floor plans with 2D room shapes and positions of wall elements and other elements on those floor plans and optionally additional information such as building and room dimensions for use with associated floor plans, existing images with specified positions, annotation information, etc.; generated and saved 2.5D and/or 3D model floor plans that are similar to the 2D floor plans but further include height information and 3D room shapes; etc.), optionally other types of results information 327 from the IIMIGM system (e.g., matching images with respect to one or more indicated target images, feedback during an image acquisition session with respect to one or more indicated target images acquired during the image acquisition session, etc.), optionally user information 328 about users of client computing devices 390 and/or operator users of mobile devices 360 who interact with the IIMIGM system, optionally training data for use with one or more neural networks used by the IIMIGM system and/or the resulting trained neural network(s) (not shown), and optionally various other types of additional information 329. The ICA system 389 may similarly store and/or retrieve various types of data on storage 385 (e.g., in one or more databases or other data structures) during its operation and provide some or all such information to the IIMIGM system 340 for its use (whether in a push and/or pull manner), such as images 386 (e.g., 360° target panorama images acquired by one or more camera devices 375 and transferred to the server computing systems 380 by those camera devices and/or by one or more intermediate associated mobile computing devices 360), and optionally various types of additional information (e.g., various analytical information related to presentation or other use of one or more building interiors or other environments acquired by an ICA system, not shown).

Some or all of the user client computing devices 390 (e.g., mobile devices), mobile computing devices 360, camera devices 375, other navigable devices 395 and other computing systems may similarly include some or all of the same types of components illustrated for server computing systems 300 and 380. As one non-limiting example, the mobile computing devices 360 are each shown to include one or more hardware CPU(s) 361, I/O components 362, storage 365, imaging system 364, IMU hardware sensors 369, optionally depth sensors (not shown), and memory 367, with one or both of a browser and one or more client applications 368 (e.g., an application specific to the IIMIGM system and/or ICA system) optionally executing within memory 367, such as to participate in communication with the IIMIGM system 340, ICA system 389, associated camera devices 375 and/or other computing systems. While particular components are not illustrated for the other navigable devices 395 or client computing systems 390, it will be appreciated they may include similar and/or additional components.

It will also be appreciated that computing systems 300 and 380 and camera devices 375 and the other systems and devices included within FIG. 3 are merely illustrative and are not intended to limit the scope of the present invention. The systems and/or devices may instead each include multiple interacting computing systems or devices, and may be connected to other devices that are not specifically illustrated, including via Bluetooth communication or other direct communication, through one or more networks such as the Internet, via the Web, or via one or more private networks (e.g., mobile communication networks, etc.). More generally, a device or other computing system may comprise any combination of hardware that may interact and perform the described types of functionality, optionally when programmed or otherwise configured with particular software instructions and/or data structures, including without limitation desktop or other computers (e.g., tablets, slates, etc.), database servers, network storage devices and other network devices, smart phones and other cell phones, consumer electronics, wearable devices, digital music player devices, handheld gaming devices, PDAs, wireless phones, Internet appliances, camera devices and accessories, and various other consumer products that include appropriate communication capabilities. In addition, the functionality provided by the illustrated IIMIGM system 340 may in some embodiments be distributed in various components, some of the described functionality of the IIMIGM system 340 may not be provided, and/or other additional functionality may be provided.

It will also be appreciated that, while various items are illustrated as being stored in memory or on storage while being used, these items or portions of them may be transferred between memory and other storage devices for purposes of memory management and data integrity. Alternatively, in other embodiments some or all of the software components and/or systems may execute in memory on another device and communicate with the illustrated computing systems via inter-computer communication. Thus, in some embodiments, some or all of the described techniques may be performed by hardware means that include one or more processors and/or memory and/or storage when configured by one or more software programs (e.g., by the IIMIGM system 340 executing on server computing systems 300) and/or data structures, such as by execution of software instructions of the one or more software programs and/or by storage of such software instructions and/or data structures, and such as to perform algorithms as described in the flow charts and other disclosure herein. Furthermore, in some embodiments, some or all of the systems and/or components may be implemented or provided in other manners, such as by consisting of one or more means that are implemented partially or fully in firmware and/or hardware (e.g., rather than as a means implemented in whole or in part by software instructions that configure a particular CPU or other processor), including, but not limited to, one or more application-specific integrated circuits (ASICs), standard integrated circuits, controllers (e.g., by executing appropriate instructions, and including microcontrollers and/or embedded controllers), field-programmable gate arrays (FPGAs), complex programmable logic devices (CPLDs), etc. Some or all of the components, systems and data structures may also be stored (e.g., as software instructions or structured data) on a non-transitory computer-readable storage mediums, such as a hard disk or flash drive or other non-volatile storage device, volatile or non-volatile memory (e.g., RAM or flash RAM), a network storage device, or a portable media article (e.g., a DVD disk, a CD disk, an optical disk, a flash memory device, etc.) to be read by an appropriate drive or via an appropriate connection. The systems, components and data structures may also in some embodiments be transmitted via generated data signals (e.g., as part of a carrier wave or other analog or digital propagated signal) on a variety of computer-readable transmission mediums, including wireless-based and wired/cable-based mediums, and may take a variety of forms (e.g., as part of a single or multiplexed analog signal, or as multiple discrete digital packets or frames). Such computer program products may also take other forms in other embodiments. Accordingly, embodiments of the present disclosure may be practiced with other computer system configurations.

Figure 4:
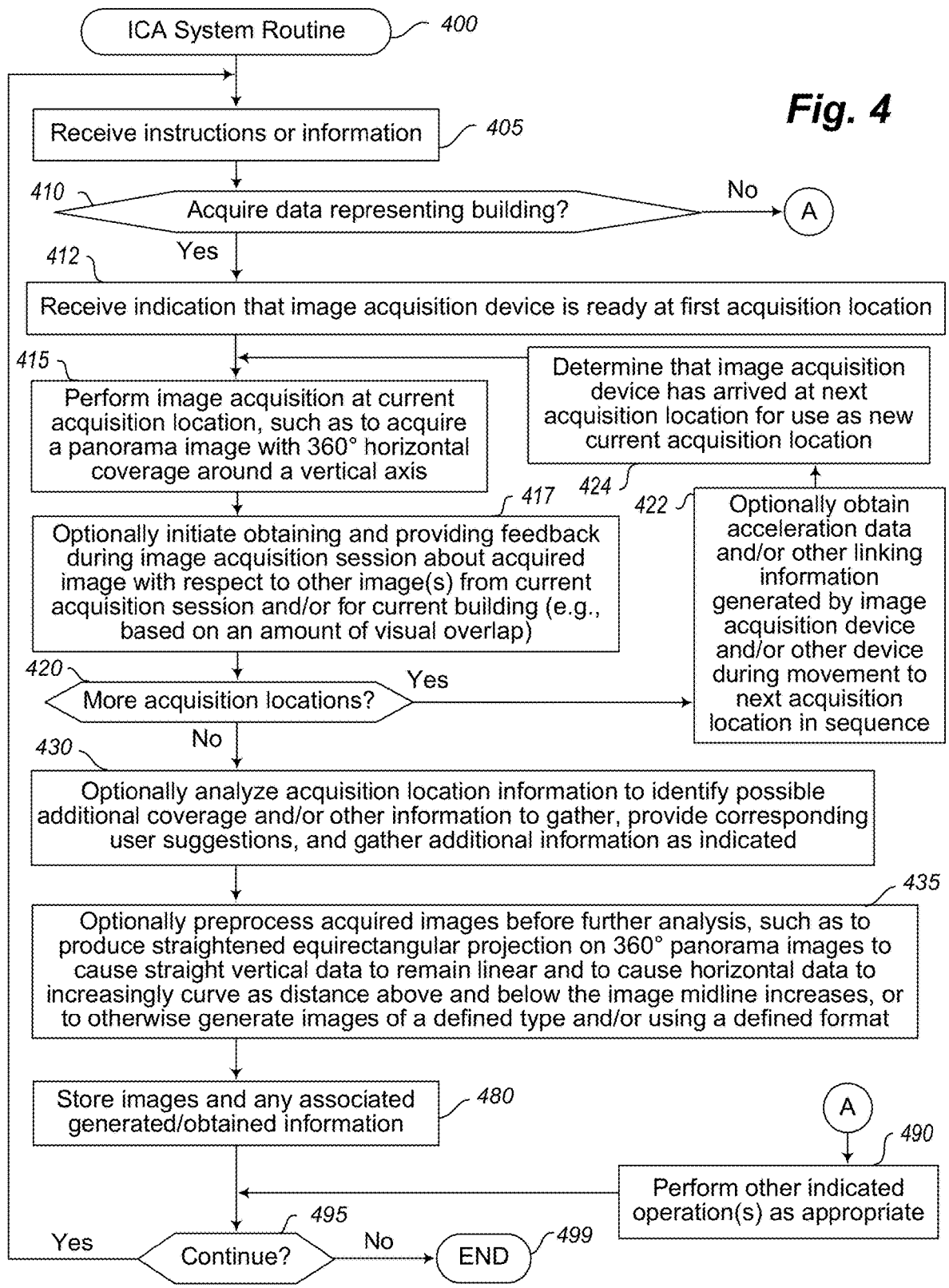
FIG. 4 illustrates an example flow diagram for an Image Capture and Analysis (ICA) system routine in accordance with an embodiment of the present disclosure.

FIG. 4 illustrates an example flow diagram of an embodiment of an ICA System routine 400. The routine may be performed by, for example, the ICA system 160 of FIG. 1A, the ICA system 389 of FIG. 3, and/or an ICA system as otherwise described herein, such as to acquire 360° target panorama images and/or other images within buildings or other structures (e.g., for use in subsequent generation of related floor plans and/or other mapping information, such as by an embodiment of an IIMIGM system routine, with one example of such a routine illustrated with respect to FIGS. 5A-5B; for use in subsequent determination of acquisition locations and optionally acquisition orientations of the target images; etc.). While portions of the example routine 400 are discussed with respect to acquiring particular types of images at particular locations, it will be appreciated that this or a similar routine may be used to acquire video or other data (e.g., audio) and/or other types of images that are not panoramic, whether instead of or in addition to such panorama images. In addition, while the illustrated embodiment acquires and uses information from the interior of a target building, it will be appreciated that other embodiments may perform similar techniques for other types of data, including for non-building structures and/or for information external to one or more target buildings of interest. Furthermore, some or all of the routine may be executed on a mobile device used by a user to participate in acquiring image information and/or related additional data, and/or by a system remote from such a mobile device.

The illustrated embodiment of the routine begins at block 405, where instructions or information are received. At block 410, the routine determines whether the received instructions or information indicate to acquire data representing a building (e.g., in the building interior), and if not continues to block 490. Otherwise, the routine proceeds to block 412 to receive an indication (e.g., from a user of a mobile computing device associated with one or more camera devices) to begin the image acquisition process at a first acquisition location. After block 412, the routine proceeds to block 415 in order to perform acquisition location image acquisition activities in order to acquire at least one 360° panorama image by at least one image acquisition device (and optionally one or more additional images and/or other additional data by a mobile computing device, such as from IMU sensors and/or depth sensors) for the acquisition location at the target building of interest, such as to provide horizontal coverage of at least 360° around a vertical axis. The routine may also optionally obtain annotation and/or other information from a user regarding the acquisition location and/or the surrounding environment, such as for later use in presentation of information regarding that acquisition location and/or surrounding environment. After block 415 is completed, the routine continues to block 417 to optionally initiate obtaining and providing feedback (e.g., to one or more users participating in the current image acquisition session) during the image acquisition session about one or more indicated target images (e.g., the image just acquired in block 415), such as by interacting with the MIGM system to obtain such feedback.

After block 417, the routine continues to block 420 to determine if there are more acquisition locations at which to acquire images, such as based on corresponding information provided by the user of the mobile computing device and/or to satisfy specified criteria (e.g., at least a specified quantity of panorama images to be acquired in each of some or all rooms of the target building and/or in each of one or more areas external to the target building). If so, the routine continues to block 422 to optionally initiate the acquisition of linking information (such as visual data, acceleration data from one or more IMU sensors, etc.) during movement of the mobile device along a travel path away from the current acquisition location and towards a next acquisition location for the building. As described elsewhere herein, the acquired linking information may include additional sensor data (e.g., from one or more IMU, or inertial measurement units, on the mobile computing device or otherwise carried by the user) and/or additional visual information (e.g., panorama images, other types of images, panoramic or non-panoramic video, etc.) recorded during such movement, and in some embodiments may be analyzed to determine a changing pose (location and orientation) of the mobile computing device during the movement, as well as information about a room shape of the enclosing room (or other area) and the path of the mobile computing device during the movement. Initiating the acquisition of such linking information may be performed in response to an explicit indication from a user of the mobile computing device or based on one or more automated analyses of information recorded from the mobile computing device. In addition, the routine in some embodiments may further optionally determine and provide one or more guidance cues to the user regarding the motion of the mobile device, quality of the sensor data and/or visual information being acquired during movement to the next acquisition location (e.g., by monitoring the movement of the mobile device), including information about associated lighting/environmental conditions, advisability of acquiring a next acquisition location, and any other suitable aspects of acquiring the linking information. Similarly, the routine may optionally obtain annotation and/or other information from the user regarding the travel path, such as for later use in presentation of information regarding that travel path or a resulting inter-panorama image connection link. In block 424, the routine then determines that the mobile computing device (and one or more associated camera devices) arrived at the next acquisition location (e.g., based on an indication from the user, based on the forward movement of the user stopping for at least a predefined amount of time, etc.), for use as the new current acquisition location, and returns to block 415 in order to perform the image acquisition activities for the new current acquisition location.

If it is instead determined in block 420 that there are not any more acquisition locations at which to acquire image information for the current building or other structure (or for the current image acquisition session), the routine proceeds to block 430 to optionally analyze the acquisition position information for the building or other structure, such as to identify possible additional coverage (and/or other information) to acquire within the building interior or otherwise associated with the building. For example, the ICA system may provide one or more notifications to the user regarding the information acquired during acquisition of the multiple acquisition locations and optionally corresponding linking information, such as if it determines that one or more segments of the recorded information are of insufficient or undesirable quality, or do not appear to provide complete coverage of the building. In addition, in at least some embodiments, if minimum criteria for images (e.g., a minimum quantity and/or type of images) have not been satisfied by the acquired images (e.g., at least two panorama images in each room, at most one panorama image in each room, panorama images within a maximum and/or minimum specified distance of each other, etc.), the ICA system may prompt or direct the acquisition of additional panorama images to satisfy such criteria. After block 430, the routine continues to block 435 to optionally preprocess the acquired 360° target panorama images before subsequent use for generating related mapping information (e.g., to place them in a straightened equirectangular format, to determine vanishing lines and vanishing points, etc.). In block 480, the images and any associated generated or obtained information is stored for later use.

If it is instead determined in block 410 that the instructions or other information recited in block 405 are not to acquire images and other data representing a building, the routine continues instead to block 490 to perform any other indicated operations as appropriate, such as any housekeeping tasks, to configure parameters to be used in various operations of the system (e.g., based at least in part on information specified by a user of the system, such as a user of a mobile device who acquires one or more building interiors, an operator user of the ICA system, etc.), to obtain and store other information about users of the system, to respond to requests for generated and stored information, etc.

Following blocks 480 or 490, the routine proceeds to block 495 to determine whether to continue, such as until an explicit indication to terminate is received, or instead only if an explicit indication to continue is received. If it is determined to continue, the routine returns to block 405 to await additional instructions or information, and if not proceeds to step 499 and ends.

Figure 5A:
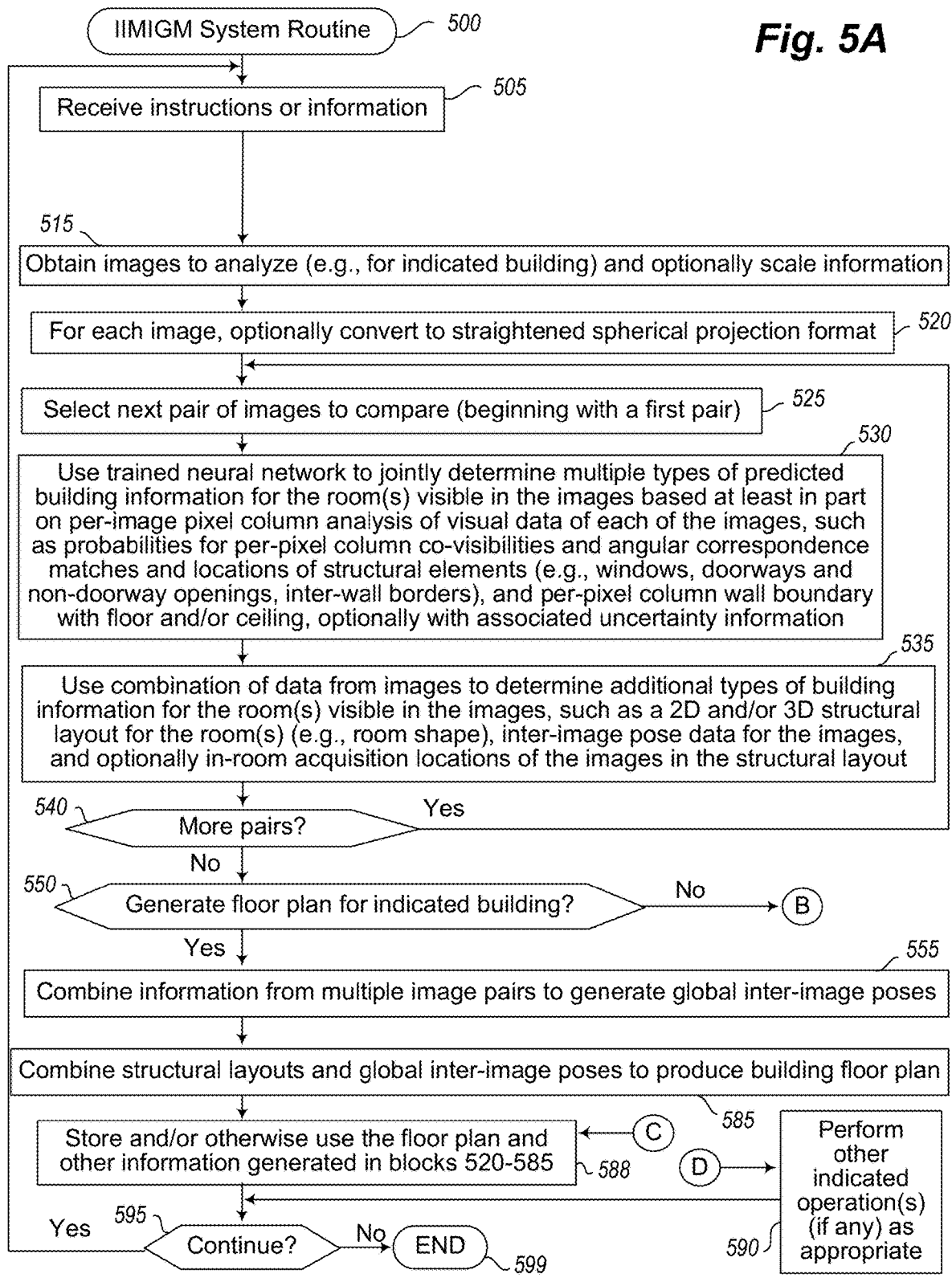
FIGS. 5A-5B illustrate an example flow diagram for an Inter-Image Mapping Information Generation Manager (IIMIGM) system routine in accordance with an embodiment of the present disclosure.
Figure 5B:
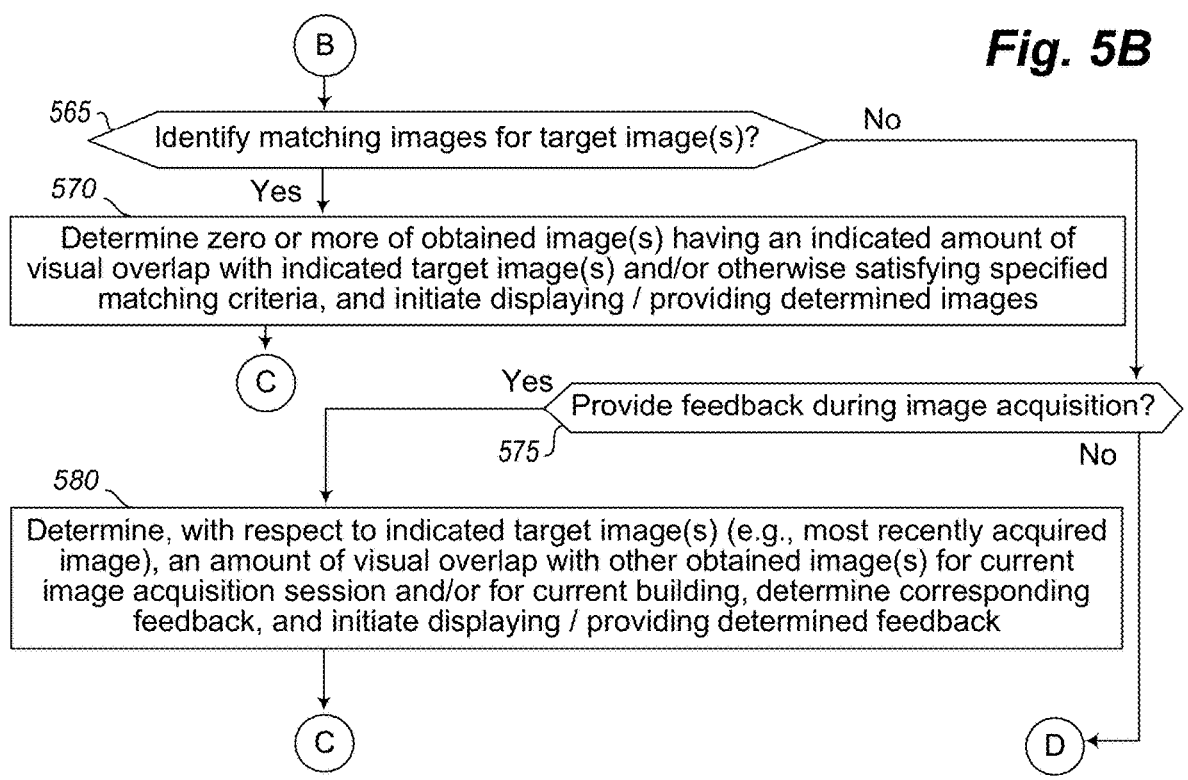

FIGS. 5A-5B illustrate an example embodiment of a flow diagram for an Inter-Image Mapping Information Generation Manager (IIMIGM) System routine 500. The routine may be performed by, for example, execution of the IIMIGM system 140 of FIG. 1A, the IIMIGM system 340 of FIG. 3, the IIMIGM system discussed with respect to FIGS. 2F-2M, and/or an IIMIGM system as described elsewhere herein, such as to generate a floor plan for a building or other defined area based at least in part on visual data of one or more images of the area and optionally additional data acquired by a mobile computing device, and/or to generate other mapping information for a building or other defined area based at least in part on one or more images of the area and optionally additional data acquired by a mobile computing device, and/or to determine other types of information by analyzing visual data of pairs of images. In the example of FIGS. 5A-5B, the generated mapping information for a building (e.g., a house) includes a 2D floor plan and/or 3D computer model floor plan, but in other embodiments, other types of mapping information may be generated and used in other manners, including for other types of structures and defined areas, as discussed elsewhere herein.

The illustrated embodiment of the routine begins at block 505, where information or instructions are received. The routine continues to block 515 to obtain target images for a building and optionally associated dimension/scale information (e.g., to retrieve stored target images that were previously acquired and associated with an indicated building; to use target images supplied in block 505; to concurrently acquire such information, with FIG. 4 providing one example embodiment of an ICA system routine for performing such image acquisition, including optionally waiting for one or more users or devices to move throughout one or more rooms of the building and acquire panoramas or other images at acquisition locations in building rooms and optionally other building areas, and optionally along with metadata information regarding the acquisition and/or interconnection information related to movement between acquisition locations, as discussed in greater detail elsewhere herein; etc.).

After block 515, the routine continues to block 520, where for each of the target images, the image is converted to a straightened projection format if not already in such a format (e.g., a straightened spherical projection format for a panorama image, a straightened spherical or rectilinear form for a non-panoramic image, etc.). In block 525, the routine then selects a next pair of the target images (beginning with a first pair), and then proceeds to block 530 to use a trained neural network to jointly determined multiple types of predicted building information for the room(s) visible in the images of the pair based at least in part on a per-image pixel column analysis of visual data of each of the images, such as probabilities for per-pixel column co-visibilities and angular correspondence matches and locations of structural elements (e.g., windows, doorways and non-doorway openings, inter-wall borders), and per-pixel column wall boundary with floor and/or ceiling, optionally with associated uncertainty information. In block 535, the routine then uses a combination of data from the images of the pair to determine additional types of building information for the room(s) visible in the images, such as a 2D and/or 3D structural layout for the room(s), inter-image pose information for the images, and optionally in-room acquisition locations of the images within the structural layout. After block 535, the routine in block 540 proceeds to determine if there are more pairs of images to compare, and if so returns to block 525 to select a next pair of images. Otherwise, the routine continues to block 550 where it determines whether to further use the determined types of building information from blocks 530-535 as part of further generating a floor plan for the building, such as based on the instructions or other information received in block 505, and if not continues to block 565. Otherwise, the routine continues to block 555 to combine information from the multiple image pairs to generate a global alignment of the acquisition locations of some or all of the target images, and in block 585 uses the global alignment information and determined structural layout information for the building rooms and/or other building areas to generate at least one corresponding floor plan for the building, as well as optionally additional related mapping information.

If it is instead determined in block 550 not to use the determined types of building information from blocks 530-535 as part of generating a floor plan for the building, the routine continues to block 565 to determine whether to use the determined types of building information from blocks 530-535 as part of identifying one or more matching images (if any) for one or more indicated target images, such as based on the instructions or other information received in block 505. If so, the routine continues to block 570 to, with respect to the one or more indicated target images (e.g., as indicated in block 505 or identified in block 570 via one or more current user interactions), use information from analysis of pairs of images that each includes one of the indicated target images and another of the target images from blocks 530-535 to determine other of the target images (if any) that match the indicated target image(s) (e.g., that have an indicated amount of visual overlap with the indicated target image(s) and/or that satisfy other specified matching criteria, as discussed in greater detail elsewhere herein), and displays or otherwise provides determined other target images (e.g., provides them to routine 600 of FIG. 6 for display, such as in response to a corresponding request from the routine 600 received in block 505 that indicates the one or more target images and optionally some or all of the other target images to analyze and optionally some or all of the matching criteria). If it is instead determined in block 565 not to use the determined types of building information from blocks 530-535 as part of identifying one or more matching images (if any) for one or more indicated target images, the routine continues to block 575 to determine whether to use the determined types of building information from blocks 530-535 as part of determining and providing feedback corresponding to one or more indicated target images, such as based on the instructions or other information received in block 505. If not, the routine continues to block 590, and otherwise continues to block 580 to, with respect to the one or more indicated target images (e.g., as indicated in block 505 or identified in block 580 via one or more current user interactions), use information from analysis of pairs of images that each includes one of the indicated target images and another of the target images from blocks 530-535 to determine the feedback to provide (e.g., based on an indicated amount of visual overlap with the indicated target image(s) and/or that correspond to other specified feedback criteria, as discussed in greater detail elsewhere herein), and displays or otherwise provides the determined feedback (e.g., provides them to routine 600 of FIG. 6 for display, such as in response to a corresponding request from the routine 600 received in block 505 that indicates the one or more target images and optionally some or all of the other target images to analyze and optionally some or all of the feedback criteria).

After blocks 570 or 580 or 585, the routine continues to block 588 to store the generated mapping information and/or other generated or determined information, and to optionally further use some or all of the determined and generated information, such as to provide the generated 2D floor plan and/or 3D computer model floor plan and/or other generated or determined information for display on one or more client devices and/or to one or more other devices for use in automating navigation of those devices and/or associated vehicles or other entities, to provide and use information about determined room layouts/shapes and/or a linked set of panorama images and/or about additional information determined about contents of rooms and/or passages between rooms, etc.

In block 590, the routine continues instead to perform one or more other indicated operations as appropriate. Such other operations may include, for example, receiving and responding to requests for previously generated floor plans and/or previously determined room layouts/shapes and/or other generated information (e.g., requests for such information for display on one or more client devices, requests for such information to provide it to one or more other devices for use in automated navigation, etc.), obtaining and storing information about buildings for use in later operations (e.g., information about dimensions, numbers or types of rooms, total square footage, adjacent or nearby other buildings, adjacent or nearby vegetation, exterior images, etc.), etc.

After blocks 588 or 590, the routine continues to block 595 to determine whether to continue, such as until an explicit indication to terminate is received, or instead only if an explicit indication to continue is received. If it is determined to continue, the routine returns to block 505 to wait for and receive additional instructions or information, and otherwise continues to block 599 and ends.

While not illustrated with respect to the automated operations shown in the example embodiment of FIGS. 5A-5B, in some embodiments human users may further assist in facilitating some of the operations of the IIMIGM system, such as for operator users and/or end users of the IIMIGM system to provide input of one or more types that is further used in subsequent automated operations.

Figure 6:
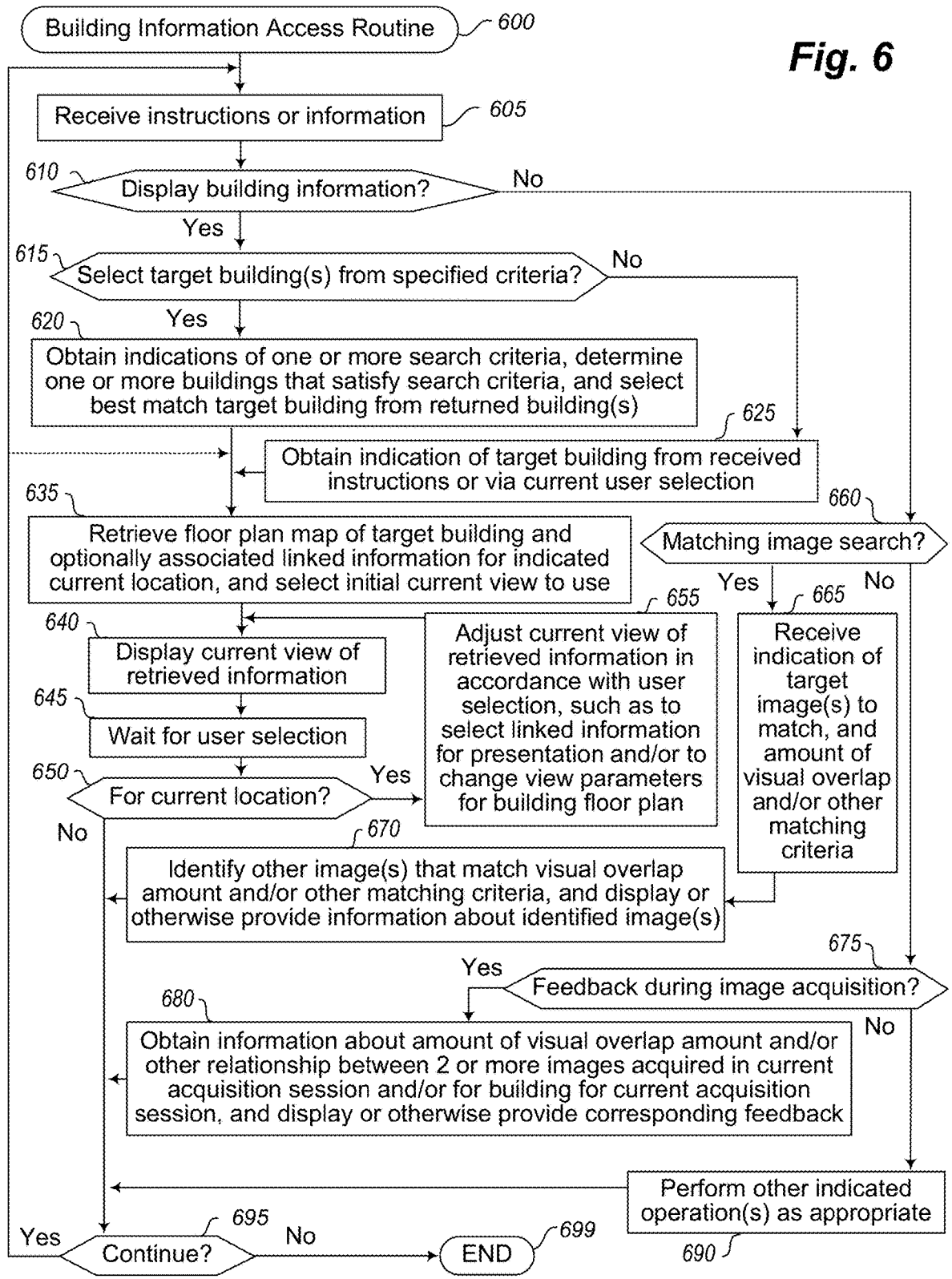
FIG. 6 illustrates an example flow diagram for a Building Information Access system routine in accordance with an embodiment of the present disclosure.

FIG. 6 illustrates an example embodiment of a flow diagram for a Building Information Access system routine 600. The routine may be performed by, for example, execution of a building information access client computing device 175 and its software system(s) (not shown) of FIG. 1A, a client computing device 390 and/or mobile computing device 360 of FIG. 3, and/or a mapping information access viewer or presentation system as described elsewhere herein, such as to receive and display generated floor plans and/or other mapping information (e.g., a 3D model floor plan, determined room structural layouts/shapes, etc.) for a defined area that optionally includes visual indications of one or more determined image acquisition locations, to obtain and display information about images matching one or more indicated target images, to obtain and display feedback corresponding to one or more indicated target images acquired during an image acquisition session (e.g., with respect to other images acquired during that acquisition session and/or for an associated building), to display additional information (e.g., images) associated with particular acquisition locations in the mapping information, etc. In the example of FIG. 6, the presented mapping information is for a building (such as an interior of a house), but in other embodiments, other types of mapping information may be presented for other types of buildings or environments and used in other manners, as discussed elsewhere herein.

The illustrated embodiment of the routine begins at block 605, where instructions or information are received. At block 610, the routine determines whether the received instructions or information in block 605 are to display determined information for one or more target buildings, and if so continues to block 615 to determine whether the received instructions or information in block 605 are to select one or more target buildings using specified criteria, and if not continues to block 620 to obtain an indication of a target building to use from the user (e.g., based on a current user selection, such as from a displayed list or other user selection mechanism; based on information received in block 605; etc.). Otherwise, if it is determined in block 615 to select one or more target buildings from specified criteria, the routine continues instead to block 625, where it obtains indications of one or more search criteria to use, such as from current user selections or as indicated in the information or instructions received in block 605, and then searches stored information about buildings to determine one or more of the buildings that satisfy the search criteria. In the illustrated embodiment, the routine then further selects a best match target building from the one or more returned buildings (e.g., the returned other building with the highest similarity or other matching rating for the specified criteria, or using another selection technique indicated in the instructions or other information received in block 605).

After blocks 620 or 625, the routine continues to block 635 to retrieve a floor plan for the target building or other generated mapping information for the building, and optionally indications of associated linked information for the building interior and/or a surrounding location external to the building, and selects an initial view of the retrieved information (e.g., a view of the floor plan, a particular room shape, etc.). In block 640, the routine then displays or otherwise presents the current view of the retrieved information, and waits in block 645 for a user selection. After a user selection in block 645, if it is determined in block 650 that the user selection corresponds to adjusting the current view for the current target building (e.g., to change one or more aspects of the current view), the routine continues to block 655 to update the current view in accordance with the user selection, and then returns to block 640 to update the displayed or otherwise presented information accordingly. The user selection and corresponding updating of the current view may include, for example, displaying or otherwise presenting a piece of associated linked information that the user selects (e.g., a particular image associated with a displayed visual indication of a determined acquisition location, such as to overlay the associated linked information over at least some of the previous display), and/or changing how the current view is displayed (e.g., zooming in or out; rotating information if appropriate; selecting a new portion of the floor plan to be displayed or otherwise presented, such as with some or all of the new portion not being previously visible, or instead with the new portion being a subset of the previously visible information; etc.). If it is instead determined in block 650 that the user selection is not to display further information for the current target building (e.g., to display information for another building, to end the current display operations, etc.), the routine continues instead to block 695, and returns to block 605 to perform operations for the user selection if the user selection involves such further operations.

If it is instead determined in block 610 that the instructions or other information received in block 605 are not to present information representing a building, the routine continues instead to block 660 to determine whether the instructions or other information received in block 605 correspond to identifying other images (if any) corresponding to one or more indicated target images, and if continues to blocks 665-670 to perform such activities. In particular, the routine in block 665 receives the indications of the one or more target images for the matching (such as from information received in block 605 or based on one or more current interactions with a user) along with one or more matching criteria (e.g., an amount of visual overlap), and in block 670 identifies one or more other images (if any) that match the indicated target image(s), such as by interacting with the IIMIGM system to obtain the other image(s). The routine then displays or otherwise provides information in block 670 about the identified other image(s), such as to provide information about them as part of search results, to display one or more of the identified other image(s), etc. If it is instead determined in block 660 that the instructions or other information received in block 605 are not to identify other images corresponding to one or more indicated target images, the routine continues instead to block 675 to determine whether the instructions or other information received in block 605 correspond to obtaining and providing feedback during an image acquisition session with respect to one or more indicated target images (e.g., a most recently acquired image), and if so continues to block 680, and otherwise continues to block 690. In block 680, the routine obtains information about an amount of visual overlap and/or other relationship between the indicated target image(s) and other images acquired during the current image acquisition session and/or acquired for the current building, such as by interacting with the IIMIGM system, and displays or otherwise provides feedback in block 680 about the feedback.

In block 690, the routine continues instead to perform other indicated operations as appropriate, such as any housekeeping tasks, to configure parameters to be used in various operations of the system (e.g., based at least in part on information specified by a user of the system, such as a user of a mobile device who acquires one or more building interiors, an operator user of the IIMIGM system, etc., including for use in personalizing information display for a particular user in accordance with his/her preferences), to obtain and store other information about users of the system, to respond to requests for generated and stored information, etc.

Following blocks 670 or 680 or 690, or if it is determined in block 650 that the user selection does not correspond to the current building, the routine proceeds to block 695 to determine whether to continue, such as until an explicit indication to terminate is received, or instead only if an explicit indication to continue is received. If it is determined to continue (including if the user made a selection in block 645 related to a new building to present), the routine returns to block 605 to await additional instructions or information (or to continue directly on to block 635 if the user made a selection in block 645 related to a new building to present), and if not proceeds to step 699 and ends.

Aspects of the present disclosure are described herein with reference to flowchart illustrations and/or block diagrams of methods, apparatus (systems), and computer program products according to embodiments of the present disclosure. It will be appreciated that each block of the flowchart illustrations and/or block diagrams, and combinations of blocks in the flowchart illustrations and/or block diagrams, can be implemented by computer readable program instructions. It will be further appreciated that in some implementations the functionality provided by the routines discussed above may be provided in alternative ways, such as being split among more routines or consolidated into fewer routines. Similarly, in some implementations illustrated routines may provide more or less functionality than is described, such as when other illustrated routines instead lack or include such functionality respectively, or when the amount of functionality that is provided is altered. In addition, while various operations may be illustrated as being performed in a particular manner (e.g., in serial or in parallel, or synchronous or asynchronous) and/or in a particular order, in other implementations the operations may be performed in other orders and in other manners. Any data structures discussed above may also be structured in different manners, such as by having a single data structure split into multiple data structures and/or by having multiple data structures consolidated into a single data structure. Similarly, in some implementations illustrated data structures may store more or less information than is described, such as when other illustrated data structures instead lack or include such information respectively, or when the amount or types of information that is stored is altered.

From the foregoing it will be appreciated that, although specific embodiments have been described herein for purposes of illustration, various modifications may be made without deviating from the spirit and scope of the invention. Accordingly, the invention is not limited except as by corresponding claims and the elements recited by those claims. In addition, while certain aspects of the invention may be presented in certain claim forms at certain times, the inventors contemplate the various aspects of the invention in any available claim form. For example, while only some aspects of the invention may be recited as being embodied in a computer-readable medium at particular times, other aspects may likewise be so embodied.

What is claimed is:

1. A computer-implemented method comprising:

obtaining, by one or more computing devices, a plurality of panorama images that are acquired at multiple acquisition locations in multiple rooms of a house, wherein each of the panorama images is acquired in one of the multiple rooms and has only RGB (red-green-blue) pixel data in an equirectangular format that provides 360 degrees of horizontal visual coverage around a vertical axis;

analyzing, by the one or more computing devices and using a neural network trained to jointly determine multiple types of information about the house, multiple image pairs each including two of the panorama images whose horizontal visual coverage has a partial visual overlap for at least one of the multiple rooms, including, for each of the multiple image pairs:

determining, as part of the partial visual overlap for the at least one room between the two panorama images of the image pair, multiple pixel column matches that are each between a first column of pixels of a first of the two panorama images and a respective second column of pixels of a second of the two panorama images, with the first and second columns of pixels of the match both illustrating a same vertical slice of the at least one room, determining, using parts of the first and second panorama images that are not in the partial visual overlap, additional first columns of pixels of the first panorama image that show first vertical slices of the at least one room not visible in the second panorama image, and additional second columns of pixels of the second panorama image that show further second vertical slices of the at least one room not visible in the first panorama image;

determining, based on a combination of the RGB pixel data for the first and second panorama images of the image pair, and for the at least one room in the partial visual overlap for the image pair, structural layout information for the at least one room that includes positions of at least some walls of the at least one room, and that includes positions of one or more borders between one of the walls and at least one of an additional one of the walls or a floor of the at least one room or a ceiling of the at least one room, and that includes positions of at least one of a doorway or non-doorway wall opening of the at least one room; and determining, based at least in part on information determined for the image pair that includes the determined multiple pixel column matches and the determined structural layout information, relative pose information for the first and second panorama images of the image pair that includes determined acquisition locations in the at least one room at which the first and second panorama images are acquired and includes a directions in each of the first and second panorama images between those determined acquisition locations;

generating, by the one or more computing devices, global alignment information that includes positions for the multiple acquisition locations in a common coordinate system, including combining the determined relative pose information for at least some of the multiple image pairs;

generating, by the one or more computing devices, a floor plan for the house, including fitting the structural layout information determined for the multiple image pairs around the positions from the global alignment information for the multiple acquisition locations, and including aligning the fitted structural layout information based on the positions for the multiple image pairs of the at least one of the doorway or non-doorway wall opening; and presenting, by the one or more computing devices, the generated floor plan, to cause use of the generated floor plan in navigating the house.

2. The computer-implemented method of claim 1 wherein the plurality of panorama images is each a straightened image in which each column of pixels has visual data for a vertical plane in the house, wherein the analyzing of each of the multiple image pairs further includes:

determining, by the one or more computing devices, and for each column of pixels in the first panorama image of the image pair, whether the column of pixels is in one of the multiple pixel column matches for the image pair or is one of the additional first columns of pixels, and identifying at least one first pixel in the column of pixels that corresponds to a border between a floor and a wall, and determining a distance of the wall visible in the column of pixels from the acquisition location for the first panorama image based at least in part on the identified at least one first pixel;

determining, by the one or more computing devices, and for each column of pixels in the second panorama image of the image pair, whether the column of pixels is in one of the multiple pixel column matches for the image pair or is one of the additional second columns of pixels, and identifying at least one second pixel in the column of pixels that corresponds to a border between a floor and a wall, and determining a distance of the wall visible in the column of pixels from the acquisition location for the second panorama image based at least in part on the identified at least one second pixel;

determining, by the one or more computing devices, and as part of the determined structural layout information for the at least one room in the partial visual overlap for the image pair, at least a two-dimensional room shape for that at least one room by combining information about the identified at least one first and second pixels in each of the multiple pixel columns and by using the determined distance for each of the pixel columns of the first and second panorama images; and performing, by the one or more computing devices, the determining of the relative pose information for the first and second panorama images of the image pair based at least in part on the determined at least two-dimensional room shape for the at least one room in the partial visual overlap for the image pair, and wherein the generating of the floor plan includes using the determined at least two-dimensional room shapes from the analyzing of the multiple image pairs.

3. The computer-implemented method of claim 1 further comprising analyzing, by the one or more computing devices and using the trained neural network, a plurality of additional image pairs distinct from the multiple image pairs to attempt to jointly determine additional information about the house of the multiple types from the additional image pairs, wherein each of the additional image pairs includes two of the panorama images whose horizontal visual coverages have an amount of visual overlap below a defined threshold, and wherein the generating of the global alignment information includes using, as part of the combining, the determined relative pose information for multiple panorama images of the plurality that are each part of at least two of the multiple image pairs, and further includes using at least some of the determined additional information as constraints for including in the global alignment information at least one of the multiple acquisition locations at which is acquired at least one of the panorama images separate from the multiple panorama images.

4. A computer-implemented method comprising:

obtaining, by one or more computing devices, multiple panorama images acquired in a building that include a first panorama image having first visual data providing first visual coverage of structural elements of a first room of the building and include a second panorama image having second visual data providing second visual coverage of some of the structural elements of the first room, wherein the structural elements include some or all of walls of the first room and include some or all of at least one of a floor or a ceiling of the first room;

analyzing, by the one or more computing devices and using a trained neural network, one or more pairs of the multiple panorama images to jointly determine building information of multiple types for each of the pairs based on overlapping visual coverages of the panorama images of that pair, including, for one of the pairs that includes the first and second panorama images, analyzing the first and second visual data of the first and second panorama images to determine at least some of the building information based on a partial overlap between the first and second visual coverages by:

determining, as part of the partial overlap between the first and second visual coverages, multiple image portion overlap pairs each having a first portion of the first panorama image and a respective second portion of the second image that both illustrate a common structural element of the first room; and determining, based at least in part on the partial overlap between the first and second visual coverages, relative acquisition locations at which the first and second panorama images are acquired in the building;

generating, by the one or more computing devices and based at least in part on the determined building information, at least a partial floor plan for the building that includes representations of at least some of the structural elements of the first room; and presenting, by the one or more computing devices, the at least partial floor plan for the building, to enable use of the at least partial floor plan for navigation of the building.

5. The computer-implemented method of claim 4 wherein the building has multiple rooms and the multiple panorama images include, for each of the multiple rooms, one of the panorama images that is acquired in that room and has visual coverage of at least some of walls and a floor and a ceiling of that room, wherein the analyzing of the one or more pairs is performed for each pair of panorama images and includes determining structural elements for each of the multiple rooms, and wherein the generating of the at least partial floor plan includes generating a floor plan for the building that includes representations of the determined structural elements for each of the multiple rooms.

6. The computer-implemented method of claim 4 wherein the analyzing of the pair of the first and second panorama images further includes determining additional building information by performing at least one of:

determining, by the one or more computing devices and for each of a plurality of first angles in the first panorama image that are part of the multiple image portion overlap pairs, one or more respective second angles in the second panorama image for which second visual data in the second panorama image for the one or more respective second angles indicates a same part of a wall of the first room as indicated for first visual data in the first panorama image for the first angle; or determining, by the one or more computing devices and for each of a plurality of fourth angles in the second panorama image that are part of the multiple image portion overlap pairs, one or more respective third angles in the first panorama image for which third visual data in the first panorama image for the one or more respective third angles indicates a same part of a wall of the first room as indicated for fourth visual data in the second panorama image for the fourth angle; or determining, by the one or more computing devices and for each column of pixels in the first panorama image that is part of the multiple image portion overlap pairs, at least one first pixel in the column of pixels that corresponds to a border between a floor and a wall, and determining a distance of the wall visible in the column of pixels from an acquisition location for the first panorama image based at least in part on the identified at least one first pixel; or determining, by the one or more computing devices and for each column of pixels in the second panorama image that is part of the multiple image portion overlap pairs, at least one second pixel in the column of pixels that corresponds to a border between a floor and a wall, and determining a distance of the wall visible in the column of pixels from an acquisition location for the second panorama image based at least in part on the identified at least one second pixel; or determining, by the one or more computing devices and based at least in part on information from the multiple image portion overlap pairs and using data from both of the first and second panorama images, positions of at least some of the structural elements of the first room; or determining, by the one or more computing devices and based at least in part on information from the multiple image portion overlap pairs and using data from both of the first and second panorama images, structural layout information for the first room that includes a shape of the first room with determined positions of at least some of the structural elements of the first room, and wherein the method further comprises providing the determined additional building information.

7. The computer-implemented method of claim 4 further comprising, before the analyzing of the one or more pairs of the multiple panorama images, modifying, by the one or more computing devices, at least some of the multiple panorama images so that each column of pixels in each of the multiple panorama images has visual data corresponding to a vertical plane in the building, wherein the determining of the multiple image portion overlap pairs as part of the analyzing of the first and second visual data of the first and second panorama images includes:

determining, by the one or more computing devices, and for the first panorama image, whether each column of pixels in the first panorama image is in one of the multiple image portion overlap pairs, and generating a co-visibility value for each of the columns of pixels in the first panorama image based at least in part on that determining for the first panorama image; and determining, by the one or more computing devices, and for the second panorama image, whether each column of pixels in the second panorama image is in one of the multiple image portion overlap pairs, and generating a co-visibility value for each of the columns of pixels in the second panorama image based at least in part on that determining for the second panorama image, and wherein the method further comprises providing the generated co-visibility values for the columns of pixels in the first and second panorama images.

8. The computer-implemented method of claim 4 wherein determining of the building information of the multiple types includes generating at least one measure of uncertainty for at least one of the multiple types of building information, and wherein the presenting of the at least partial floor plan for the building includes providing an indication of the at least one measure of uncertainty.

9. The computer-implemented method of claim 8 further comprising, before the analyzing of the one or more pairs of the multiple panorama images, training the neural network using values that differ for training example pairs of panorama images having differing amounts of visual overlap, and wherein the generating of the at least one measure of uncertainty for the at least one type of building information includes predicting, by the one or more computing devices, a standard deviation value for each of the multiple types of building information and using the predicted standard deviation value for a type of building information to produce a measure of uncertainty for that type of building information.

10. The computer-implemented method of claim 4 wherein the multiple panorama images are acquired at multiple acquisition locations in the building, wherein the method further comprises obtaining additional information for the building that includes at least one of one or more non-panoramic images acquired in the building, or of depth data acquired in the building for one or more of the multiple acquisition locations to one or more walls surrounding the one or more acquisition locations, or of radar data acquired in the building, wherein the analyzing of the one or more pairs of the multiple panorama images further includes generating additional structural information for the building based on analyzing of the additional information for the building, and wherein the presented at least partial floor plan for the building includes information based on the generated additional structural information.

11. A non-transitory computer-readable medium having stored contents that cause one or more computing systems to perform automated operations, the automated operations including at least:

obtaining, by the one or more computing devices, multiple images acquired in a building that include a first image having first visual data providing first visual coverage of structural elements of at least a first room of the building and include a second image having second visual data providing second visual coverage of some of the structural elements of the at least first room, wherein the structural elements include a window of the at least first room and include some or all of walls of the at least first room and include some or all of at least one of doorway or a non-doorway wall opening of the at least first room and include some or all of at least one of a floor or a ceiling of the at least first room, wherein each column of pixels in each of the first and second images has visual data corresponding to a vertical plane in the building;

analyzing, by the one or more computing devices and using a trained neural network, the first and second images to jointly determine information of multiple types for the building based at least in part on a partial overlap between the first and second visual coverages, including:

determining, as part of the partial overlap between the first and second visual coverages, multiple image portion overlap pairs each having a first portion of the first image and a respective second portion of the second image that both illustrate a common structural element of the at least first room, wherein the common structural element corresponds to at least one of the window or the doorway or the non-doorway wall opening or a border between one of the walls and the floor or the ceiling or another one of the walls; and determining, based at least in part on information from the multiple image portion overlap pairs and using data from both of the first and second images, structural layout information for the at least first room that includes a shape of the at least first room with determined positions of at least some of the structural elements; and providing, by the one or more computing devices, the determined structural layout information for the at least first room.

12. The non-transitory computer-readable medium of claim 11 wherein the stored contents include software instructions that, when executed, cause the one or more computing devices to perform further automated operations including determining, by the one or more computing devices and based at least in part on the partial overlap between the first and second visual coverages, acquisition locations at which the first and second images are acquired in the building, and wherein the determining of the structural layout information is based at least in part on the determined acquisition locations and includes generating at least a partial floor plan of the building that includes the determined structural layout information.

13. The non-transitory computer-readable medium of claim 11 wherein each of the images is a panorama image acquired in one of multiple rooms of the building and having only RGB (red-green-blue) pixel data in an equirectangular format that provides 360 degrees of horizontal visual coverage around a vertical axis, and wherein the providing of the determined structural layout information for the at least first room includes transmitting, by the one or more computing devices and to one or more client devices over one or more networks, the determined structural layout information for the at least first room to cause display of the determined structural layout information for the at least first room on the one or more client devices.

14. The non-transitory computer-readable medium of claim 11 wherein at least one of the first and second images is acquired as part of an image acquisition session, and wherein the automated operations further include, while the image acquisition session continues, determining a score that corresponds to an amount of the partial overlap between the first and second visual coverages, and providing feedback during the image acquisition session that corresponds to acquisition of one or more additional images and that is based at least in part on the determining of the score.

15. The non-transitory computer-readable medium of claim 11 wherein the first image is provided as part of a query and the second image is one of a plurality of previously acquired images, wherein the analyzing of the first and second images is performed as part of identifying one or more of the previously acquired images that has an amount of overlap with the first image that exceeds a specified threshold, and wherein the automated operations further include providing search results for the query that include information about the second image.

16. The non-transitory computer-readable medium of claim 11 wherein the automated operations further include, before the analyzing of the first and second images:
  generating, by the one or more computing devices, and for each of a plurality of acquired images that includes the second image, a feature embedding vector that represents the image, and storing each generated feature embedding vector in association with the image represented by that generated feature embedding vector; and
  selecting, by the one or more computing devices, the second image from the plurality of acquired images,
  and wherein the analyzing of the first and second images includes using the stored generated feature embedding vector in association with the second image and using an additional generated feature embedding vector for the first image.

17. A system, comprising:
  one or more hardware processors of one or more computing devices; and
  one or more memories with stored instructions that, when executed by at least one of the one or more hardware processors, cause the one or more computing devices to perform automated operations including at least:
    obtaining multiple images acquired in a building that include a first image having first visual data providing first visual coverage of structural elements of at least a first room of the building and include a second image having second visual data providing second visual coverage of some of the structural elements of the at least first room, wherein the structural elements include some or all of walls of the at least first room and include some or all of at least one of doorway or a non-doorway wall opening of the at least first room and include some or all of at least one of a floor or a ceiling of the at least first room;
    analyzing, using a trained neural network, the first and second images to jointly determine information of multiple types for the building based at least in part on a partial overlap between the first and second visual coverages, including:
      determining, as part of the partial overlap between the first and second visual coverages, multiple image portion overlap pairs each having a first portion of the first image and a respective second portion of the second image that both illustrate a common structural element of the at least first room, wherein the common structural element corresponds to at least one of the doorway or the non-doorway wall opening or a border between one of the walls and the floor or the ceiling or another one of the walls; and
      determining, for each column of pixels in the first image that is part of the multiple image portion overlap pairs, at least one first pixel in the column of pixels that corresponds to a border between a floor and a wall, and determining a distance of the wall visible in the column of pixels from the acquisition location for the first image based at least in part on the identified at least one first pixel;
      determining, for each column of pixels in the second image that is part of the multiple image portion overlap pairs, at least one second pixel in the column of pixels that corresponds to a border between a floor and a wall, and determining a distance of the wall visible in the column of pixels from the acquisition location for the second image based at least in part on the identified at least one second pixel; and
      determining, using data from both of the first and second images and based at least in part on the determined distances for the first and second images, structural layout information for the at least first room; and
    providing the determined structural layout information for the at least first room.

18. The system of claim 17 wherein the stored instructions include software instructions that, when executed, cause the one or more computing devices to perform further automated operations including determining, based at least in part on the partial overlap between the first and second visual coverages, acquisition locations at which the first and second images are acquired in the building, and wherein the determining of the structural layout information is based at least in part on the determined acquisition locations and includes generating at least a partial floor plan of the building that includes the determined structural layout information.

19. The system of claim 17 wherein each of the images is a panorama image acquired in one of multiple rooms of the building and having only RGB (red-green-blue) pixel data in an equirectangular format that provides 360 degrees of horizontal visual coverage around a vertical axis and with each column of pixels having visual data corresponding to a vertical plane in the building, and wherein the providing of the determined structural layout information for the at least first room includes transmitting, by the one or more computing devices and to one or more client devices over one or more networks, the determined structural layout information for the at least first room to cause display of the determined structural layout information for the at least first room on the one or more client devices.

20. A computer-implemented method comprising:
  obtaining, by one or more computing devices, multiple images acquired in a building that include a first image having first visual data providing first visual coverage of structural elements of at least a first room of the building and include a second image having second visual data providing second visual coverage of some of the structural elements of the at least first room, wherein the structural elements include some or all of walls of the at least first room and include some or all of at least one of a floor or a ceiling of the at least first room;
  analyzing, by the one or more computing devices and using a trained neural network, the first and second images to jointly determine information of multiple types for the building based at least in part on a partial overlap between the first and second visual coverages, by:
    determining, as part of the partial overlap between the first and second visual coverages, multiple image portion overlap pairs each having a first portion of the first image and a respective second portion of the second image that both illustrate a common structural element of the at least first room; and determining, based at least in part on the partial overlap between the first and second visual coverages, acquisition locations at which the first and second images are acquired in the building; and providing, by the one or more computing devices, at least some of the determined information for the building, to enable use of the at least some determined building information.

21. The computer-implemented method of claim 20 wherein the providing of the at least some determined building information includes transmitting, by the one or more computing devices and to one or more client devices over one or more networks, information about at least one of the determined multiple image portion overlap pairs or the determined acquisition locations, to cause presentation on the one or more client devices of the transmitted information about the at least one of the determined multiple image portion overlap pairs or the determined acquisition locations.

22. The computer-implemented method of claim 20 further comprising, before the analyzing of the first and second images:

generating, by the one or more computing devices, and for each of a plurality of acquired images that includes the second image, a feature embedding vector that represents the image, and storing each generated feature embedding vector in association with the image represented by that generated feature embedding vector; and selecting, by the one or more computing devices, the second image from the plurality of acquired images, and wherein the analyzing of the first and second images includes using the stored generated feature embedding vector in association with the second image and using an additional generated feature embedding vector for the first image.

\* \* \* \* \*

UNITED STATES PATENT AND TRADEMARK OFFICE
CERTIFICATE OF CORRECTION

PATENT NO. : 12,045,951 B2
APPLICATION NO. : 17/564054
DATED : July 23, 2024
INVENTOR(S) : Will Adrian Hutchcroft et al.

It is certified that error appears in the above-identified patent and that said Letters Patent is hereby corrected as shown below:

In the Claims

Column 49, Line 54, Claim 11:
"stored contents that cause one or more computing systems to" should read --stored contents that cause one or more computing devices to--.

Signed and Sealed this
Tenth Day of September, 2024

Katherine Kelly Vidal
*Director of the United States Patent and Trademark Office*